US012580593B2

(12) United States Patent
Cho et al.

(10) Patent No.: US 12,580,593 B2
(45) Date of Patent: Mar. 17, 2026

(54) MEMORY SYSTEM AND NONVOLATILE MEMORY DEVICE CAPABLE OF COMPRESSING DATA FROM A MEMORY PLANE AND OUTPUTTING DATA IN PARALLEL

(71) Applicant: SAMSUNG ELECTRONICS CO., LTD., Suwon-si (KR)

(72) Inventors: Hwasuk Cho, Suwon-si (KR); Seungwoo Yu, Suwon-si (KR); Byungkwan Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 18/807,802

(22) Filed: Aug. 16, 2024

(65) Prior Publication Data

US 2025/0260420 A1     Aug. 14, 2025

(30) Foreign Application Priority Data

Feb. 14, 2024    (KR) ........................ 10-2024-0020799
Apr. 5, 2024    (KR) ........................ 10-2024-0046440

(51) Int. Cl.
| | |
|---|---|
| *G11C 16/32* | (2006.01) |
| *G11C 16/04* | (2006.01) |
| *H03M 7/30* | (2006.01) |
| *H03M 13/00* | (2006.01) |
| *H10B 43/27* | (2023.01) |

(52) U.S. Cl.
CPC ..... *H03M 13/6312* (2013.01); *G11C 16/0483* (2013.01); *G11C 16/32* (2013.01); *H03M 7/30* (2013.01); *H10B 43/27* (2023.02)

(58) Field of Classification Search
CPC .. G06F 11/1048; G06F 3/0658; G06F 3/0679; G11C 16/0483; G11C 16/08; G11C 16/10; G11C 16/26; G11C 16/32; H03M 13/6312; H03M 7/30; H03M 7/6011; H03M 7/6023; H10B 43/27
See application file for complete search history.

(56) References Cited

U.S. PATENT DOCUMENTS

| | | | |
|---|---|---|---|
| 10,474,525 | B2 | 11/2019 | Sharon et al. |
| 11,456,758 | B1 | 9/2022 | Zamir et al. |
| 11,556,416 | B2 | 1/2023 | Tishbi et al. |

(Continued)

*Primary Examiner* — Justin R Knapp
(74) *Attorney, Agent, or Firm* — Fish & Richardson P.C.

(57) ABSTRACT

An example nonvolatile memory device includes page buffer circuits, compression engines, local clock controllers, a data input/output (I/O) circuit, and a control circuit. Each compression engine is connected with a respective page buffer circuit through respective local data lines. The control circuit controls each compression engine to perform an encoding operation based on receiving soft decision data from target cache latches corresponding to an output address, based on compressing the received soft decision data, and based on overwriting the compressed soft decision data in the target cache latches based on an input address. The control circuit controls one or more page buffer circuits among the plurality of page buffer circuits to perform an output operation based on outputting the compressed soft decision data through the data I/O circuit, the output operation performed in parallel with the encoding operation or independently from the encoding operation.

20 Claims, 35 Drawing Sheets

(56) References Cited

U.S. PATENT DOCUMENTS

| 11,620,050 | B2 |   | 4/2023 | Sravan et al. | |
|---|---|---|---|---|---|
| 11,757,468 | B2 |   | 9/2023 | Singla et al. | |
| 11,776,589 | B2 | * | 10/2023 | Hsu | G11C 7/106 |
|   |   |   |   |   | 365/185.21 |
| 11,901,019 | B2 | * | 2/2024 | Hsu | H03M 13/611 |
| 12,057,188 | B2 | * | 8/2024 | Bassa | G11C 7/1039 |
| 12,112,826 | B2 | * | 10/2024 | Park | G11C 16/3495 |
| 2022/0164143 | A1 |   | 5/2022 | Kim et al. | |
| 2023/0031951 | A1 |   | 2/2023 | Sohn et al. | |
| 2023/0080999 | A1 |   | 3/2023 | Hsu et al. | |
| 2023/0083903 | A1 |   | 3/2023 | Hsu et al. | |
| 2024/0321381 | A1 | * | 9/2024 | Seo | G11C 7/1069 |

* cited by examiner

Figure 22:
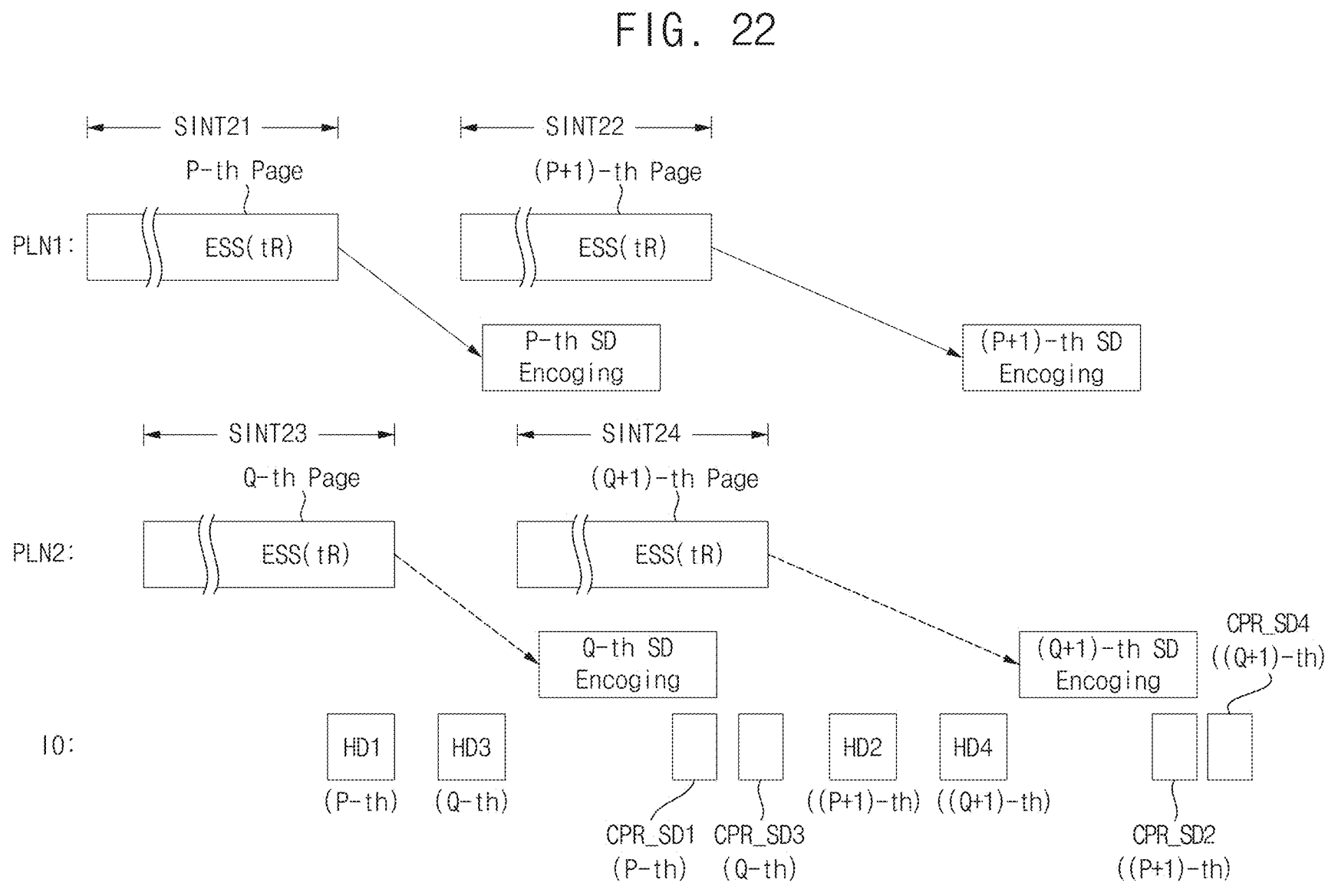

PLN1:

SINT21
P-th Page

ESS(tR)

SINT22
(P+1)-th Page

ESS(tR)

P-th SD
Encoging (P+1)-th SD
Encoging

PLN2:

SINT23
Q-th Page

ESS(tR)

SINT24
(Q+1)-th Page

ESS(tR)

Q-th SD
Encoging (Q+1)-th SD
Encoging

IO:

HD1
(P-th)

HD3
(Q-th)

HD2
((P+1)-th)

HD4
((Q+1)-th)

CPR_SD1
(P-th)

CPR_SD3
(Q-th)

CPR_SD4
((Q+1)-th)

CPR_SD2
((P+1)-th)

| 210 | 220 | 230 | 240 | 비고 |
|------|------|------|------|------|
| comp | Dout | | | comp ×1 + Dout |
| comp | | Dout | | comp ×1 + Dout |
| comp | | | Dout | comp ×1 + Dout |
| Dout | comp | | | comp ×1 + Dout |
| | comp | Dout | | comp ×1 + Dout |
| | comp | | Dout | comp ×1 + Dout |
| Dout | | comp | | comp ×1 + Dout |
| | Dout | comp | | comp ×1 + Dout |
| | | comp | Dout | comp ×1 + Dout |
| Dout | | | comp | comp ×1 + Dout |
| | Dout | | comp | comp ×1 + Dout |
| | | Dout | comp | comp ×1 + Dout |
| comp | comp | Dout | | comp ×2 + Dout |
| comp | comp | | Dout | comp ×2 + Dout |
| comp | Dout | comp | | comp ×2 + Dout |
| comp | | comp | Dout | comp ×2 + Dout |
| comp | Dout | | comp | comp ×2 + Dout |
| comp | | Dout | comp | comp ×2 + Dout |
| Dout | comp | comp | | comp ×2 + Dout |
| | comp | comp | Dout | comp ×2 + Dout |
| Dout | comp | | comp | comp ×2 + Dout |
| | comp | Dout | comp | comp ×2 + Dout |
| Dout | | comp | comp | comp ×2 + Dout |
| | Dout | comp | comp | comp ×2 + Dout |
| comp | comp | comp | Dout | comp ×3 + Dout |
| comp | comp | Dout | comp | comp ×3 + Dout |
| comp | Dout | comp | comp | comp ×3 + Dout |
| Dout | comp | comp | comp | comp ×3 + Dout |

FIG. 33

MEMORY SYSTEM AND NONVOLATILE MEMORY DEVICE CAPABLE OF COMPRESSING DATA FROM A MEMORY PLANE AND OUTPUTTING DATA IN PARALLEL

CROSS-REFERENCE TO RELATED APPLICATIONS

This application claims priority under 35 USC § 119 to Korean Patent Application No. 10-2024-0020799, filed on Feb. 14, 2024, in the Korean Intellectual Property Office (KIPO), and to Korean Patent Application No. 10-2024-0046440, filed on Apr. 5, 2024, in the KIPO, the disclosures of which are incorporated herein by references in their entirety.

BACKGROUND

In general, NAND flash memory devices are widely used as storage media in electronic products, and over time or with repeated use, the accurate reading of data can become challenging. To address this issue, soft decision technology is being introduced. Traditional hard decision technology simply discriminates the cell's voltage as either 0 or 1. In contrast, the soft decision technology analyzes the voltage more finely and estimates the probability of its corresponding value. Through such schemes, the performance of error correction codes may be enhanced, and the lifespan of NAND flash memory devices may also be extended.

SUMMARY

The present disclosure relates to nonvolatile memory devices, including a nonvolatile memory device capable of compressing data from a memory plane and outputting data in parallel, and memory systems, including a memory system that includes a nonvolatile memory device capable of compressing data from a memory plane and outputting data in parallel.

In some implementations, a nonvolatile memory device includes a plurality of page buffer circuits corresponding to a plurality of memory planes, a plurality of compression engines, a plurality of local clock controllers, a data input/output (I/O) circuit and a control circuit. Each of the plurality of page buffer circuits is connected to respective one of the plurality of memory planes through corresponding bit-lines, and includes a plurality of latch groups. Each of the plurality of compression engines is connected to respective one of the plurality of page buffer circuits through corresponding local data lines. Each of the plurality of latch groups includes a plurality of cache latches. Each of the plurality of local clock controllers controls respective one of the plurality of compression engines individually based on a global clock signal and a mode signal. The data I/O circuit is connected to the plurality of page buffer circuits through global data lines separated from the local data lines. The control circuit controls each of one or more compression engines among the plurality of compression engines to perform an encoding operation by receiving a soft decision data from target cache latches corresponding to an output address, from the plurality of cache latches, by compressing the received soft decision data and by overwriting the compressed soft decision data in the target cache latches based on an input address, and controls one of one or more plurality of page buffer circuits among the plurality of page buffer circuits to perform an output operation by outputting the compressed soft decision data through the data I/O circuit, in parallel with the encoding operation or independently from the encoding operation.

In some implementations, a memory system include a nonvolatile memory device and a memory controller. The nonvolatile memory device outputs a hard decision data and a compressed soft decision data. The memory controller controls the nonvolatile memory device, and includes a decompression engine which decompresses the compressed soft decision data. The nonvolatile memory device includes a plurality of page buffer circuits corresponding to a plurality of memory planes, a plurality of compression engines, a plurality of local clock controllers, a data input/output (I/O) circuit and a control circuit. Each of the plurality of page buffer circuits is connected to respective one of the plurality of memory planes through corresponding bit-lines, and includes a plurality of latch groups. Each of the plurality of latch groups includes a plurality of cache latches. Each of the plurality of compression engines is connected to respective one of the plurality of page buffer circuits through corresponding local data lines. Each of the plurality of local clock controllers controls respective one of the plurality of compression engines individually based on a global clock signal and a mode signal. The data I/O circuit is connected to the plurality of page buffer circuits through global data lines separated from the local data lines. The control circuit controls each of one or more compression engines among the plurality of compression engines to perform an encoding operation by receiving a soft decision data from target cache latches corresponding to an output address, from the plurality of cache latches, by compressing the received soft decision data and by overwriting the compressed soft decision data in the target cache latches based on an input address, and controls one of one or more plurality of page buffer circuits among the plurality of page buffer circuits to perform an output operation by outputting the compressed soft decision data through the data I/O circuit, in parallel with the encoding operation or independently from the encoding operation.

In some implementations, a nonvolatile memory device includes a memory cell array, a plurality of page buffer circuits, a plurality of compression engines, a plurality of local clock controllers, a data input/output (I/O) circuit and a control circuit. The memory cell array includes a plurality of memory planes, and each of the plurality of memory planes includes a plurality of memory blocks. The plurality of page buffer circuits correspond to the plurality of memory planes. Each of the plurality of page buffer circuits is connected to respective one of the plurality of memory planes through corresponding bit-lines, and includes a plurality of latch groups. Each of the plurality of latch groups includes a plurality of cache latches. Each of the plurality of compression engines is connected to respective one of the plurality of page buffer circuits through corresponding local data lines. Each of the plurality of local clock controllers controls respective one of the plurality of compression engines individually based on a global clock signal and a mode signal. The data I/O circuit is connected to the plurality of page buffer circuits through global data lines separated from the local data lines. The control circuit controls each of one or more compression engines among the plurality of compression engines to perform an encoding operation by receiving a first soft decision data from target cache latches corresponding to an output address, from the plurality of cache latches, by compressing the received first soft decision data and by overwriting the compressed first soft decision data in the target cache latches based on an input address, and controls one of one or more plurality of page buffer circuits among the plurality of page buffer circuits to perform an output operation by outputting the compressed first soft decision data through the data I/O circuit, in parallel with the encoding operation or independently from the encoding operation. The control circuit is configured to control the one or more compression engines to perform the encoding operation while the one or more plurality of page buffer circuits sense a second soft decision data from a (P+1)-th page of each of the one or more memory planes.

Therefore, the nonvolatile memory device separates a plurality of local data lines which connect page buffer circuits to compression engines, from global data lines which connect the page buffer circuits to a data I/O circuit. Therefore, the nonvolatile memory device may enhance performance by compressing soft decision data sensed from each of the plurality of memory planes in parallel and by performing output operation to output compressed soft decision data of the P-th page of a memory plane as a background operation of a sensing operation to sense soft decision data of (P+1)-th page of the memory plane to decrease timing interval for occupying channel.

BRIEF DESCRIPTION OF THE DRAWINGS

Illustrative, non-limiting example implementations will be more clearly understood from the following detailed description in conjunction with the accompanying drawings.

FIG. 14 is a diagram illustrating an example of address control of compressed data of the nonvolatile memory device.

FIGS. 18, 19, and 20 illustrate examples that the local clock controllers generate local clock signals in parallel or independently with respect to the memory planes in the nonvolatile memory device of FIG. 3.

FIG. 22 illustrates a read operation and an encoding operation on two example memory planes in the nonvolatile memory device of FIG. 3.

FIG. 26 is a diagram illustrating an example of a connection relationship between the compression engine and the memory planes.

FIG. 27 is a table illustrating an example of compression operation which the nonvolatile memory device of FIG. 3 performs in parallel with output operation to output a compressed soft decision data to an outside.

FIG. 33 is a diagram illustrating an example of a manufacturing process of a stacked semiconductor device.

DETAILED DESCRIPTION

Various example implementations will be described more fully hereinafter with reference to the accompanying drawings, in which some example implementations are shown.

Figure 1:
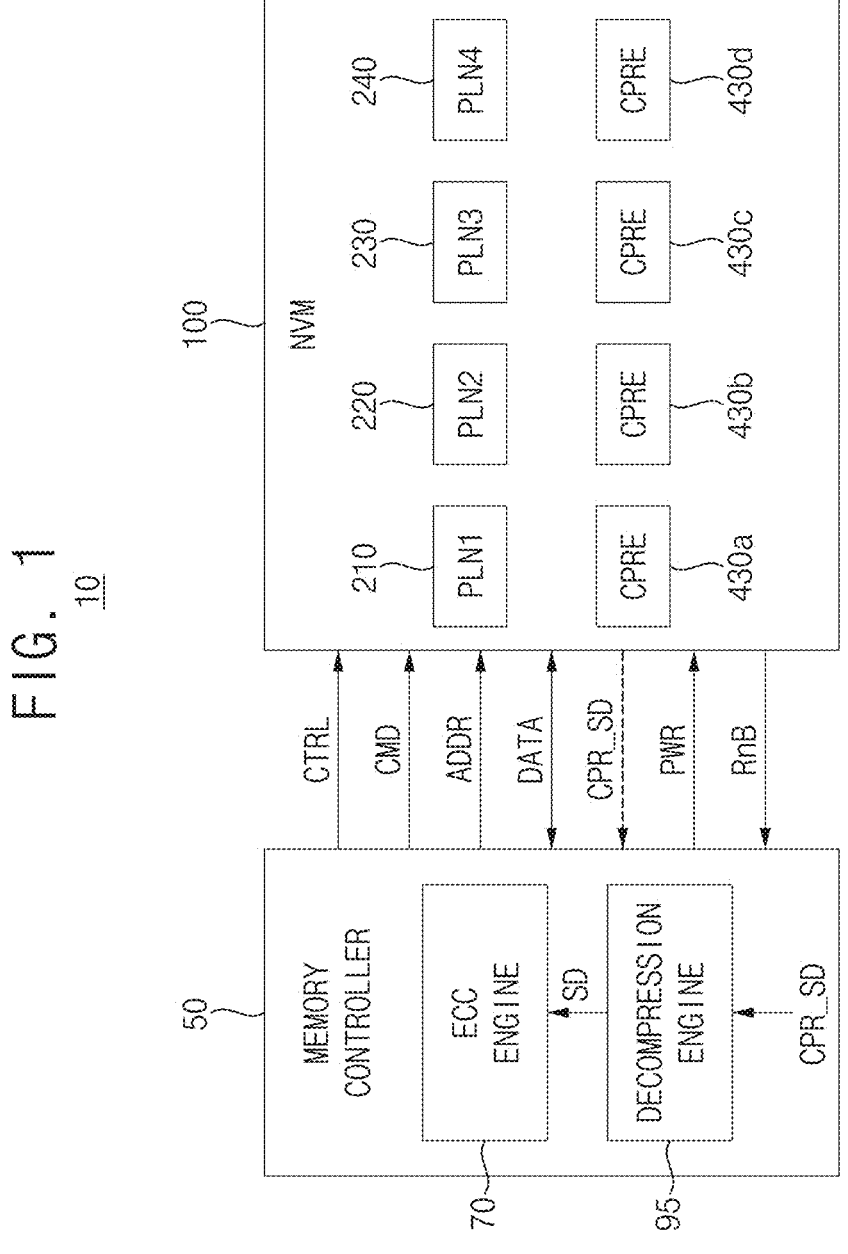
FIG. 1 is a block diagram illustrating an example of a memory system.

FIG. 1 is a block diagram illustrating an example of a memory system.

Figure 6:
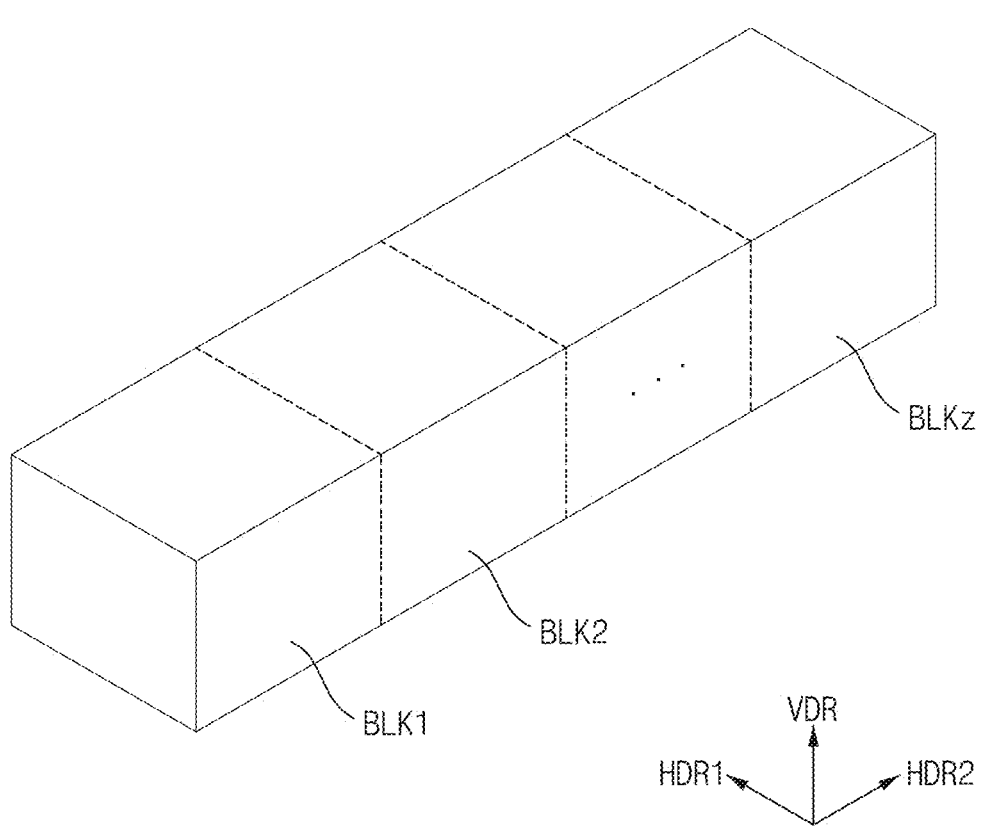
FIG. 6 is a block diagram illustrating an example of the memory plane in FIG. 3.

Referring to FIG. 6, a memory system 10 may include a memory controller 50 and at least one nonvolatile memory device 100. The memory system 10 may be referred to as a storage device.

In some implementations, each of the memory controller 50 and the nonvolatile memory device 100 may be provided with the form of a chip, a package, or a module. Alternatively, the memory controller 50 and the nonvolatile memory device 100 may be packaged into one of various packages.

The nonvolatile memory device 100 may perform an erase operation, a program operation or a write operation and a read operation under control of the memory controller 50. The nonvolatile memory device 100 may receive a command CMD, an address ADDR and data DATA through input/output lines from the memory controller 50 for performing such operations. In addition, the nonvolatile memory device 100 may receive a control signal CTRL through a control line from the memory controller 50. In addition, the nonvolatile memory device 100 may receive a power PWR through a power line from the memory controller 50. In addition, the nonvolatile memory device 100 may provide the memory controller 50 with a status signal RnB (e.g., a ready/busy signal) indicating a operating status of the nonvolatile memory device 100.

The nonvolatile memory device 100 may include a plurality of memory planes PLN1 (210), PLN2 (220), PLN3 (230) and PLN4 (240) corresponding to different bit-lines and a plurality of compression engines CPREs 430a, 430b, 430c and 430d corresponding to the plurality of memory planes 210, 220, 230 and 240.

Each of the plurality of compression engines 430a, 430b, 430c and 430d may compress a soft decision data sensed from respective one of the plurality of memory planes 210, 220, 230 and 240, and may overwrite the compressed soft decision data in cache latches in a corresponding page buffer circuit, and the nonvolatile memory device 100 may transmit, to the memory controller 50, a compressed soft decision data CPR_SD overwritten in the cache latches.

The memory controller 50 may include an error correction code (ECC) engine 70 and a decompression engine 95. The ECC engine may be implemented to perform an error correction operation on read data from the nonvolatile memory device 100. The error correction operation may apply either a hard decision method or a soft decision method. Here, the hard decision method may be a technique of correcting errors in data using read data and an error correction code according to turning on/off characteristics of the memory cell when a reference voltage is applied. In addition, the soft decision method may be a technique of correcting data errors by additionally using additional information about reliability of the hard decision data (e.g., soft decision data), separately from the hard decision data and ECCs.

The decompression engine 95 may be implemented to recover soft decision data SD by decompressing the compressed soft decision data CPR_SD based on a decompression algorithm. The decompression engine 95 may provide the recovered soft decision data SD to the ECC engine 70. The ECC engine 70 may correct errors in hard decision data based on hard decision data and soft decision data SD. For example, the ECC engine 70 may correct hard decision data by changing the log likelihood ratio (LLR) based on soft decision data SD.

Figure 2:
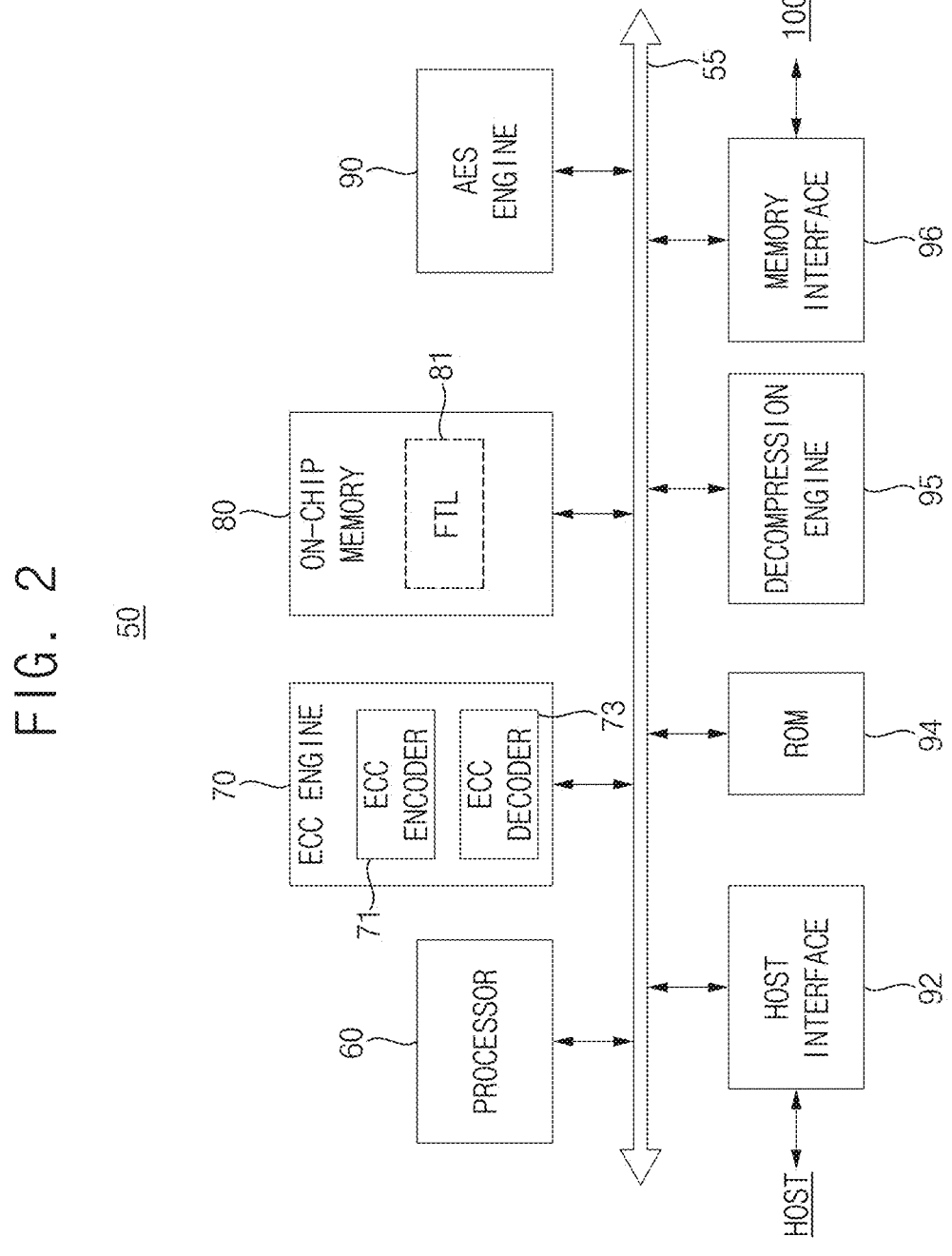
FIG. 2 is a block diagram illustrating an example of the memory controller in the memory system of FIG. 1.

FIG. 2 is a block diagram illustrating an example of the memory controller in the memory system of FIG. 1.

Referring to FIG. 2, the memory controller 50 may include a processor 60, the ECC engine 70, an on-chip memory 80, an advanced encryption standard (AES) engine 90, a host interface 92, a ROM 94, the decompression engine 95 and a memory interface 96 which are connected via a bus 55.

The processor 60 may control an overall operation of the memory controller 50. The processor 60 may control the ECC engine 70, the on-chip memory 80, the AES engine 90, the host interface 92, the ROM 94, the decompression engine 95 and the memory interface 96. The processor 60 may include one or more cores (e.g., a homogeneous multi-core or a heterogeneous multi-core). The processor 60 may be or include, for example, at least one of a central processing unit (CPU), an image signal processing unit (ISP), a digital signal processing unit (DSP), a graphics processing unit (GPU), a vision processing unit (VPU), and a neural processing unit (NPU). The processor 60 may execute various application programs (e.g., a flash translation layer (FTL) 81 and firmware) loaded onto the on-chip memory 80.

The on-chip memory 80 may store various application programs that are executable by the processor 60. The on-chip memory 80 may operate as a cache memory adjacent to the processor 60. The on-chip memory 80 may store a command, an address, and data to be processed by the processor 60 or may store a processing result of the processor 60. The on-chip memory 80 may be, for example, a storage medium or a working memory including a latch, a register, a static random access memory (SRAM), a dynamic random access memory (DRAM), a thyristor random access memory (TRAM), a tightly coupled memory (TCM), etc.

The processor 60 may execute the FTL 81 loaded onto the on-chip memory 80. The FTL 81 may be loaded onto the on-chip memory 80 as firmware or a program stored in the nonvolatile memory device 100. The FTL 81 may manage mapping between a logical address provided from a host and a physical address of the nonvolatile memory device 100 and may include an address mapping table manager managing and updating an address mapping table. The FTL 81 may further perform a garbage collection operation, a wear leveling operation, and the like, as well as the address mapping described above. The FTL 81 may be executed by the processor 60 for addressing one or more of the following aspects of the nonvolatile memory device 100: overwrite- or in-place write-impossible, a life time of a memory cell, a limited number of program-erase (PE) cycles, and an erase speed slower than a write speed.

Memory cells of the nonvolatile memory device 100 may have the physical characteristic that a threshold voltage distribution varies due to causes, such as a program elapsed time, a temperature, program disturbance, read disturbance and etc. For example, data stored at the nonvolatile memory device 100 becomes erroneous due to the above causes.

The memory controller 50 may utilize a variety of error correction techniques to correct such errors. For example, the memory controller 50 may include the ECC engine 70. The ECC engine 70 may correct errors which occur in the data stored in the nonvolatile memory device 100. The ECC engine 70 may include an ECC encoder 71 and an ECC decoder 73. The ECC encoder 71 may perform an ECC encoding operation on data to be stored in the nonvolatile memory device 100. The ECC decoder 73 may perform an ECC decoding operation on data read from the nonvolatile memory device 100. The ECC decoder 73 may correct errors in the hard decision data based on the hard decision data and the soft decision data read from the nonvolatile memory device 100.

The ROM 94 may store a variety of information, needed for the memory controller 50 to operate, in firmware.

The AES engine 90 may perform at least one of an encryption operation and a decryption operation on data input to the memory controller 50 by using a symmetric-key algorithm. Although not illustrated in detail, the AES engine 90 may include an encryption module and a decryption module. For example, the encryption module and the decryption module may be implemented as separate modules. For another example, one module capable of performing both encryption and decryption operations may be implemented in the AES engine 90.

The decompression engine 95 may recover soft decision data SD by decompressing the compressed soft decision data CPR_SD based on the decompression algorithm.

The memory controller 50 may communicate with a host through the host interface 92. For example, the host interface 92 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 50 may communicate with the nonvolatile memory device 100 through the memory interface 96.

Figure 3:
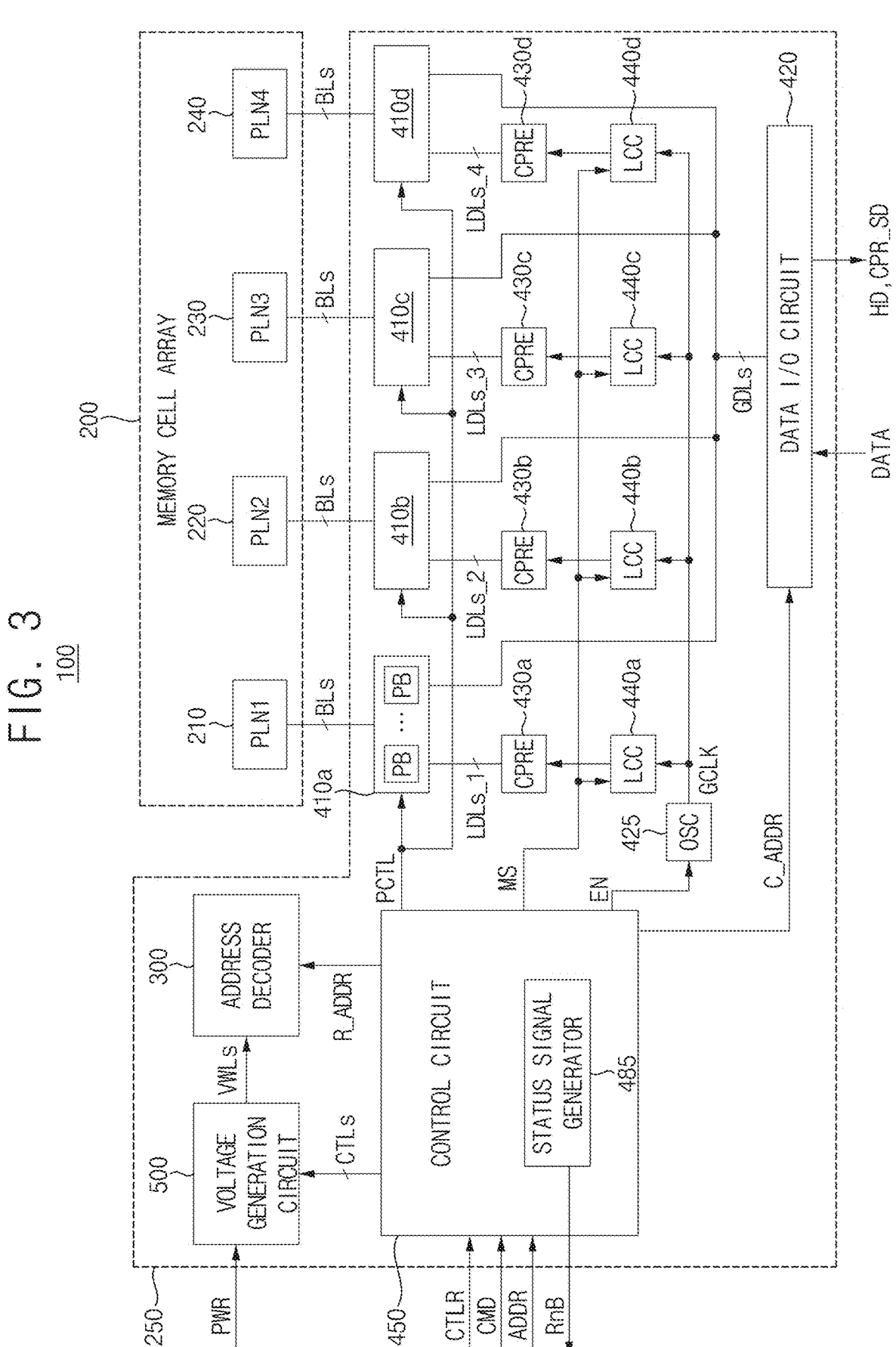
FIG. 3 is a block diagram illustrating an example of the nonvolatile memory device in the memory system of FIG. 1.

FIG. 3 is a block diagram illustrating an example of the nonvolatile memory device in the memory system of FIG. 1.

Referring to FIG. 3, the nonvolatile memory device 100 may include a memory cell array 200 and a peripheral circuit 250.

The memory cell array 200 may include the plurality of memory planes 210, 220, 230 and 240.

The peripheral circuit 250 may include a plurality of page buffer circuits 410a, 410b, 410c and 410d, the plurality of compression engines 430a, 430b, 430c and 430d, a plurality of local clock controllers LCCs 440a, 440b, 440c and 440d, an oscillator OSC 425, a data input/output (I/O) circuit 420, a control circuit 450, a voltage generator 500 and an address decoder 300. The plurality of page buffer circuits 410a, 410b, 410c and 410d may include a first page buffer circuit 410a, a second page buffer circuit 410b, a third page buffer circuit 410c and a fourth page buffer circuit 410d. The plurality of compression engines 430a, 430b, 430c and 430d may include a first compression engine 430a, a second compression engine 430b, a third compression engine 430c and a fourth compression engine 430d. The plurality of local clock controllers 440a, 440b, 440c and 440d may include a first local clock controller 440a, a second local clock controller 440b, a third local clock controller 440c and a fourth local clock controller 440d.

The memory cell array 200 may be coupled to the address decoder 300 through a string selection line SSL, a plurality of word-lines WLs, and a ground selection line GSL. Each of the plurality of page buffer circuits 410a, 410b, 410c and 410d may be connected to respective one of the plurality of memory planes 210, 220, 230 and 240 through corresponding bit-lines BLs. The plurality of memory planes 210, 220, 230 and 240 may include a plurality of nonvolatile memory cells coupled to the plurality of word-lines WLs and the plurality of bit-lines BLs.

Each of the plurality of memory planes 210, 220, 230 and 240 may include a plurality of memory blocks, and each of the memory blocks may have a three-dimensional (3D) structure. Each of the memory blocks may include a plurality of (vertical) cell strings and each of the cell strings includes a plurality of memory cells stacked with respect to each other. Each of the plurality of memory planes 210, 220, 230 and 240 may be referred to a first memory plane 210, a second memory plane 220, a third memory plane 230 and a fourth memory plane 240.

Each of the plurality of compression engines 430a, 430b, 430c and 430d may be connected to respective one of the plurality of page buffer circuits 410a, 410b, 410c and 410d through respective one of local data lines LDLs_1, LDLs_2, LDLs_3 and LDLs_4. The local data lines LDLs_1, LDLs_2, LDLs_3 and LDLs_4 may include first local data lines LDLs_1, second local data lines LDLs_2, third local data lines LDLs_3 and fourth local data lines LDLs_4.

The plurality of page buffer circuits 410a, 410b, 410c and 410d may be connected to the data I/O circuit 420 through global data lines GDLs.

The control circuit 450 may receive the command CMD, the address ADDR, and the control signal CTRL from the memory controller 50 and may control an erase loop, a program loop and a read operation of the nonvolatile memory device 100 based on the command CMD, the address ADDR, and the control signal CTRL. The program loop may include a program operation and a program verification operation and the erase loop may include an erase operation and an erase verification operation.

In some implementations, the control circuit 450 may generate control signals CTLs, which are used for controlling the voltage generator 500, based on the command CMD, may provide the control signals CTLs to the voltage generator 500, may generate a page buffer control signal PCTL for controlling the plurality of page buffer circuits 410a, 410b, 410c and 410d, may provide the page buffer control signal PCTL to the plurality of page buffer circuits 410a, 410b, 410c and 410d, may generate an enable signal EN for enabling the oscillator 425, may provide the enable signal EN to the oscillator 425, may generate a mode signal MS indicating an operating mode and may provide the mode signal MS to the plurality of local clock controllers 440a, 440b, 440c and 440d.

In addition, the control circuit 450 may generate a row address R_ADDR and a column address C_ADDR based on the address signal ADDR. The control circuit 450 may provide the row address R_ADDR to the address decoder 300 and may provide the column address C_ADDR to the data I/O circuit 420. The control circuit 450 may include a status generator 485 and the status generator 485 may generate the status signal RnB indicating an operating status of the nonvolatile memory device 100. The status signal RnB may be referred to as a ready/busy signal because of the status signal RnB indicates either busy state or a ready state of the nonvolatile memory device 100.

The address decoder 300 may be coupled to the memory cell array 200 through the string selection line SSL, the plurality of word-lines WLs, and the ground selection line GSL. During program operation or read operation, the address decoder 300 may determine one of the plurality of word-lines WLs as a selected word-line based on the row address R_ADDR and may determine rest of the plurality of word-lines WLs except the selected word-line as unselected word-lines.

The voltage generator 500 may generate word-line voltages VWLs associated with operations of the nonvolatile memory device 100 using the power PWR provided from the memory controller 50 based on control signals CTLs from the control circuit 450. The word-line voltages VWLs may include a program voltage, a read voltage, a pass voltage, an erase verification voltage, or a program verification voltage. The word-line voltages VWLs may be applied to the plurality of word-lines WLs through the address decoder 300.

For example, during the erase operation, the voltage generator 500 may apply erase voltage to a channel of cell strings of a selected memory block and may apply a ground voltage to all word-lines of the selected memory block. During the erase verification operation, the voltage generator 500 may apply erase verification voltage to all word-lines of the selected memory block or may apply the erase verification voltage to the word-lines of the selected memory block by word-line basis.

For example, during the program operation, the voltage generator 500 may apply a program voltage to the selected word-line and may apply a program pass voltage to the unselected word-lines. In addition, during the program verification operation, the voltage generator 500 may apply a program verification voltage to the selected word-line and may apply a verification pass voltage to the unselected word-lines. In addition, during the read operation, the voltage generator 500 may apply a read voltage to the selected word-line and may apply a read pass voltage to the unselected word-lines.

Each of the plurality of page buffer circuits 410a, 410b, 410c and 410d may include a plurality of page buffers PB. Each of the plurality of page buffer circuits 410a, 410b, 410c and 410d may temporarily store data to be programmed in a selected page or data (e.g., the hard decision data and the soft decision data) read out from the selected page of the memory cell array 200.

Figure 9:
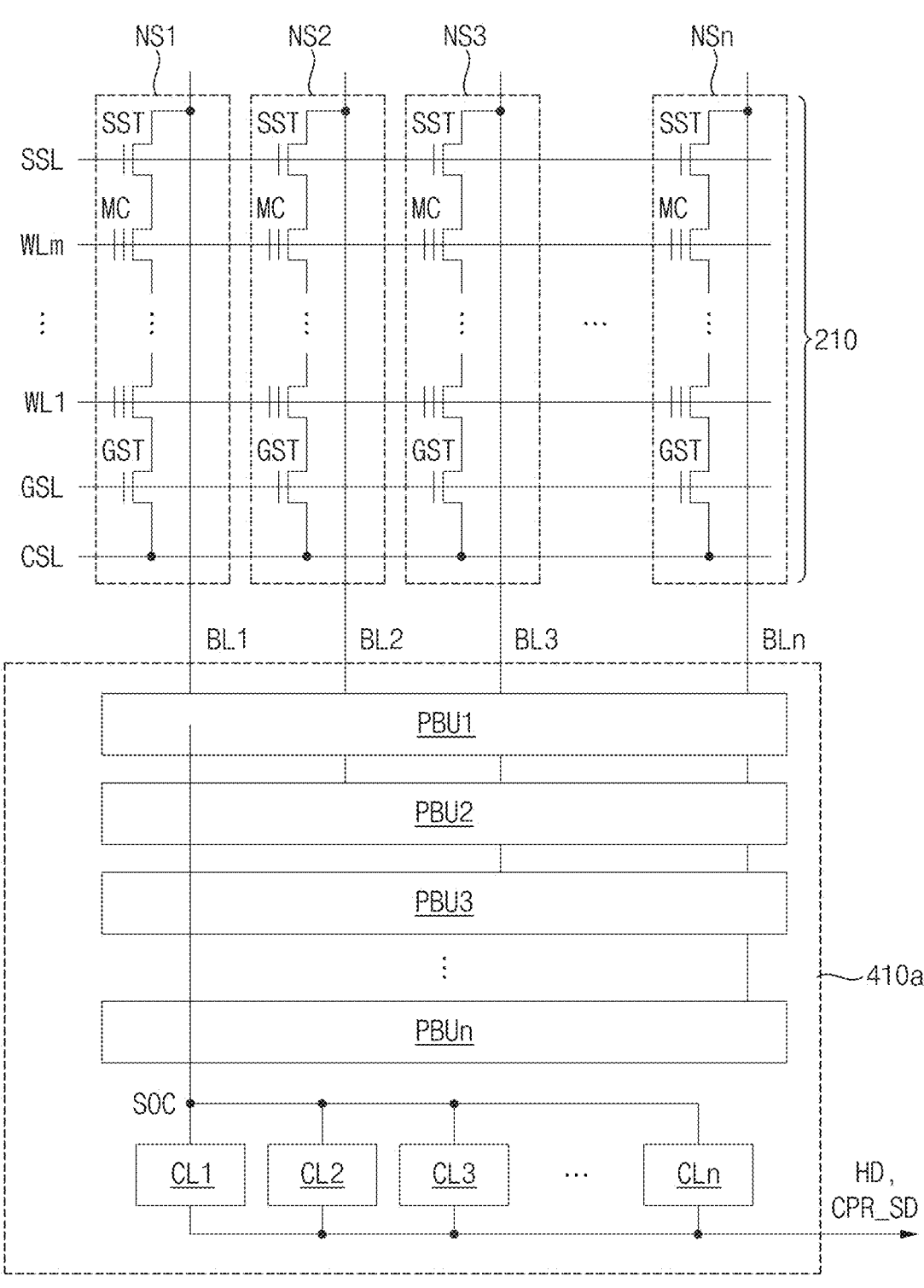
FIG. 9 is a schematic diagram of an example of a connection of the memory plane to the page buffer circuit in FIG. 3.

In some implementations, page buffer units included in each of the plurality of page buffers PB (for example, first through n-th page buffer units PBU1 through PBUn in FIG. 9) and cache latches included in each of the plurality of page buffers PB (for example, first through n-th cache latches CL1 through CLn in FIG. 9) may be apart from each other, and have separate structures. Accordingly, the degree of freedom of wirings on the page buffer units may be improved, and the complexity of a layout may be reduced. In addition, because the cache latches are adjacent to data I/O lines, the distance between the cache latches and the data I/O lines may be reduced, and thus, data I/O speed may be improved.

The oscillator 425 may be enabled in response to the enable signal EN and may provide a global clock signal GCLK to the plurality of local clock controllers LCCs 440a, 440b, 440c and 440d.

Each of the plurality of local clock controllers LCCs 440a, 440b, 440c and 440d may control respective one of the plurality of compression engines 430a, 430b, 430c and 430d based on the global clock signal GCLK and the mode signal MS.

The control circuit 450, based on the control signal CTRL and the command CMD and in the read operation, may control each of one or more compression engines among the plurality of compression engines 430a, 430b, 430c and 430d to perform an encoding operation by receiving soft decision data from target cache latches corresponding to an output address, from the plurality of cache latches, by compressing the receive the soft decision data and by overwriting the compressed soft decision data in the target cache latches based on an input address and may control one of one or more plurality of page buffer circuits among the plurality of page buffer circuits 410a, 410b, 410c and 410d to perform an output operation by outputting the compressed soft decision data CPR_SD through the data I/O circuit 420, in parallel with the encoding operation or independently from the encoding operation. That is, the control circuit 450 may control the page buffer circuits 410a, 410b, 410c and 410d, the compression engines 430a, 430b, 430c and 430d and the local clock controllers 440a, 440b, 440c and 440d such that the encoding operation and the output operation are performed in parallel or independently.

Each of the compression engines 430a, 430b, 430c and 430d is connected to respective one of the page buffer circuits 410a, 410b, 410c and 410d through respective one of the local data lines LDLs_1, LDLs_2, LDLs_3 and LDLs_4 and the page buffer circuits 410a, 410b, 410c and 410d are connected to the data I/O circuit 420 through the global data lines GDLs separate from the local data lines LDLs_1, LDLs_2, LDLs_3 and LDLs_4. Therefore, the encoding operation performed by the compression engines 430a, 430b, 430c and 430d is not affected by the output operation performed by the data I/O circuit 420. When at least three of the compression engines 430a, 430b, 430c and 430d perform the encoding operation in parallel, a page buffer circuit corresponding to one, which does not perform the encoding operation, of the compression engines 430a, 430b, 430c and 430d, may perform the output operation through the data I/O circuit 420.

The data I/O circuit 420 may be coupled to the page buffer circuits 410a, 410b, 410c and 410d through the global data lines GDLs. During the program operation, the data I/O circuit 420 may receive program data DATA from the memory controller 50 and may provide the program data DATA to the page buffer circuits 410a, 410b, 410c and 410d based on the column address C_ADDR received from the control circuit 450. During the read operation, the data I/O circuit 420 may provide read data (e.g., the hard decision data HD and the compressed soft decision data CPR_SD) to the memory controller 50 stored in one of the page buffer circuits 410a, 410b, 410c and 410d, based on the column address C_ADDR received from the control circuit 450.

Therefore, the nonvolatile memory device 100 may enhance performance by compressing soft decision data sensed from each of the plurality of memory planes in parallel and by performing output operation to output compressed soft decision data of P-th page of a memory plane as a background operation of a sensing operation to sense soft decision data of (P+1)-th page to decrease timing interval for occupying channel.

Figure 4:
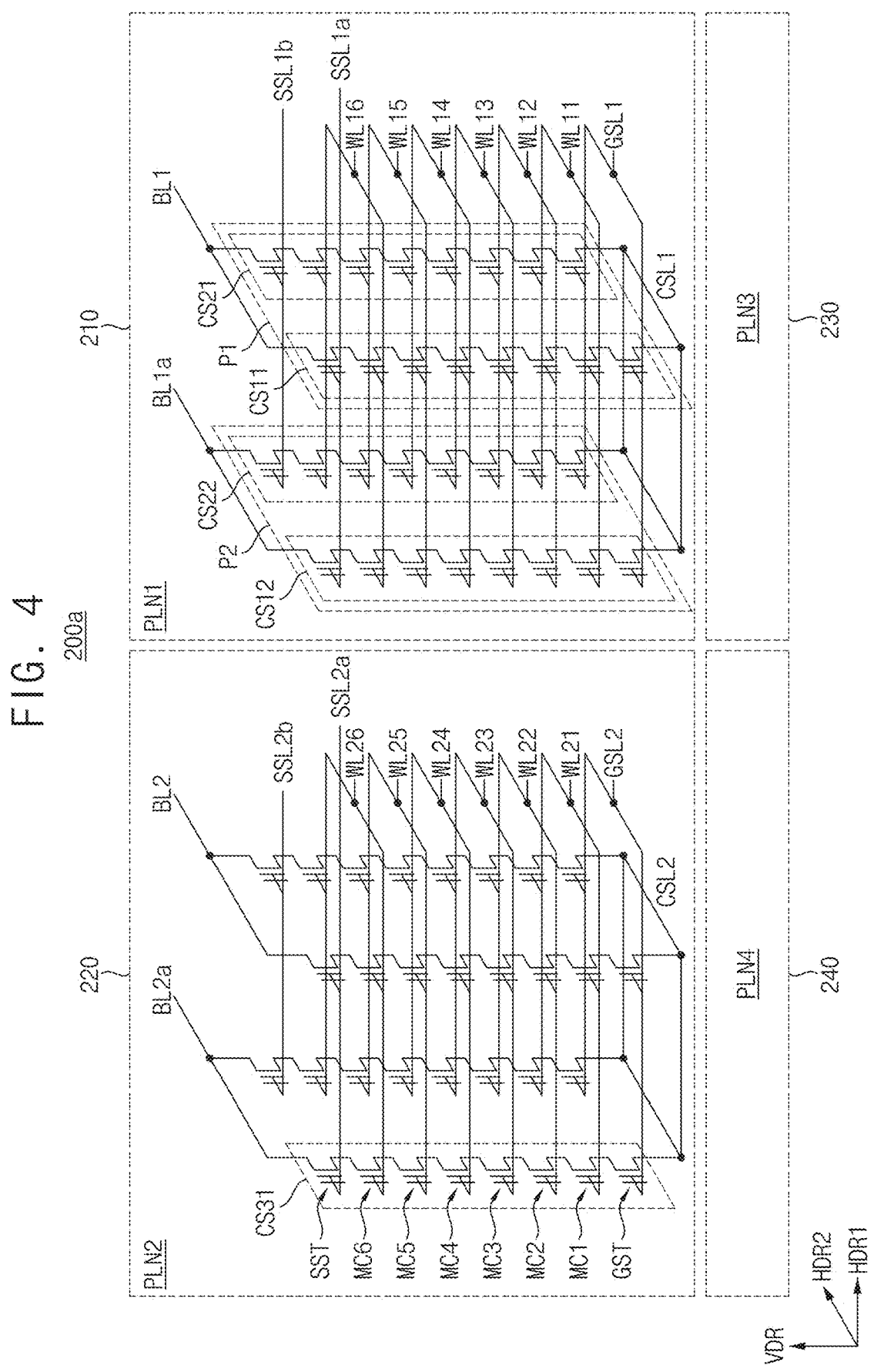
FIG. 4 is a circuit diagram illustrating an example of a memory plane configuration in the nonvolatile memory device of FIG. 3.

FIG. 4 is a circuit diagram illustrating an example of a memory plane configuration in the nonvolatile memory device of FIG. 3.

Referring to FIG. 4, a memory cell array 200a including the plurality of memory planes 210, 220, 230 and 240 is illustrated. Each of the plurality of memory planes 210, 220, 230 and 240 may include a plurality of memory blocks which are formed in a first horizontal direction HDR1, a second horizontal direction HDR2 and a vertical direction VDR, and each of the memory blocks may include a plurality of cell strings. For example, a memory block of the memory plane 210 may include a plurality of cell strings CS11, CS12, CS21, and CS22. In FIG. 4, configuration of each of the memory planes 210 and 220 are illustrated in detail for convenience of explanation, configuration of each of the memory planes 230 and 240 may be substantially the same as the configuration of each of the memory planes 210 and 220.

Each of the memory planes (first and second memory planes) 210 and 210 may include a plurality of memory blocks, and one of the memory blocks may have multiple string selection lines SSL1a and SSL1b to select at least one of the cell strings CS11, CS12, CS21, and CS22. For example, when a selection voltage is applied to a first string selection line SSL1a, the first and second cell strings CS11 and CS12 may be selected. When a selection voltage is applied to a second string selection line SSL1b, third and fourth cell strings CS21 and CS22 may be selected.

In some implementations, the memory planes 210 and 220 may have the same physical structure. For example, like the memory plane 210, the memory plane 220 may include multiple memory blocks and multiple cell strings formed in a memory block of the multiple memory blocks. Also, the memory plane 220 may include multiple string selection lines SSL2a and SSL2b to select at least one of multiple cell strings.

Each of the memory planes 210 and 220 may be coupled to corresponding word-lines and a common source line. The cell strings in the memory plane 210 may be coupled to word-lines WL11~WL16, a ground selection line GSL1 and a common source line CSL1. The cell strings in the memory plane 220 may be coupled to word-lines WL21~WL26, a ground selection line GSL2 and a common source line CSL2.

The memory planes 210 and 220 do not share bit-lines. First bit-lines BL1 and BL1a are coupled to the memory plane 210 exclusively. Second bit-lines BL2 and BL2a are coupled to the memory plane 220 exclusively.

Although FIG. 4 illustrates an example in which each memory plane is connected with two bit-lines and six word-lines, example implementations are not limited to these features. For example, each memory plane may be connected with three or more bit-lines and seven or more word-lines.

Each cell string may include at least one string selection transistor, memory cells, and at least one ground selection transistor. For example, a cell string CS31 of the memory plane 220 may include a ground selection transistor GST, multiple memory cells MC1 to MC6, and a string selection transistor SST sequentially being perpendicular to a substrate. The remaining cell strings may be formed substantially the same as the cell string CS31.

The memory planes 210 and 220 may include independent string selection lines. For example, string selection lines SSL1a and SSL1b are only connected with the memory plane 210, and string selection lines SSL2a and SSL2b are only connected with the memory plane 220. A string selection line may be used to select cell strings only in a memory plane. Also, cell strings may be independently selected in every memory plane by controlling the string selection lines independently.

For example, cell strings CS11 and CS12 may be independently selected by applying a selection voltage only to first string selection line SSL1a. When the selection voltage is applied to first string selection line SSL1a, string selection transistors of cell strings CS11 and CS12 corresponding to first string selection line SSL1a may be turned on by the selection voltage. At this time, memory cells of the cell strings CS11 and CS12 may be electrically connected with a bit-line. When a non-selection voltage is applied to first string selection line SSL1a, string selection transistors of cell strings CS11 and CS12 corresponding to first string selection line SSL1a are turned off by the non-selection voltage. At this time, memory cells of the cell strings CS11 and CS12 are electrically isolated from a bit-line BL1.

Figure 5:
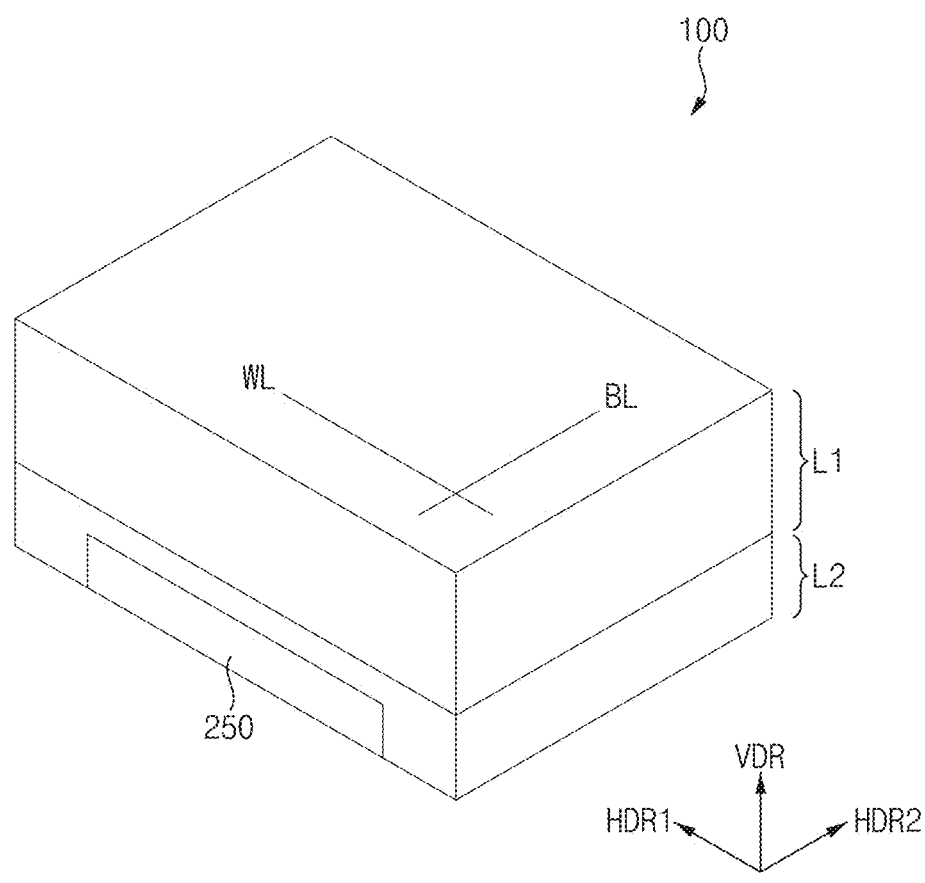
FIG. 5 schematically illustrates an example of a structure of the nonvolatile memory device of FIG. 3.

FIG. 5 schematically illustrates an example of a structure of the nonvolatile memory device of FIG. 3.

Referring to FIG. 5, the nonvolatile memory device 100 may include a first semiconductor layer L1 and a second semiconductor layer L2, and the first semiconductor layer L1 may be stacked in the vertical direction VDR with respect to the second semiconductor layer L2. The second semiconductor layer L2 may be under the first semiconductor layer L1 in the vertical direction VDR, and accordingly, the second semiconductor layer L2 may be close to a substrate.

In some implementations, the memory cell array 200 in FIG. 3 may be formed (or, provided) on the first semiconductor layer L1, and the peripheral circuit 250 in FIG. 3 may be formed (or, provided) on the second semiconductor layer L2. Accordingly, the nonvolatile memory device 100 may have a structure in which the memory cell array 200 is on the peripheral circuit 250, that is, a cell over periphery (COP) structure. The COP structure may effectively reduce an area in a horizontal direction and improve the degree of integration of the memory device 100.

In some implementations, the second semiconductor layer L2 may include the substrate, and by forming transistors on the substrate and metal patterns for wiring transistors, the peripheral circuit 250 may be formed in the second semiconductor layer L2. After the peripheral circuit 250 is formed on the second semiconductor layer L2, the first semiconductor layer L1 including the memory cell array 200 may be formed, and the metal patterns for connecting the word-lines WL and the bit-lines BL of the memory cell array 200 to the peripheral circuit 250 formed in the second semiconductor layer L2 may be formed. For example, the word-lines WL may extend in the first horizontal direction HDR1, and the bit-lines BL may extend in the second horizontal direction HDR2.

As the number of stages of memory cells in the memory cell array 200 increases with the development of semiconductor processes, that is, as the number of stacked word-lines WL increases, an area of the memory cell array 200 may decrease, and accordingly, an area of the peripheral circuit 250 may also be reduced. According to an implementation, to reduce an area of a region occupied by the page buffer circuits 410a, 410b, 410c and 410d, each of the page buffer circuits 410a, 410b, 410c and 410d may have a structure in which the page buffer unit and the cache latch are separated from each other, and may connect sensing nodes included in each of the page buffer units commonly to a combined sensing node. This will be explained in detail with reference to FIG. 9.

FIG. 6 is a block diagram illustrating an example of the memory plane in FIG. 3.

Referring to FIG. 6, the memory plane 210 may include a plurality of memory blocks BLK1 to BLKz which extend along a plurality of directions HDR1, HDR2 and VDR. Here, z is an integer greater than two. In an implementation, the memory blocks BLK1 to BLKz are selected by the address decoder 300 in FIG. 3. For example, the address decoder 300 may select a memory block corresponding to a block address among the memory blocks BLK1 to BLKz.

Figure 7:
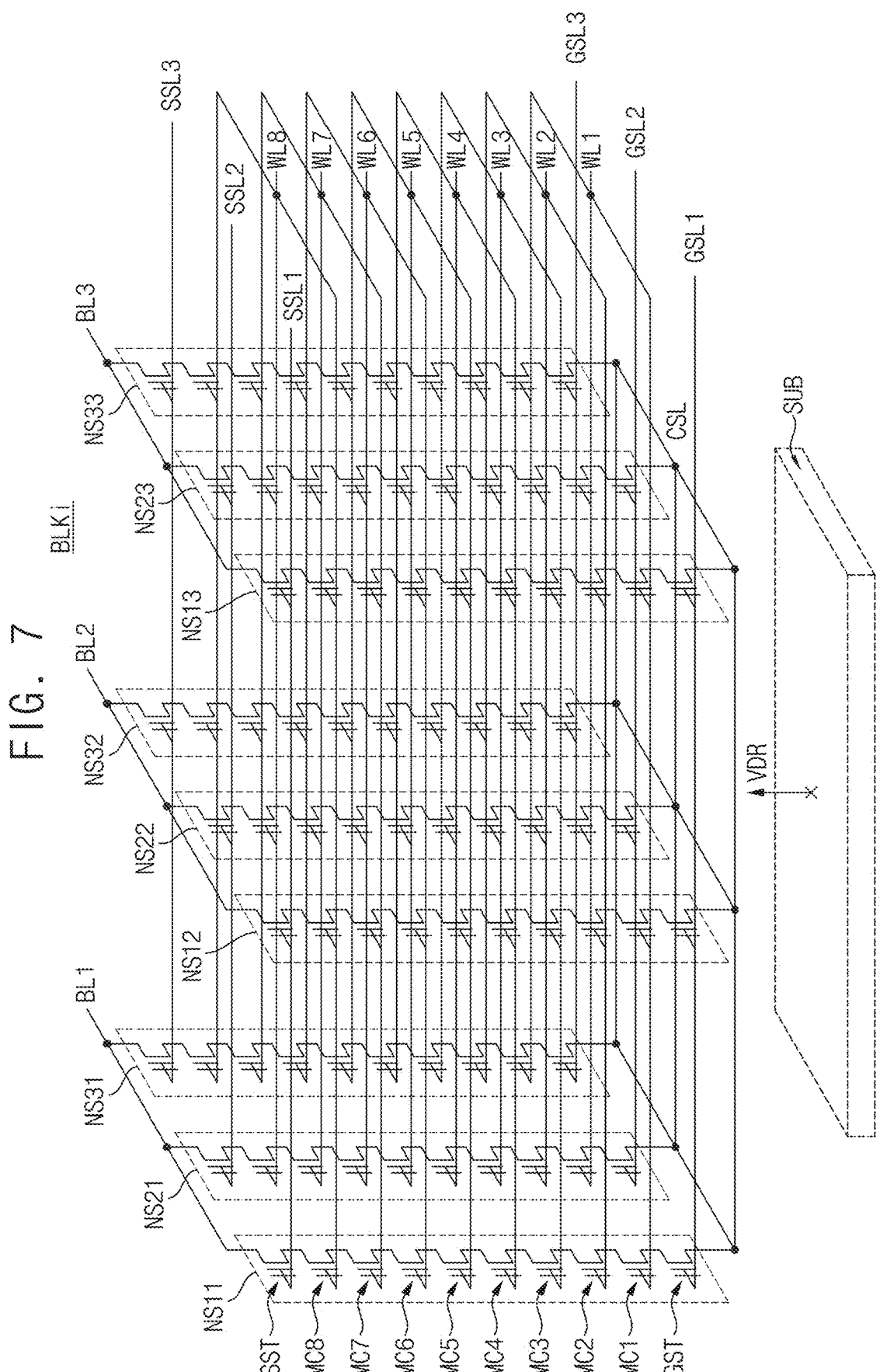
FIG. 7 is a circuit diagram illustrating an example of one of the memory blocks of FIG. 6.

FIG. 7 is a circuit diagram illustrating an example of one of the memory blocks of FIG. 6.

A memory block BLKi of FIG. 7 may be formed on a substrate SUB in a three-dimensional structure (or a vertical structure). For example, a plurality of (memory) cell strings included in the memory block BLKi may be formed in the vertical direction VDR perpendicular to the substrate SUB.

Referring to FIG. 7, the memory block BLKi may include a plurality of cell strings NS11, NS21, NS31, NS12, NS22, NS32, NS13, NS23 and NS33 (hereinafter, represented as NS11 to NS33) coupled between bit-lines BL1, BL2 and BL3 and a common source line CSL. Each of the cell strings NS11 to NS33 may include a string selection transistor SST, a plurality of memory cells MC1, MC2, MC3, MC4, MC5, MC6, MC7 and MC8 (hereinafter represented as MC1 to MC8), and a ground selection transistor GST. In FIG. 7, each of the cell strings NS11 to NS33 is illustrated to include eight memory cells MC1 to MC8. However, present disclosure are not limited thereto. In some implementations, each of the cell strings NS11 to NS33 may include any number of memory cells.

The string selection transistor SST may be connected to corresponding string selection lines SSL1, SSL2 and SSL3

(hereinafter, represented as SSL1 to SSL3). The plurality of memory cells MC1 to MC8 may be connected to corresponding word-lines WL1 to WL8, respectively. The ground selection transistor GST may be connected to corresponding ground selection lines GSL1, GSL2 and GSL3 (hereinafter, represented as GSL1 to GSL3). The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated.

Figure 8:
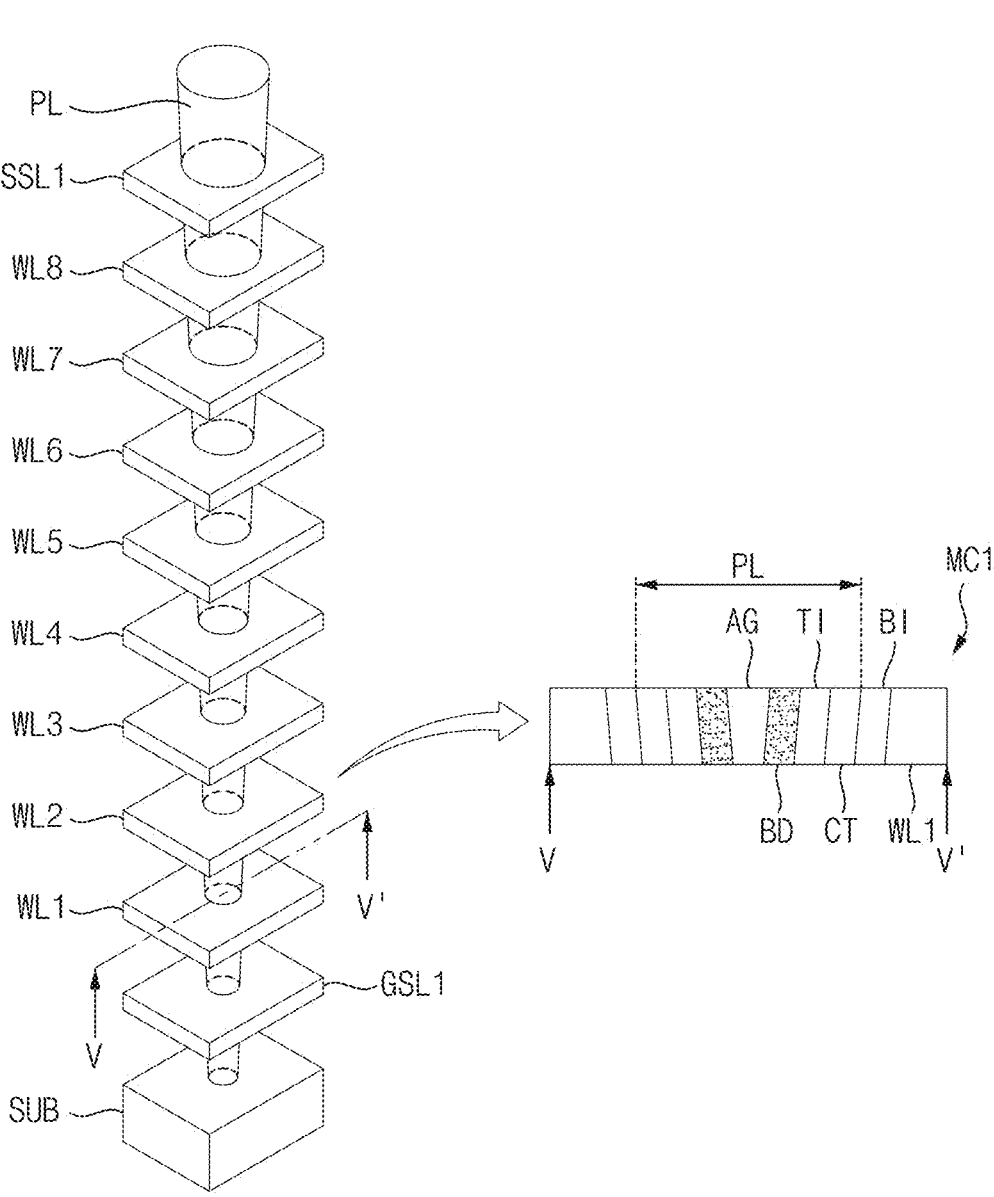
FIG. 8 illustrates an example of a structure of a cell string CS in the memory block of FIG. 7.

FIG. 8 illustrates an example of a structure of a cell string CS in the memory block of FIG. 7.

Referring to FIGS. 7 and 8, a pillar PL is provided on the substrate SUB such that the pillar PL extends in a direction perpendicular to the substrate SUB to make contact with the substrate SUB. Each of the ground selection line GSL, the word-lines WL1 to WL8, and the string selection lines SSL1 illustrated in FIG. 8 may be formed of a conductive material parallel with the substrate SUB, for example, a metallic material. The pillar PL may be in contact with the substrate SUB through the conductive materials forming the string selection lines SSL, the word-lines WL1 to WL8, and the ground selection line GSL1.

A sectional view taken along a line V-V' is also illustrated in FIG. 8. In some implementations, a sectional view of a first memory cell MC1 corresponding to a first word-line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

FIG. 9 is a schematic diagram of an example of a connection of the memory plane to the page buffer circuit in FIG. 3.

Referring to FIG. 9, the memory cell array 200 may include first through n-th cell strings NS1, NS2, NS3, . . . , NSn (hereinafter, represented as NS1 through NSn), each of the first through n-th cell strings NS1 through NSn may include a ground select transistor GST connected to the ground select line GSL, a plurality of memory cells MC respectively connected to the first through m-th word-lines WL1, . . . , WLm (hereinafter, represented as WL1 through WLm), and a string select transistor SST connected to the string select line SSL, and the ground select transistor GST, the plurality of memory cells MC, and the string select transistor SST may be connected to each other in series. In this case, m may be a positive integer.

The page buffer circuit 410 may include first through n-th page buffer units PBU1, PBU2, PBU3, . . . , PBUn (hereinafter, represented as PBU1 through PBUn). The first page buffer unit PBU1 may be connected to the first cell string NS1 via the first bit-line BL1, and the n-th page buffer unit PBUn may be connected to the n-th cell string NSn via the n-th bit-line BLn. In this case, ger greater than 3. For example, n may be 8, and the page buffer circuit 410 may have a structure in which page buffer units of eight stages, or, the first through n-th page buffer units PBU1 through PBUn are in a line. For example, the first through n-th page buffer units PBU1 through PBUn may be in a row in an extension direction of the first through n-th bit-lines BL1 through BLn.

The page buffer circuit 410 may further include first through n-th cache latches CL1, CL2, CL3, . . . , CLn (hereinafter, represented as CL1 through CLn) respectively corresponding to the first through n-th page buffer units PBU1 through PBUn. For example, the page buffer circuit 410 may have a structure in which the cache latches of eight stages or the first through n-th cache latches CL1 through CLn in a line. For example, the first through n-th cache latches CL1 through CLn may be in a row in an extension direction of the first through n-th bit-lines BL1 through BLn.

The sensing nodes of each of the first through n-th page buffer units PBU1 through PBUn may be commonly connected to a combined sensing node SOC. In addition, the first through n-th cache latches CL1 through CLn may be commonly connected to the combined sensing node SOC. Accordingly, the first through n-th page buffer units PBU1 through PBUn may be connected to the first through n-th cache latches CL1 through CLn via the combined sensing node SOC. The first through n-th cache latches CL1 through CLn may output the hard decision data HD and the compressed soft decision data CPR_SD.

Figure 10:
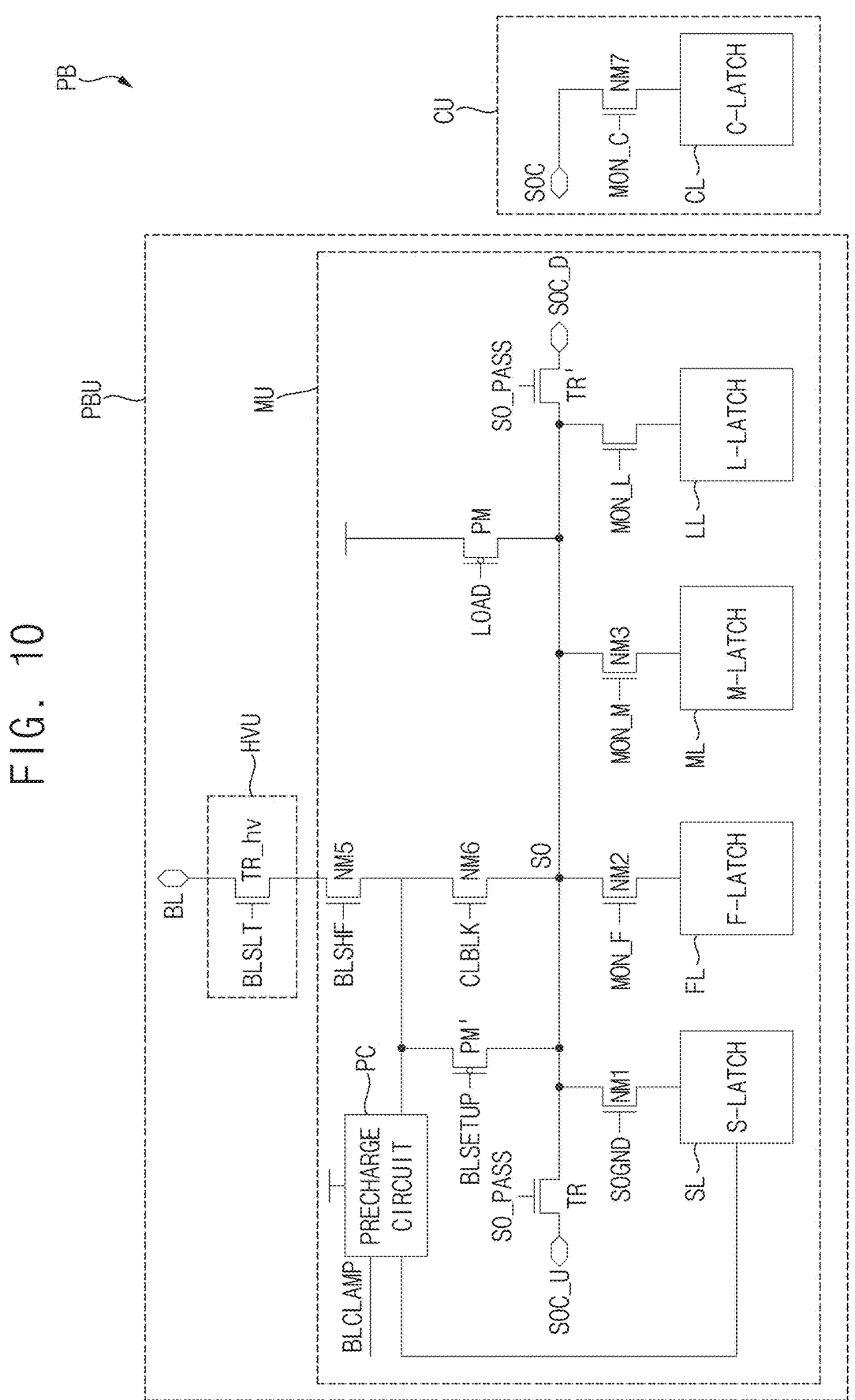
FIG. 10 illustrates an example of a page buffer in detail.

FIG. 10 illustrates an example of a page buffer in detail.

Referring to FIG. 10, the page buffer PB may correspond to an example of the page buffer PB in FIG. 3. The page buffer PB may include a page buffer unit PBU and a cache unit CU. Because the cache unit CU includes a cache latch (C-LATCH) CL, and the C-LATCH CL is connected to a global data line, the cache unit CU may be adjacent to the global data line. Accordingly, the page buffer unit PBU and the cache unit CU may be apart from each other, and the page buffer PB may have a structure in which the page buffer unit PBU and the cache unit CU are apart from each other.

The page buffer unit PBU may include a main unit MU. The main unit MU may include main transistors in the page buffer PB. The page buffer unit PBU may further include a bit-line selection transistor TR_hv that is connected to the bit-line BL and driven by a bit-line selection signal BLSLT. The bit-line select transistor TR_hv may include a high voltage transistor, and accordingly, the bit-line selection transistor TR_hv may be in a different well region from the main unit MU, that is, in a high voltage unit HVU.

The main unit MU may include a sensing latch (S-LATCH) SL, a force latch (F-LATCH) FL, an upper bit latch (M-LATCH) ML and a lower bit latch (L-LATCH) LL. According to an implementation, the S-LATCH SL, the F-LATCH FL, the M-LATCH ML, or the L-LATCH LL may be referred to as main latches or data latches. The main unit MU may further include a precharge circuit PC capable of controlling a precharge operation on the bit-line BL or a sensing node SO based on a bit-line clamping control signal BLCLAMP, and may further include a transistor PM' driven by a bit-line setup signal BLSETUP.

The S-LATCH SL may, during a read or program verification operation, store data stored in a memory cell MC or a sensing result of a threshold voltage of the memory cell MC. In addition, the S-LATCH SL may, during a program operation, be used to apply a program bit-line voltage or a program inhibit voltage to the bit-line BL.

The F-LATCH FL may be used to improve threshold voltage distribution during the program operation. The F-LATCH FL may store force data. After the force data is initially set to '1', the force data may be converted to '0' when the threshold voltage of the memory cell MC enters a forcing region that has a lower voltage than a target region. By utilizing the force data during a program execution operation, the bit-line voltage may be controlled, and the program threshold voltage distribution may be formed narrower.

The M-LATCH ML, the L-LATCH LL, and the C-LATCH CL may be utilized to store data externally input during the program operation, and may be referred to as data latches. When data of 3 bits is programmed in one memory cell MC, the data of 3 bits may be stored in the M-LATCH ML, the L-LATCH LL, and the C-LATCH CL, respectively. Until a program of the memory cell MC is completed, the M-LATCH ML, the L-LATCH LL, and the C-LATCH CL may maintain the stored data. In addition, the C-LATCH CL may receive data read from a memory cell MC during the read operation from the S-LATCH SL, and output the received data to the outside via the global data line.

In addition, the main unit MU may further include first through fourth transistors NM1 through NM4. The first transistor NM1 may be connected between the sensing node SO and the S-LATCH SL, and may be driven by a ground control signal SOGND. The second transistor NM2 may be connected between the sensing node SO and the F-LATCH FL, and may be driven by a forcing monitoring signal MON_F. The third transistor NM3 may be connected between the sensing node SO and the M-LATCH ML, and may be driven by a higher bit monitoring signal MON_M. The fourth transistor NM4 may be connected between the sensing node SO and the L-LATCH LL, and may be driven by a lower bit monitoring signal MON_L.

In addition, the main unit MU may further include fifth and sixth transistors NM5 and NM6 connected to each other in series between the bit-line selection transistor TV_hv and the sensing node SO. The fifth transistor NM5 may be driven by a bit-line shut-off signal BLSHF, and the sixth transistor NM6 may be driven by a bit-line connection control signal CLBLK. In addition, the main unit MU may further include a precharge transistor PM. The precharge transistor PM may be connected to the sensing node SO, driven by a load signal LOAD, and precharge the sensing node SO to a precharge level in a precharge period.

In an implementation, the main unit MU may further include a pair of pass transistors connected to the sensing node SO, or first and second pass transistors TR and TR'. According to an implementation, the first and second pass transistors TR and TR' may also be referred to as first and second sensing node connection transistors, respectively. The first and second pass transistors TR and TR' may be driven in response to a pass control signal SO_PASS. According to an implementation, the pass control signal SO_PASS may be referred to as a sensing node connection control signal. The first pass transistor TR may be connected between a first terminal SOC_U and the sensing node SO, and the second pass transistor TR' may be between the sensing node SO and a second terminal SOC_D.

For example, when the page buffer unit PBU corresponds to the second page buffer unit PBU2 in FIG. 9, the first terminal SOC_U may be connected to one end of the pass transistor included in the first page buffer unit PBU1, and the second terminal SOC_D may be connected to one end of the pass transistor included in the third page buffer unit PBU3. In this manner, the sensing node SO may be electrically connected to the combined sensing node SOC via pass transistors included in each of the third through n-th page buffer units PBU3 through PBUn.

During the program operation, the page buffer PB may verify whether the program is completed in a memory cell selected among the memory cells included in the cell string connected to the bit-line BL. The page buffer PB may store data sensed via the bit-line BL during the program verify operation in the S-LATCH SL. The M-LATCH ML and the L-LATCH LL may be set in which target data is stored according to the sensed data stored in the S-LATCH SL.

For example, when the sensed data indicates that the program is completed, the M-LATCH ML and the L-LATCH LL may be switched to a program inhibit setup for the selected memory cell in a subsequent program loop. The C-LATCH CL may temporarily store input data provided from the outside. During the program operation, the target data to be stored in the C-LATCH CL may be stored in the M-LATCH ML and the L-LATCH LL.

The data latches and the cache latches may be referred to a latch group.

Hereinafter, assuming that signals for controlling elements in the page buffer circuit 410 are included in the page buffer control signal PCTL in FIG. 3.

Figure 11A:
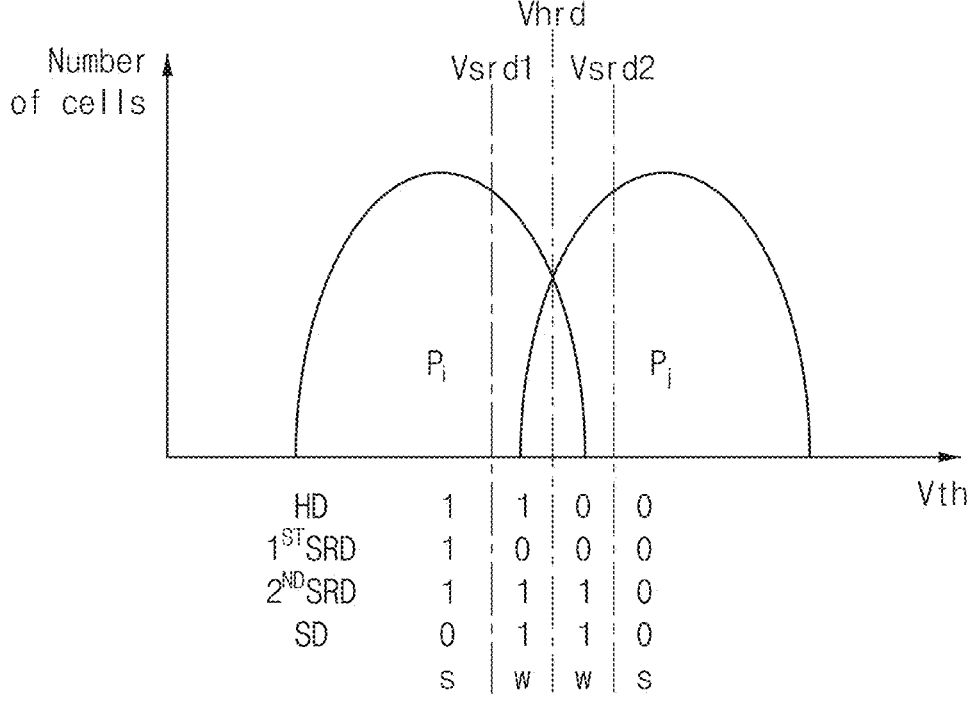
FIGS. 11A and 11B are example diagrams for explaining a read operation and a compression operation of soft decision.
Figure 11B:
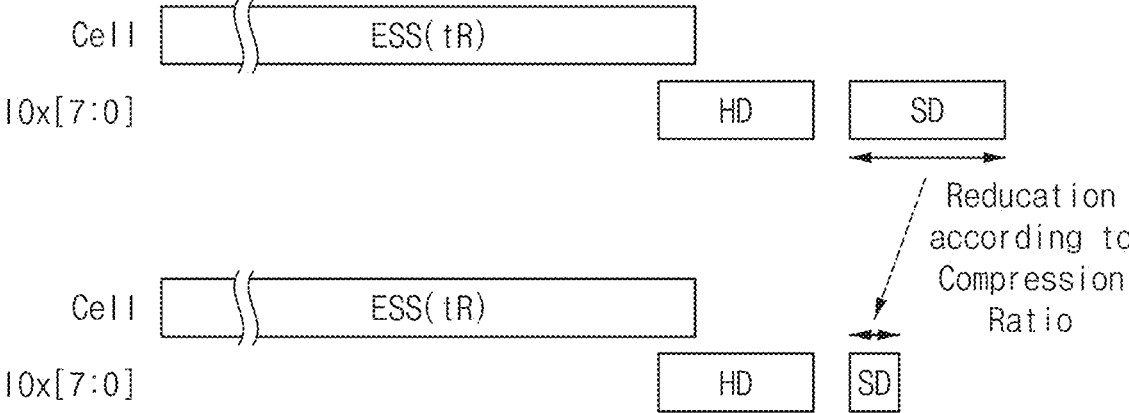

FIGS. 11A and 11B are example diagrams for explaining a read operation and a compression operation of soft decision.

As illustrated in FIG. 11A, soft decision read voltages used in a soft decision read operation may be Vsrd1 and Vsrd2 for discriminating program states Pi and Pj. The soft decision read operation may indicate that a number of soft decision read voltages Vsrd1 and Vsrd2 having a predetermined voltage difference may be applied to a memory cell based on the hard decision read voltage Vhrd and information adding reliability to the hard decision data HD may be formed. When the soft decision read voltage Vsrd1 is applied to the memory cell, determined data 1st SRD may be 1, 0, 0, and 0 depending on turning on or off of the memory cell. When the soft decision read voltage Vsrd2 is applied to the memory cell, data 2nd SRD determined according to turning on or off of the memory cell may be 1, 1, 1, and 0.

By performing exclusive OR (XOR) computation (e.g., operation) on the read values 1st SRD and 2nd SRD obtained by two read operations, soft decision data SD may be generated. As illustrated, the soft decision data SD may be 0, 1, 1 and 0. XOR operation may be performed in the page buffer circuit 410a. That is, XOR operation may be performed on the read values 1st SRD and 2nd SRD obtained by two read operations using the plurality of latches in the page buffer circuit 410a. The soft decision data SD may indicate reliability for hard decision data HD. When the soft decision data SD is 0, it may indicate a state in which reliability of the hard decision data is high, that is, strong(s). When the soft decision data SD is 1, it may indicate a state in which reliability of the hard decision data is low, that is, weak (w). In other words, 10, 11, 01, 00, which are combinations of hard decision data HD 1, 1, 0, 0 and soft decision data SD 0, 1, 1, 0, may indicate hard decision data HD 1 having high reliability, hard decision data HD 1 having low reliability, hard decision data HD 0 having low reliability, and hard decision data HD 0 having high reliability.

Generally, the soft decision data SD may have a relatively low ratio of 1 (e.g., about 2%). Accordingly, as illustrated in FIG. 11B, when the soft decision data SD is compressed according to a soft decision read operation ESS(tR), a data length read through an input/output pad IOx[7:0] may decrease. The data length may be reduced depending on a compression ratio. ESS may represent efficient soft sensing.

Figure 12A:
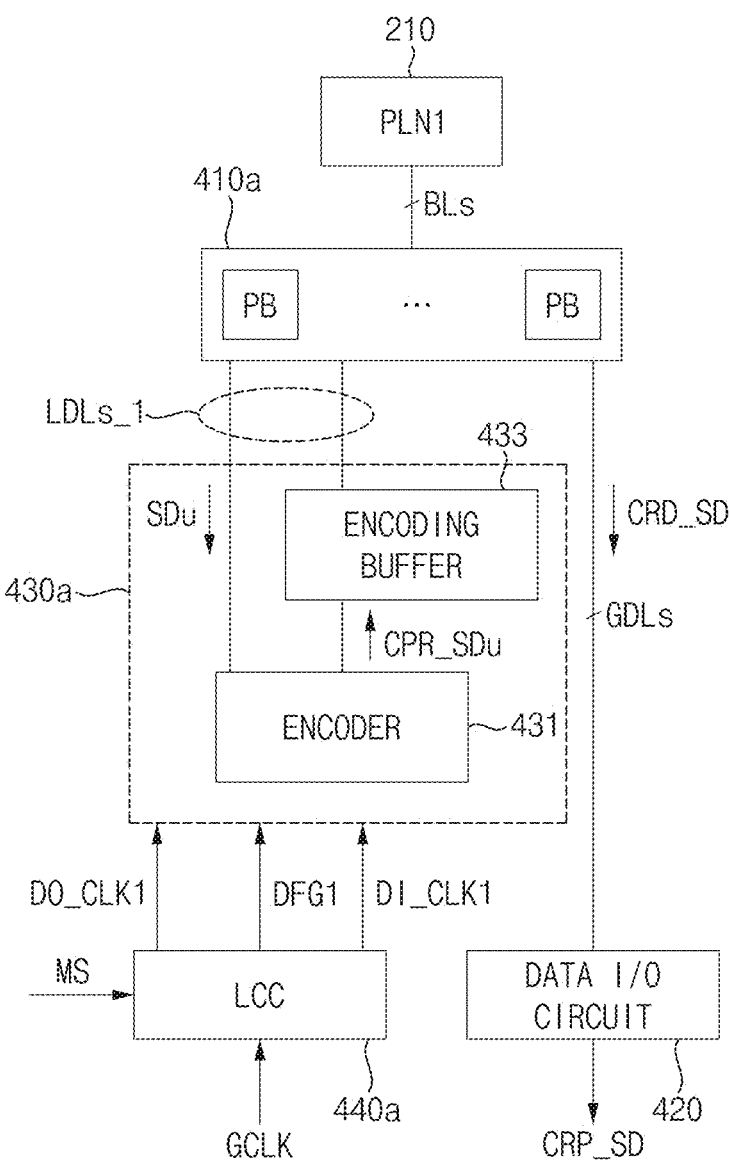
FIG. 12A illustrates example components corresponding to one memory plane and the data I/O circuit in the nonvolatile memory device of FIG. 3.

FIG. 12A illustrates example components corresponding to one memory plane and the data I/O circuit in the non-volatile memory device of FIG. 3.

Referring to FIG. 12A, the memory plane 210 may be coupled to the page buffer circuit 410a through the bit-lines BLs, the page buffer circuit 410a may be coupled to the compression engine 430a through the local data lines LDLs_1 and the page buffer circuit 410a may be coupled to the data I/O circuit 420 through the global data lines GDLs.

The local clock controller 440a may generate a flag signal DFG1, a first local clock signal DO_CLK1 and a second local clock signal DI_CLK based on the global clock signal GCLK and the mode signal MS and may provide the flag signal DFG1, the first local clock signal DO_CLK1 and the second local clock signal DI_CLK to the compression engine 430a. The flag signal DFG1 may be used for controlling operation of cache latches in the page buffer circuit 410a and operation of the compression engine 430a. The first local clock signal DO_CLK1 may be associated with operating interval of the cache latches and the second local clock signal DI_CLK may be associated with operating interval of the compression engine 430a.

The compression engine 430a may include an encoder 431 and an encoding buffer 433.

During the flag signal DFG1 having a logic high level which indicates an output operation, the compression engine 430a may provide the first local clock signal DO_CLK1 to the cache latches in the page buffer circuit 410a, the cache latches may provide the encoder 431 through the local data lines LDLs_1 with the soft decision data SDu of a sector unit, which is stored by performing a soft decision read operation, based on the first local clock signal DO_CLK1, the encoder 431 may store compressed soft decision data CPR_SDu in the encoding buffer 433 by compressing the soft decision data SDu based on the first local clock signal DO_CLK1. The encoding buffer 433 may include registers.

During the flag signal DFG1 having a logic low level which indicates an input operation, the compression engine 430a may overwrite the compressed soft decision data CPR_SDu stored in the encoding buffer 433, in a portion of the cache latches based on the second local clock signal DI_CLK1 through the local data lines LDLs_1.

The page buffer circuit 410a may provide the data I/O circuit through the global data lines GDLs with the compressed soft decision data CPR_SDu which is overwritten in the portion of the cache latches and the data I/O circuit 420 may transmit the compressed soft decision data CPR_SD to the memory controller 50 through data I/O pads.

Because the local data lines LDLs_1 are separated from the global data lines GDLs, the encoding operation of the compression engine 430a and the data output operation of the page buffer circuit 410a through the data I/O circuit 420 may be performed in parallel or independently.

That is, while (e.g., during) the compression engine 430a is performing an encoding operation on soft decision data sensed from (P+1)-th page of the memory plane 210, the page buffer circuit 410a may output a compressed soft decision data which is sensed from P-th page of the memory plane 210 and is compressed by the compression engine 430a. Here, P may be a natural number.

Figure 12B:
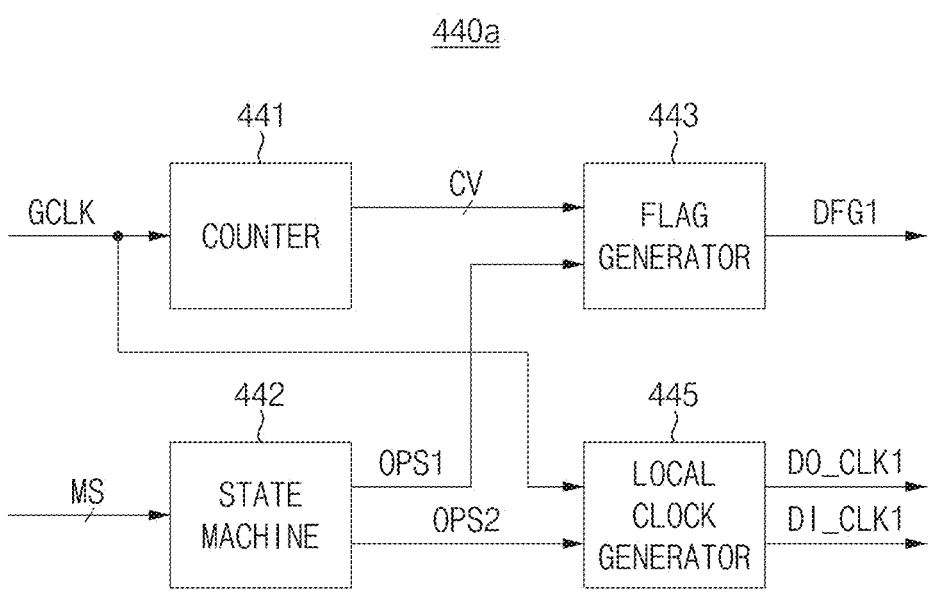
FIG. 12B is a block diagram illustrating an example of the local clock controller in FIG. 12A.

FIG. 12B is a block diagram illustrating an example of the local clock controller in FIG. 12A.

Referring to FIG. 12B, the local clock controller 440a may include a counter 441, a state machine 442, a flag generator 443 and a local clock generator 445.

The counter 441 may generate a counted value CV by counting the global clock signal GCLK and may provide the counted value CV to the flag generator 443.

The state machine 442 may receive the mode signal MS, may generate a first operation mode signal OPS1 and a second operation mode signal OPS2 indicating an operation mode designated by the mode signal MS, may provide the first operation mode signal OPS1 to the flag generator 443 and may provide the second operation mode signal OPS2 to the local clock generator 445. The mode signal MS may includes a plurality of bits designating operation timing of the compression engine 430a and operation timing of the cache latches.

The flag generator 443, based on the counted value CV and the first operation mode signal OPS1, may generate the flag signal DFG1 designating the output operation and the input operation and may provide the flag signal DFG1 to the compression engine 430. The flag signal DFG1 having a logic high level may designate the output operation and the flag signal DFG1 having a logic low level may designate the input operation.

The local clock generator 445 may receive the global clock signal GCLK and the second operation mode signal OPS2, may generate the first local clock signal DO_CLK1 and the second local clock signal DI_CLK based on the global clock signal GCLK and the operation mode designated by the second operation mode signal OPS2 and may provide the first local clock signal DO_CLK1 and the second local clock signal DI_CLK to the compression engine 430a. The first local clock signal DO_CLK1 may be associated with operating interval of the cache latches and the second local clock signal DI_CLK may be associated with operating interval of the compression engine 430a.

Figure 13:
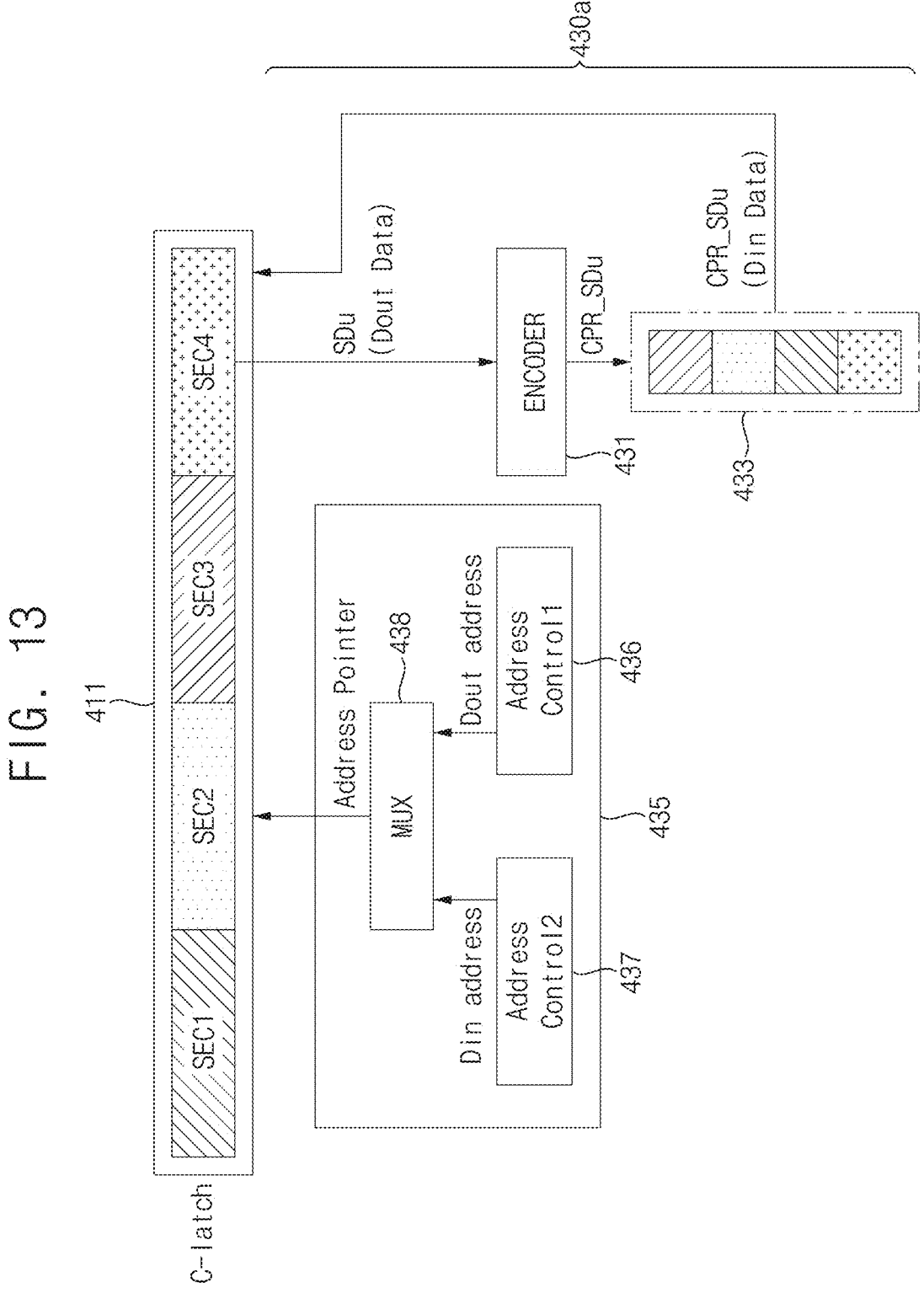
FIG. 13 is a block diagram illustrating an example of the compression engine in FIG. 12A.

FIG. 13 is a block diagram illustrating an example of the compression engine in FIG. 12A.

Referring to FIG. 13, the compression engine 430a may include the encoder 431, the encoding buffer 433 and an address controller 435.

Cache latches C-latches 411 may be divided into a plurality of sectors having latch groups. The C-latches 411 may read soft decision data SDu (Dout Data) from the sector corresponding to the address pointer read from the address controller 435 in a output operation Dout, the cache latches 411 may receive compressed soft decision data CPR_SDu (Din Data) from the encoding buffer 433 in a sector corresponding to an address pointer read from the address controller 435 in the input operation Din.

The encoder 431 may receive sector data SDu from the cache latches 411 under first address control, may compress the data based on a compression algorithm, and may read the compressed soft decision data CPR_SDu to the encoding buffer 433.

The address controller 435 may include a first address controller 436 which is represented as address control1, a second address controller 437 which is represented as address control2, and a multiplexer 438. The first address controller 436 may read an output address (Dout address) corresponding to a read operation for the cache latches 411 under first address control. The second address controller 437 may read an input address (Din address) corresponding to the write operation on the cache latches 411 under second address control. In an example implementation, the first address controller 436 and the second address controller 437 may operate independently of each other. The multiplexer 438 may read one of the output address (Dout address) or the input address (Din address) as an address pointer in the output operation Dout/input operation Din.

Meanwhile, in FIG. 13, the address controller 435 may separate address control through the multiplexer 438. However, an example implementation of the present disclosure is not limited thereto. The address controller in an example implementation may control page buffers directly by the first address controller and the second address controller without a multiplexer.

Meanwhile, in FIG. 13, the address controller 435 is illustrated as an internal component of the compression engine 430a, but an example implementation of the present disclosure is not limited thereto. The address controller in an example implementation may be implemented as a component of the control circuit 450 in FIG. 3.

The encoding buffer 433 may be implemented to store compressed soft decision data CPR_SDu from the encoder 431 and to overwrite the stored data CPR_SDu to a portion of the cache latches 411 under the second address control. In an example implementation, the encoding buffer 433 may be implemented as a register.

The compression engine 430a in an example implementation may reduce the size of the encoding buffer 433 by an amount corresponding to a compression ratio when encoding by sequentially repeating read/write operations. For example, as illustrated in FIG. 13, when page data is divided into four pieces of sector data SEC1, SEC2, SEC3 and SEC4 and the compression ratio is 25%, a minimum size of the encoding buffer 433 may be a sector data size x a compression ratio.

Meanwhile, when reading compressed data CPR_SD out of a chip in the nonvolatile memory device 100 in an example implementation, which address mapping should be supported may vary depending on requirements from a user.

Figure 14:
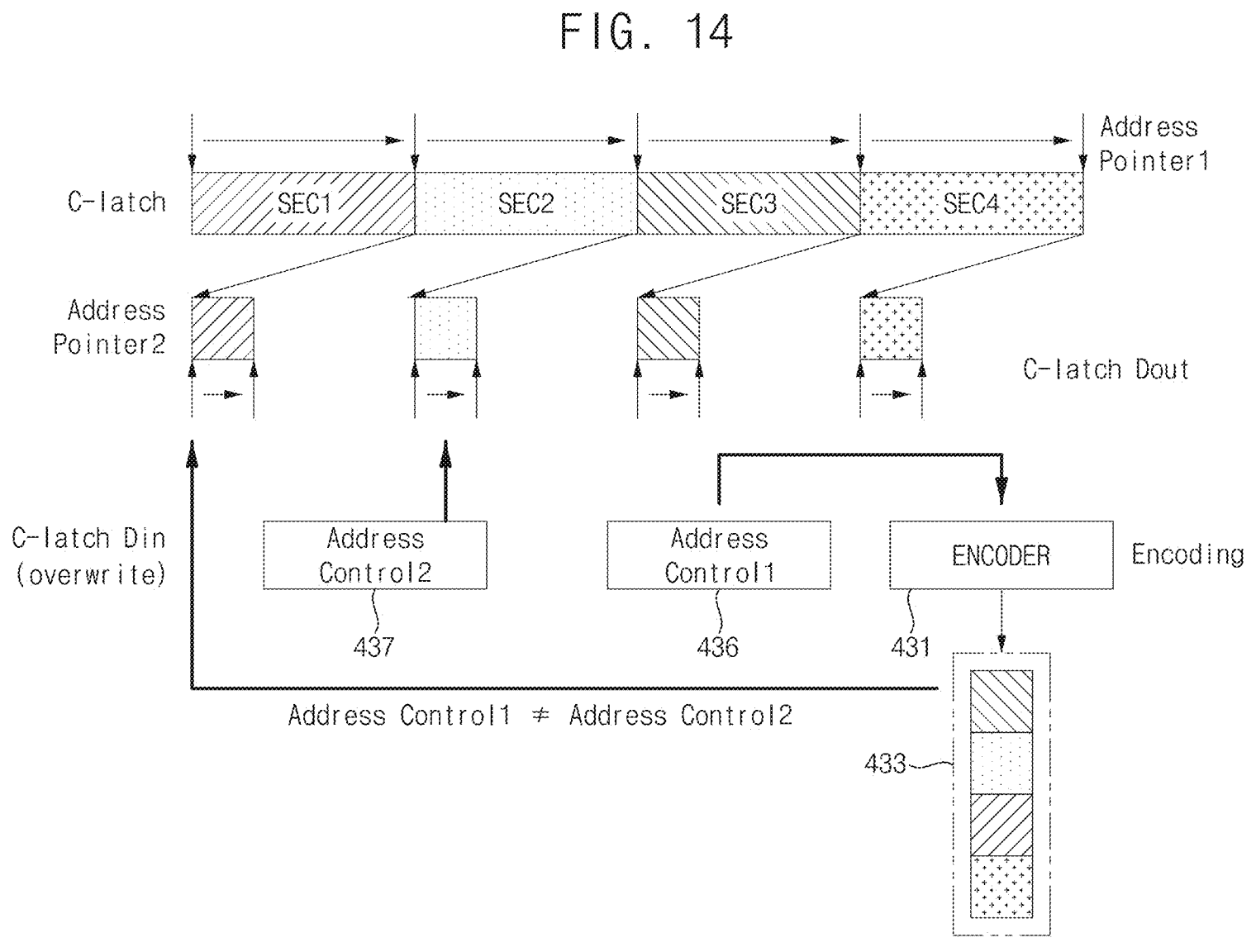

FIG. 14 is a diagram illustrating an example of address control of compressed data of the nonvolatile memory device.

Referring to FIG. 14, the first address control and the second address control may be different. Cache latch data of the first sector may be output Dout. In this case, first address control may include moving a first address pointer from a start point of a first sector to a last point of the first sector. Sector data SEC1 may be compressed using a compression/encoding window by the encoder 431. When the first sector data SEC1 is compressed, the output operation Dout and the compression operation may be stopped. Thereafter, the compressed data may be stored in a separate storage space, that is, the encoding buffer 433. Thereafter, the data accumulated in the encoding buffer 433 may be overwritten to the cache latch of the corresponding sector. In other words, data in a separate storage space may be reused. In this case, the second address control may include moving a second address pointer from a start point of the first sector to a point at which a predetermined amount (e.g., 1 KB) is added to the first sector.

The above-described processes may be performed repeatedly for the entire sectors. In this case, the separated address pointers may retrieve the previous last point and may repeat the process described above from the address separation. That is, the first address pointer may move from a start point of a second sector to a last point of the second sector (second 4 KB Dout). The second address pointer may move from a start point of the second sector to a point at which a predetermined amount is added to the second sector (second compressed data overwrite).

The address control illustrated in FIG. 14 may be different from the first address control and the second address control. The address control in an example implementation is not limited thereto, and the first address control and the second address control may be the same.

Figure 15:
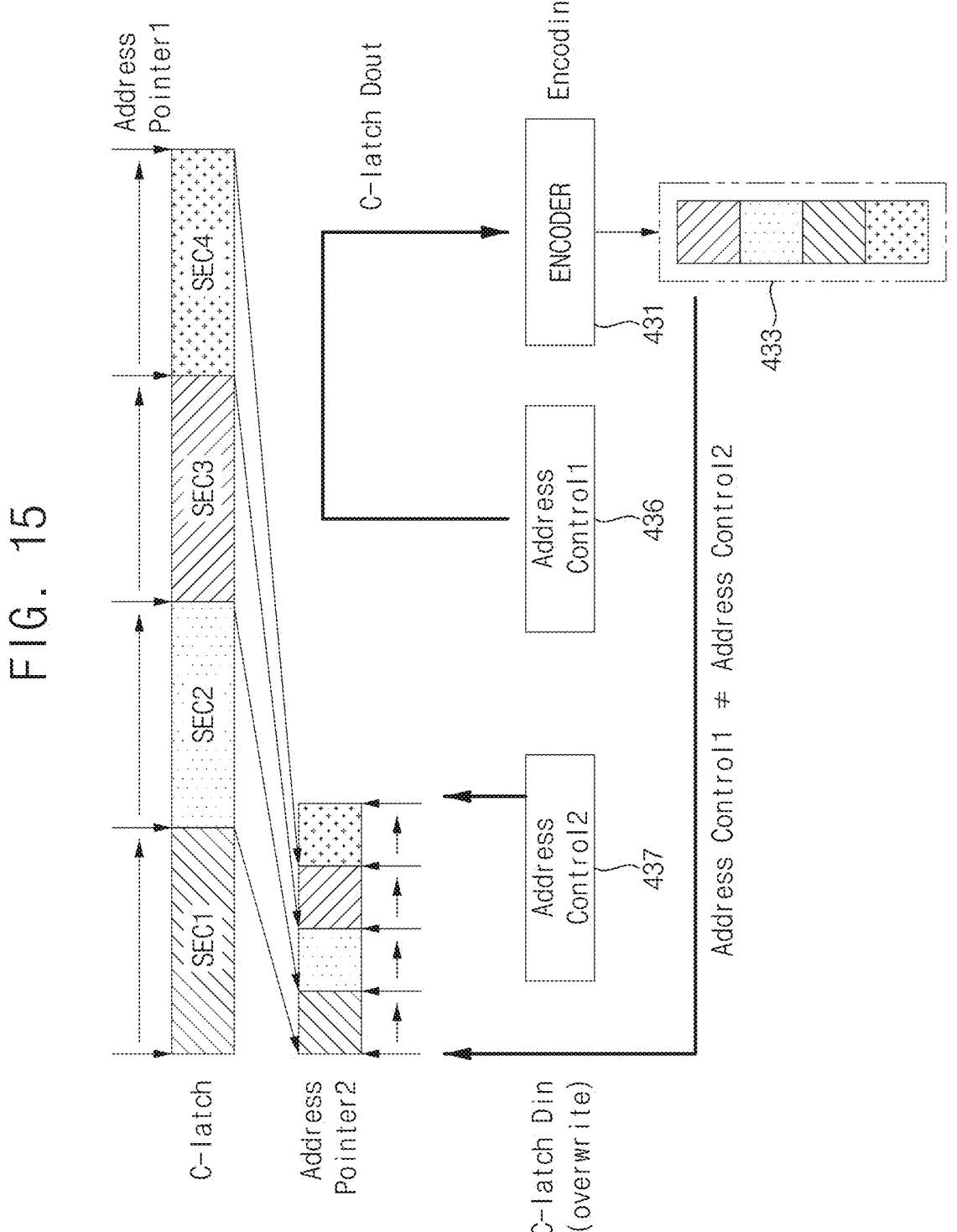
FIG. 15 is a diagram illustrating an example of address control of compressed data of the nonvolatile memory device.

FIG. 15 is a diagram illustrating an example of address control of compressed data of the nonvolatile memory device.

Referring to FIG. 15, the first address control and the second address control may be the same.

In the first sequence, cache latch data SEC1 of a first sector may be output (read) according to a first address controller 436. A first address pointer (Address pointer 1) may read data while moving from a start point of a first sector to a last point of the first sector.

In the second sequence, data output from the first sequence may be encoded in the encoder 431. For example, the encoder 431 may perform encoding operations by 16B window.

In the third sequence, the data (compressed data) encoded by the encoder 431 may be stored in a separate storage space, that is, the encoding buffer 433.

In the fourth sequence, when the read operation and the encoding operation for first sector data SEC1 are completed, the read operation may be stopped, and the encoding data stored in the encoding buffer 433 may be overwritten in the cache latch. In this case, it may not be necessary to store the data in a separate storage space. Accordingly, the encoding buffer 433 may be reused when performing outputting/encoding of subsequent sectors.

In an example implementation, a second address pointer (Address Pointer 2) may need to access the address for overwriting. Accordingly, while moving from a start point of the first sector to a predetermined point (e.g., 1st 4 KB+1 KB), the first address pointer (Address Pointer 1) may maintain a last point of the first sector.

In the subsequent sequence, the above-described first sequence to fourth sequence may be repeated in sequence in subsequent sectors. This repetition process may be performed in sequence for second sector data SEC2, third sector data SEC3, and fourth sector data SEC4. In this case, separated address pointers (address control pointers 1 and 2) may retrieve the previous last point and may repeat the above process starting from the address. That is, the first address pointer (address pointer 1) may move from the start point of the second sector to the end of the second sector (second sector read operation). The second address pointer (address pointer 2) may move from first sector+predetermined amount (e.g., 1 KB) to first sector+1 times the predetermined amount (e.g., 2 KB) point (second sector encoding data overwrite operation).

Figure 16:
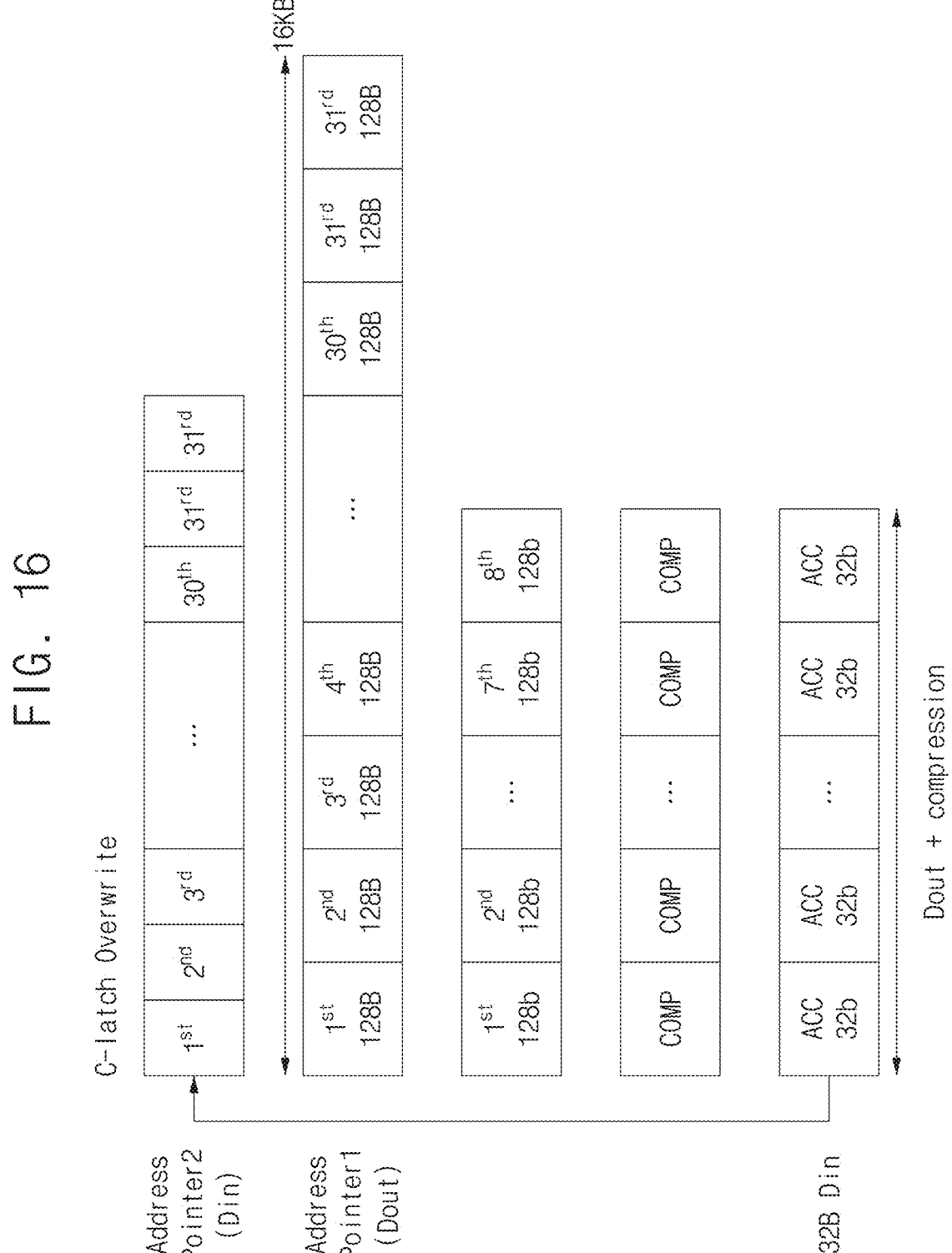
FIG. 16 is a diagram illustrating an example of independent operations of first address control for a read address for a cache latch and second address control for a write address for a cache latch in the nonvolatile memory device.

FIG. 16 is a diagram illustrating an example of independent operations of first address control for a read address for a cache latch and second address control for a write address for a cache latch in the nonvolatile memory device.

A read operation may be an M-byte output operation M-byte Dout, and a write operation may be an N-byte input operation N-byte Din. In FIG. 16, for ease of description, a 128-byte output operation 128-byte Dout and a 32-byte input operation 32-byte Din are illustrated.

The size of the page may be 16 KB (Kilo Byte), and the size of each sector may be 128B. Accordingly, a total of 32 sectors may be present in the cache latches. As a first address pointer moves from a start point of each sector to a last point, the output operation Dout may be performed. Each sector may be divided into eight pieces of 128b, and a compression operation may be performed on the divided pieces of 128b from the corresponding compression unit comp. Accordingly, 32b of compressed data may be stored in the corresponding storage space Acc. Eight pieces of 32B compressed data, that is, 32B compressed data, may be overwritten in the cache latches designated by the second address pointer (Din).

The compression time and the required active region may be in a trade-off relationship. By dividing the address controller into two controllers, when changing the clock generation circuit, the size of the unit compression/output sector may be adjusted to suit the target. For example, a triple level cell (TLC) product may be implemented as 128B Dout & 32B Din, and a quad level cell (QLC) product may be implemented as 64B Dout & 16B Din. QLC products may have a longer read time than that of TLC products, such that the compression time may be increased and the active region may be reduced.

Figure 17A:
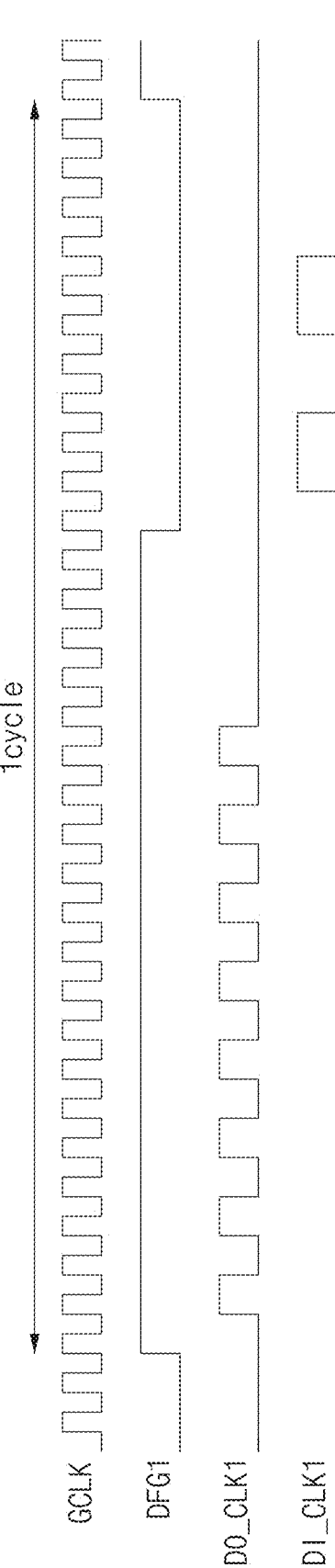
FIGS. 17A and 17B are timing diagrams illustrating examples of address control for compression operation in a TLC product and a QLC product, respectively.
Figure 17B:
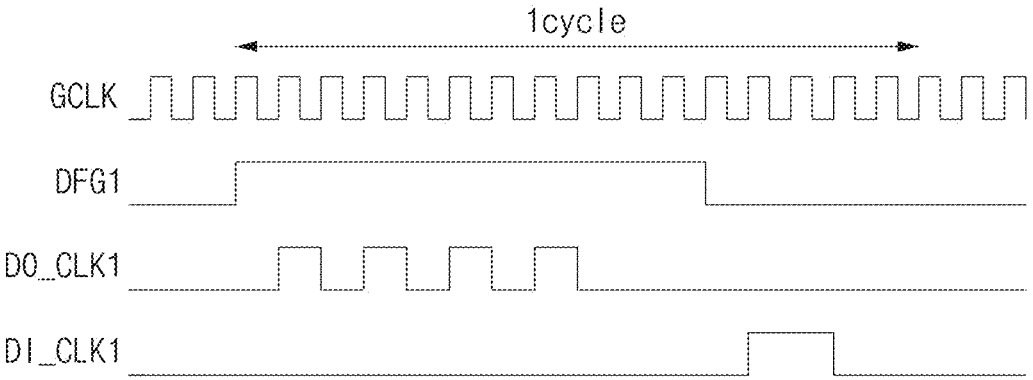

FIGS. 17A and 17B are timing diagrams illustrating examples of address control for compression operation in a TLC product and a QLC product, respectively.

Referring to FIG. 17A, in the TLC product, 128B sector data (e.g., soft decision data) is output and compressed based on the first local clock signal DO_CLK1 during the flag signal DFG1 having a logic high level, and 32B compressed data (e.g., the compressed soft decision data) is overwritten in the cache latches based on the second local clock signal DI_CLK1 during the flag signal DFG1 having a logic low level.

Referring to FIG. 17B, in the QLC product, 64B sector data (e.g., soft decision data) is output and compressed based on the first local clock signal DO_CLK1 during the flag signal DFG1 having a logic high level, and 16B compressed data (e.g., the compressed soft decision data) is overwritten in the cache latches based on the second local clock signal DI_CLK1 during the flag signal DFG1 having a logic low level.

Figure 18:
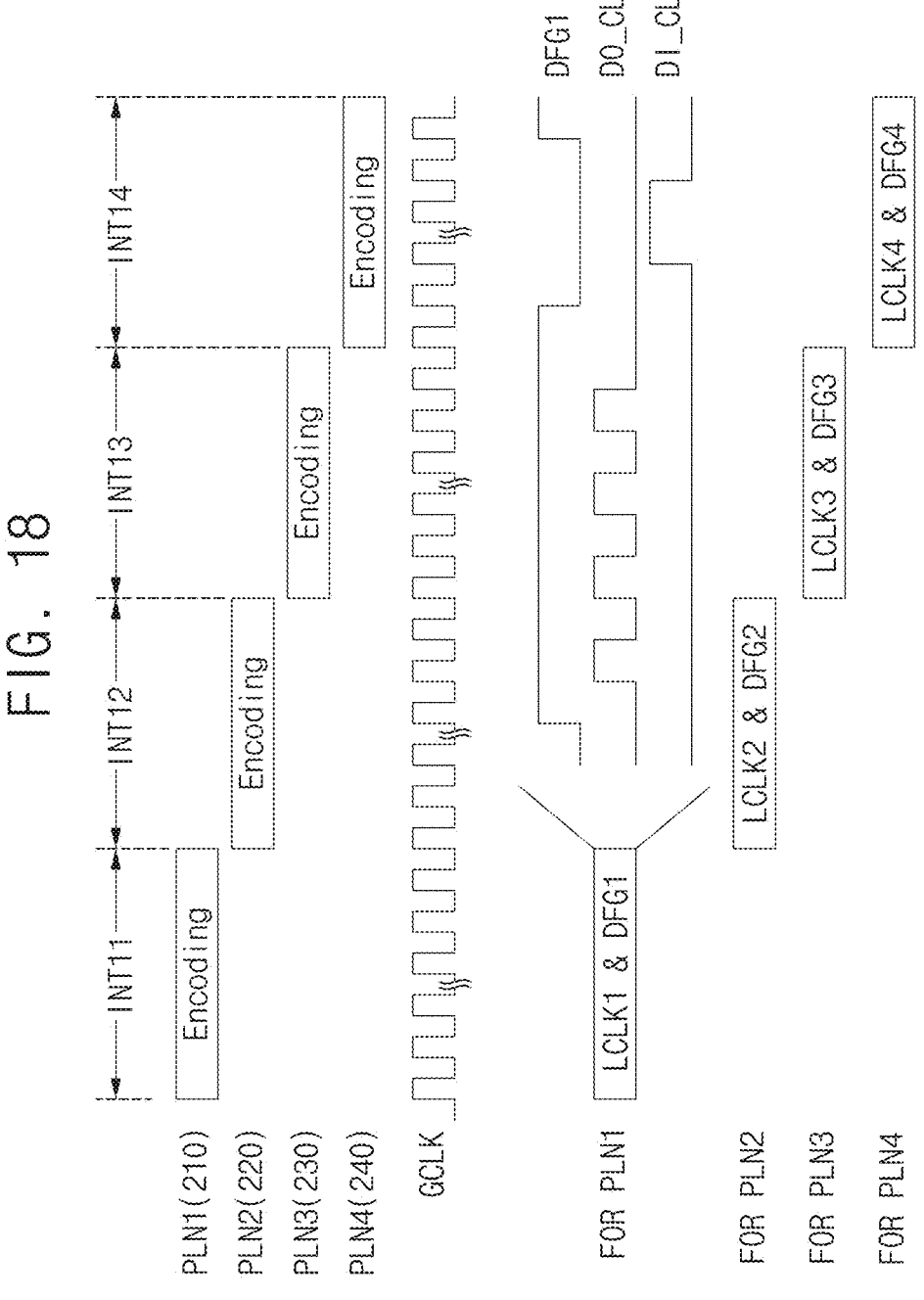
Figure 19:
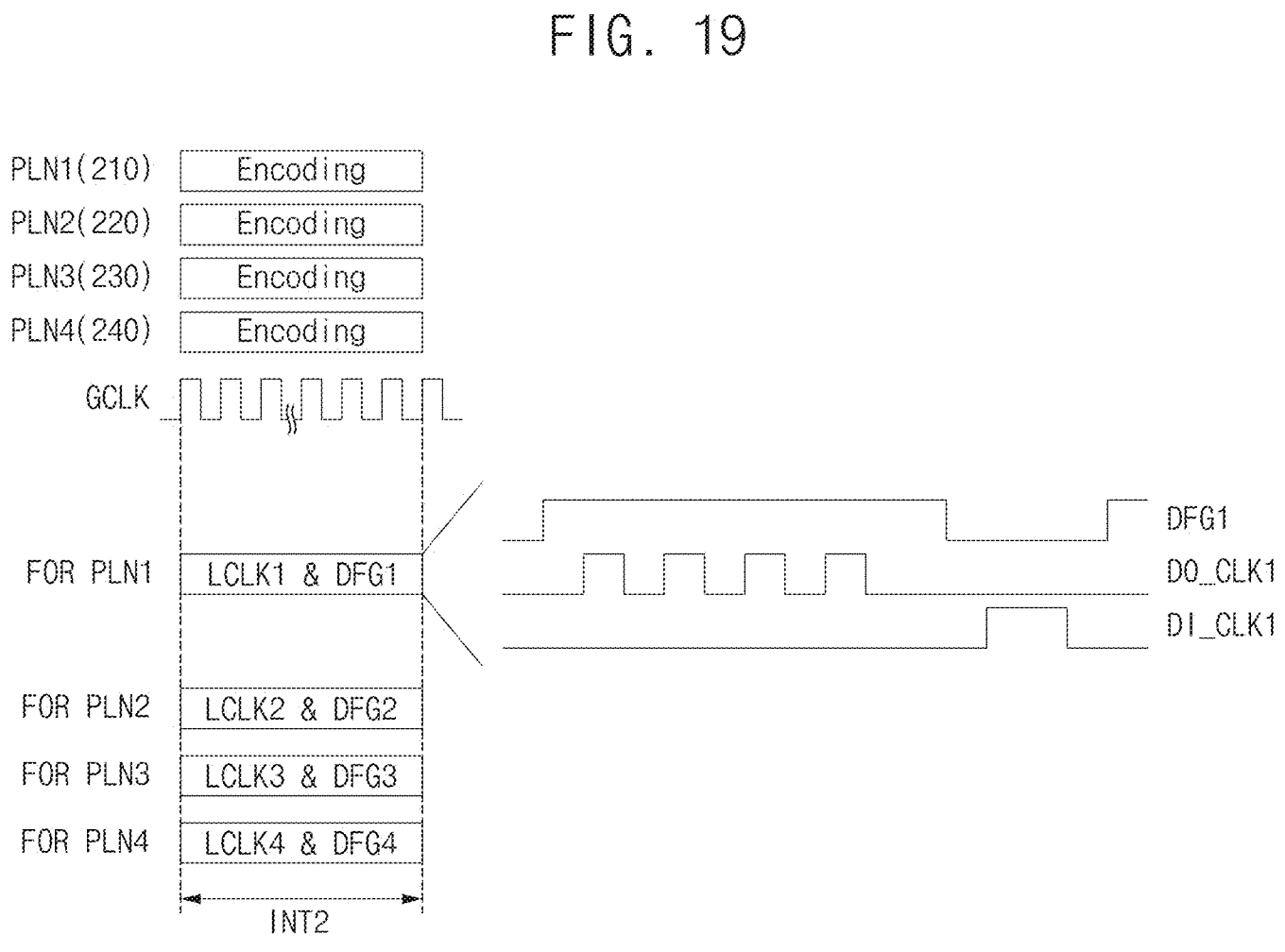
Figure 20:
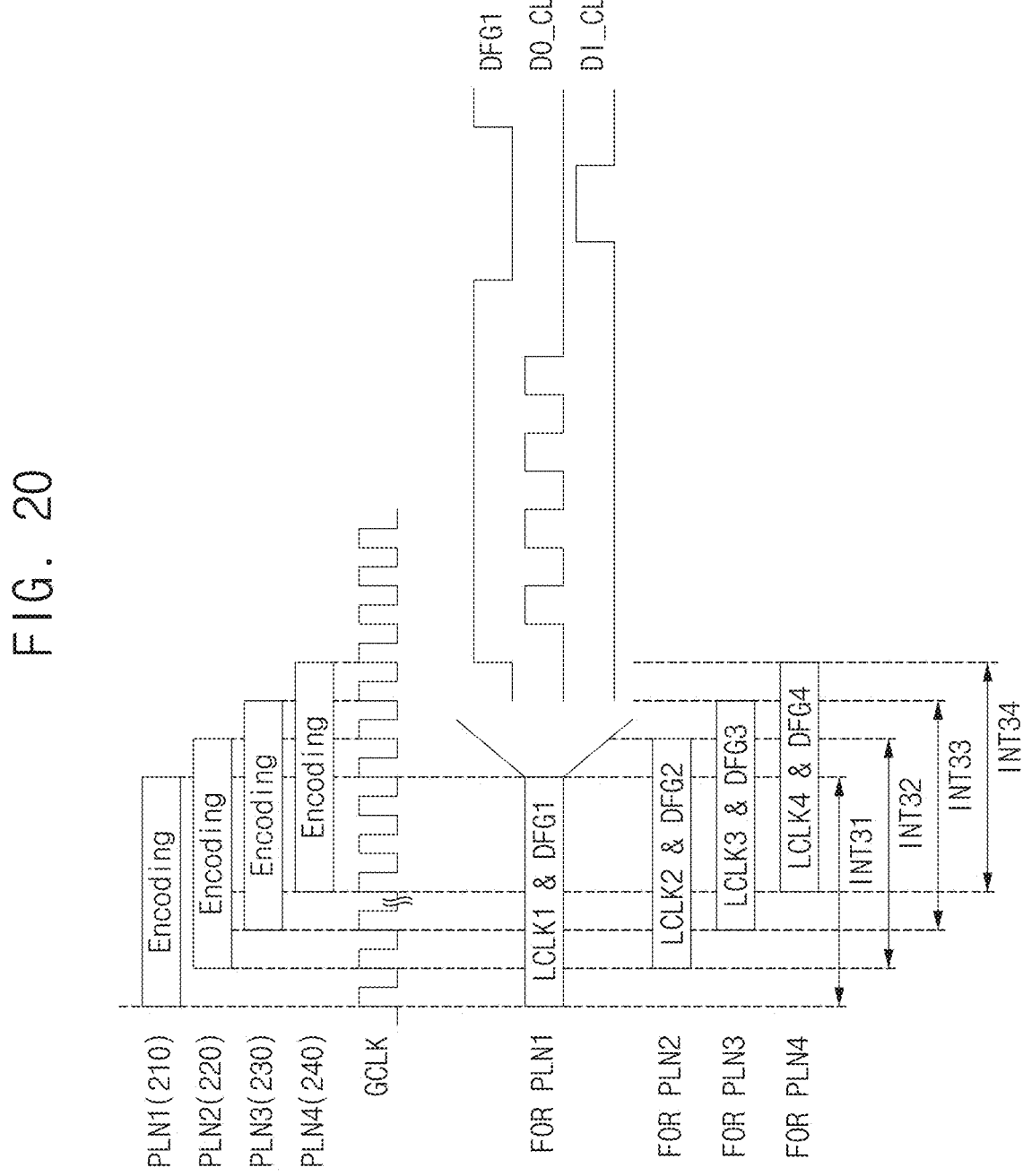

FIGS. 18, 19, and 20 illustrate examples that the local clock controllers generate local clock signals in parallel or independently with respect to the memory planes in the nonvolatile memory device of FIG. 3.

Referring to FIGS. 12A and 18, when the mode signal MS designates 1X operation, each of the local clock controllers 440a, 440b, 440c and 440d may generate respective ones of a local clock signal LCLK1 and a flag signal DFG1, a local clock signal LCLK2 and a flag signal DFG2, a local clock signal LCLK3 and a flag signal DFG3 and a local clock signal LCLK4 and a flag signal DFG4 in respective one of intervals (e.g., periods) INT11, INT12, INT13 and INT14 which do not overlap, and may provide the respective ones of the local clock signal LCLK1 and the flag signal DFG1, the local clock signal LCLK2 and the flag signal DFG2, the local clock signal LCLK3 and the flag signal DFG3 and the local clock signal LCLK4 and the flag signal DFG4 to respective one of the compression engines 430a, 430b, 430c and 430d. Each of the compression engines 430a, 430b, 430c and 430d, in respective one of the intervals INT11, INT12, INT13 and INT14, may perform the encoding operation by receiving a soft decision data of respective one of the memory planes 210, 220, 230 and 240 from cache latches of respective one of the page buffer circuits 410a, 410b, 410c and 410d, by compressing the received soft decision data and by overwriting the compressed soft decision data in the cache latches.

The local clock signal LCLK1 may include the first local clock signal DO_CLK1 and the second local clock signal DI_CLK1. The compression engine 430a receives the soft decision data and compresses the soft decision data based on the first local clock signal DO_CLK1 during the flag signal DFG1 having a logic high level, and overwrites the compressed soft decision data in a portion of the cache latches based on the second local clock signal DI_CLK1 during the flag signal DFG1 having a logic low level.

That is, the control circuit 450 may control the local clock controllers 440a, 440b, 440c and 440d such that each of the compression engines 430a, 430b, 430c and 430d performs the encoding operation sequentially.

Referring to FIGS. 12A and 19, when the mode signal MS designates 4X operation, each of the local clock controllers 440a, 440b, 440c and 440d may generate respective ones of the local clock signal LCLK1 and the flag signal DFG1, the local clock signal LCLK2 and the flag signal DFG2, the local clock signal LCLK3 and the flag signal DFG3 and the local clock signal LCLK4 and the flag signal DFG4 in parallel or concurrently in an interval INT21, and may provide the respective ones of the local clock signal LCLK1 and the flag signal DFG1, the local clock signal LCLK2 and the flag signal DFG2, the local clock signal LCLK3 and the flag signal DFG3 and the local clock signal LCLK4 and the flag signal DFG4 to respective one of the compression engines 430a, 430b, 430c and 430d. Each of the compression engines 430a, 430b, 430c and 430d, in parallel or concurrently in the interval INT21, may perform the encoding operation by receiving a soft decision data of respective one of the memory planes 210, 220, 230 and 240 from cache latches of respective one of the page buffer circuits 410a, 410b, 410c and 410d, by compressing the received soft decision data and by overwriting the compressed soft decision data in the cache latches.

That is, the control circuit 450 may control the local clock controllers 440a, 440b, 440c and 440d such that each of the compression engines 430a, 430b, 430c and 430d performs the encoding operation in parallel.

Referring to FIGS. 12A and 20, when the mode signal MS designates a plane independent read (PIR) operation, each of the local clock controllers 440a, 440b, 440c and 440d may generate respective ones of the local clock signal LCLK1 and the flag signal DFG1, the local clock signal LCLK2 and the flag signal DFG2, the local clock signal LCLK3 and the flag signal DFG3 and the local clock signal LCLK4 and the flag signal DFG4 in respective one of intervals INT31, INT32, INT33 and INT34 which partially overlap, and may provide the respective ones of the local clock signal LCLK1 and the flag signal DFG1, the local clock signal LCLK2 and the flag signal DFG2, the local clock signal LCLK3 and the flag signal DFG3 and the local clock signal LCLK4 and the flag signal DFG4 to respective one of the compression engines 430a, 430b, 430c and 430d. Each of the compression engines 430a, 430b, 430c and 430d, in respective one of the intervals INT11, INT12, INT13 and INT14, may perform the encoding operation by receiving a soft decision data of respective one of the memory planes 210, 220, 230 and 240 from cache latches of respective one of the page buffer circuits 410a, 410b, 410c and 410d, by compressing the received soft decision data and by overwriting the compressed soft decision data in the cache latches.

That is, the control circuit 450 may control the local clock controllers 440a, 440b, 440c and 440d such that each of the compression engines 430a, 430b, 430c and 430d performs the encoding operation partially in parallel.

Figure 21:
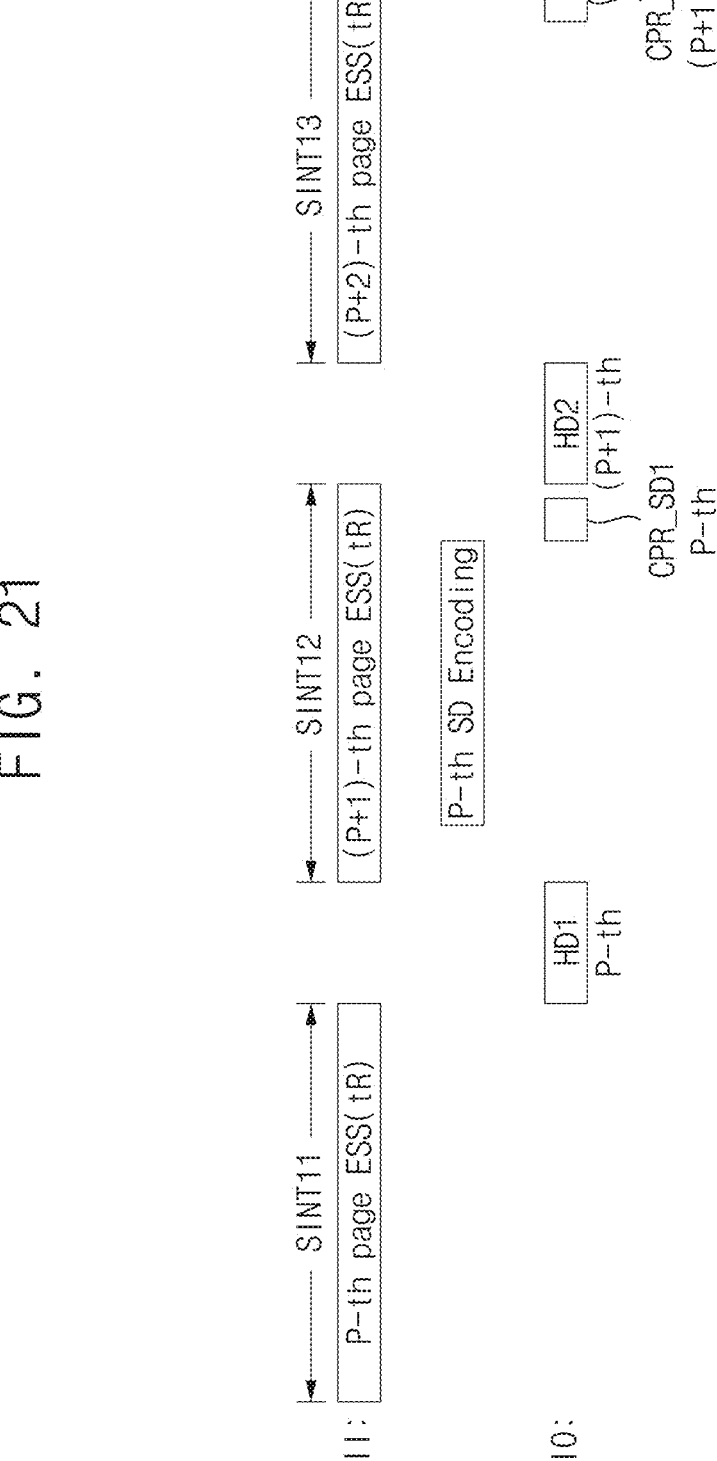
FIG. 21 illustrates a read operation and an encoding operation on an example of one memory plane in the nonvolatile memory device of FIG. 3.

FIG. 21 illustrates a read operation and an encoding operation on an example of one memory plane in the nonvolatile memory device of FIG. 3.

Referring to FIGS. 12A and 21, the control circuit 450 may perform a soft decision read operation ESS(tR) on data stored in a P-th page of the memory plane 210 during a first sensing period SINT11 and store a soft decision data in data latches of the page buffer circuit 410a. The control circuit 450 may perform a hard decision read operation on the P-th page before the first sensing period SINT11. When the first sensing period SINT11 ends, the page buffer circuit 410a outputs a hard decision data HD1 of the P-th page to an outside through the data I/O circuit 420 (which is represented as 'IO') while the soft decision data of the P-th page is stored in cache latches of the page buffer circuit 410a.

While the control circuit 450 performs a soft decision read operation ESS(tR) on data stored in a (P+1)-th page of the memory plane 210 during a second sensing period SINT12 and stores a soft decision data in data latches of the page buffer circuit 410a, the compression engine 430a may perform an encoding operation (P-th SD encoding) by receiving the soft decision data of the P-th page from the cache latches, compressing the soft decision data and overwriting a compressed soft decision data CPR_SD1 in the cache latches and the page buffer circuit 410a outputs compressed soft decision data CPR_SD1 to an outside through the data I/O circuit 420. The control circuit 450 may perform a hard decision read operation on the (P+1)-th page before the second sensing period SINT12. When the second sensing period SINT12 ends, the page buffer circuit 410a outputs a hard decision data HD2 of the (P+1)-th page to an outside through the data I/O circuit 420.

While the control circuit 450 performs a soft decision read operation ESS(tR) on data stored in a (P+2)-th page of the memory plane 210 during a third sensing period SINT13 and stores a soft decision data in data latches of the page buffer circuit 410a, the compression engine 430a may perform an encoding operation ((P+1)-th SD encoding) by receiving the soft decision data of the (P+1)-th page from the cache latches, compressing the soft decision data and overwriting a compressed soft decision data CPR_SD2 in the cache latches and the page buffer circuit 410a outputs compressed soft decision data CPR_SD2 to an outside through the data I/O circuit 420.

FIG. 22 illustrates a read operation and an encoding operation on two example memory planes in the nonvolatile memory device of FIG. 3.

Referring to FIGS. 3, 12A and 22, the control circuit 450 may perform a soft decision read operation ESS(tR) on data stored in a P-th page of the memory plane 210 during a first sensing period SINT21 and store a first soft decision data in data latches of the page buffer circuit 410a. At this time, a first hard decision data HD1 of the P-th page, which is sensed from the P-th page of the memory plane 210 before the first sensing period SINT21, is dumped to the data I/O circuit 420 from the cache latches of the page buffer circuit 410a. When the first sensing period SINT11 ends, the data I/O circuit 420 outputs the first hard decision data HD1 to an outside while the first soft decision data of the P-th page is stored in the cache latches of the page buffer circuit 410a.

While the control circuit 450 performs a soft decision read operation ESS(tR) on data stored in a (P+1)-th page of the memory plane 210 during a second sensing period SINT22 after the first sensing period SINT21 and stores a second soft decision data in the data latches of the page buffer circuit 410a, the compression engine 430a may perform an encoding operation (P-th SD encoding) by receiving the first soft decision data of the P-th page from the cache latches, compressing the first soft decision data and overwriting a compressed first soft decision data CPR_SD1 in the cache latches and the page buffer circuit 410a outputs compressed first soft decision data CPR_SD1 to an outside through the data I/O circuit 420. When the second sensing period SINT22 ends, the page buffer circuit 410a outputs a second hard decision data HD2 sensed from the (P+1)-th page to an outside through the data I/O circuit 420.

The control circuit 450 may perform a soft decision read operation ESS(tR) on data stored in a Q-th (Q being a natural number) page of the memory plane 220 during a third sensing period SINT31 partially overlapping with the first sensing period SINT21 and store a third soft decision data in data latches of the page buffer circuit 410b. At this time, a third hard decision data HD3 of the Q-th page, which is sensed from the Q-th page before the third sensing period SINT23, is dumped to the data I/O circuit 420 from cache latches of the page buffer circuit 410b. When the third sensing period SINT23 ends, the data I/O circuit 420 outputs the third hard decision data HD3 to an outside while the third soft decision data of the Q-th page is stored in the cache latches of the page buffer circuit 410b.

While the control circuit 450 performs a soft decision read operation ESS(tR) on data stored in a (Q+1)-th page of the memory plane 220 during a fourth sensing period SINT24 partially overlapping with the second sensing period SINT22 and stores a fourth soft decision data in the data latches of the page buffer circuit 410b, the compression engine 430b may perform an encoding operation (Q-th SD encoding) by receiving the third soft decision data of the Q-th page from the cache latches, compressing the third soft decision data and overwriting a compressed third soft decision data CPR_SD3 in the cache latches and the page buffer circuit 410b outputs compressed third soft decision data CPR_SD3 to an outside through the data I/O circuit 420. When the fourth sensing period SINT24 ends, the page buffer circuit 410b outputs a fourth hard decision data HD4, which is sensed from the (Q+1)-th page before the fourth sensing period SINT24, to an outside through the data I/O circuit 420.

The compression engine 430a performs an encoding operation ((P+1)-th SD encoding) on the second soft decision data of the (P+1)-th page of the memory plane 210, the compression engine 430b performs an encoding operation ((Q+1)-th SD encoding) on a fourth soft decision data of (Q+1)-th page of the memory plane 220, and the compressed second soft decision data CPR_SD2 of the (P+1)-th page and the compressed fourth soft decision data CPR_SD4 of the (Q+1)-th page are sequentially output to an outside through the data I/O circuit 420.

Figure 23:
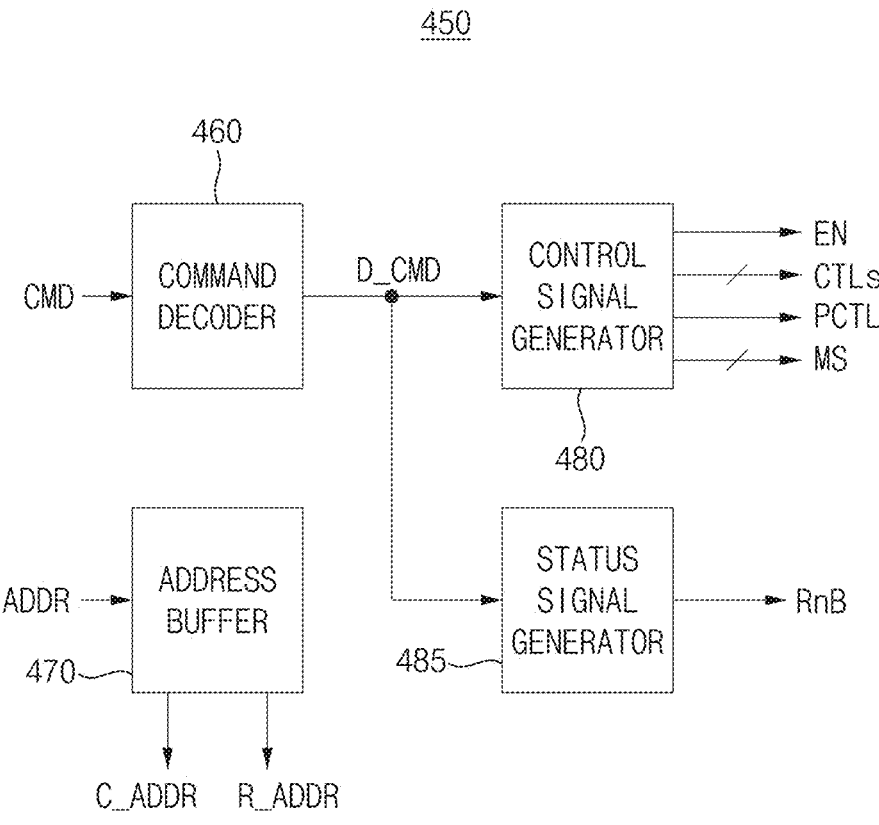
FIG. 23 is a block diagram illustrating an example of the control circuit in the nonvolatile memory device of FIG. 3.

FIG. 23 is a block diagram illustrating an example of the control circuit in the nonvolatile memory device of FIG. 3.

Referring to FIG. 23, the control circuit 450 may include a command decoder 460, an address buffer 470, a control signal generator 480 and a status signal generator 485.

The command decoder 460 may decode the command CMD and provide a decoded command D_CMD to the control signal generator 480 and the status signal generator 485.

The address buffer 470 may receive the address signal ADDR, provide the row address R_ADDR to the address decoder 300 and provide the column address C_ADDR to the data I/O circuit 420.

The control signal generator 480 may receive the decoded command D_CMD, may generate the control signals CTLs, the enable signals EN and the mode signal MS based on an operation directed by the decoded command D_CMD, may provide the control signals CTLs and the enable signals ENs to the voltage generator 500 may provide the enable signal EN to the oscillator 425 and may provide the mode signal MS to the local clock controllers 440a, 440b, 440c and 440d.

The control signal generator 480 may generate the page buffer control signal PCTL based on an operation directed by the decoded command D_CMD, may provide the page buffer control signal PCTL to the page buffer circuits 410*a*, 410*b*, 410*c* and 410*d*.

The status signal generator 485 may receive the decoded command D_CMD, may monitor an operation directed by the decoded command D_CMD and may transition the status signal RnB one of a ready state or a busy state based on whether the operation directed by the decoded command D_CMD is completed.

Figure 24:
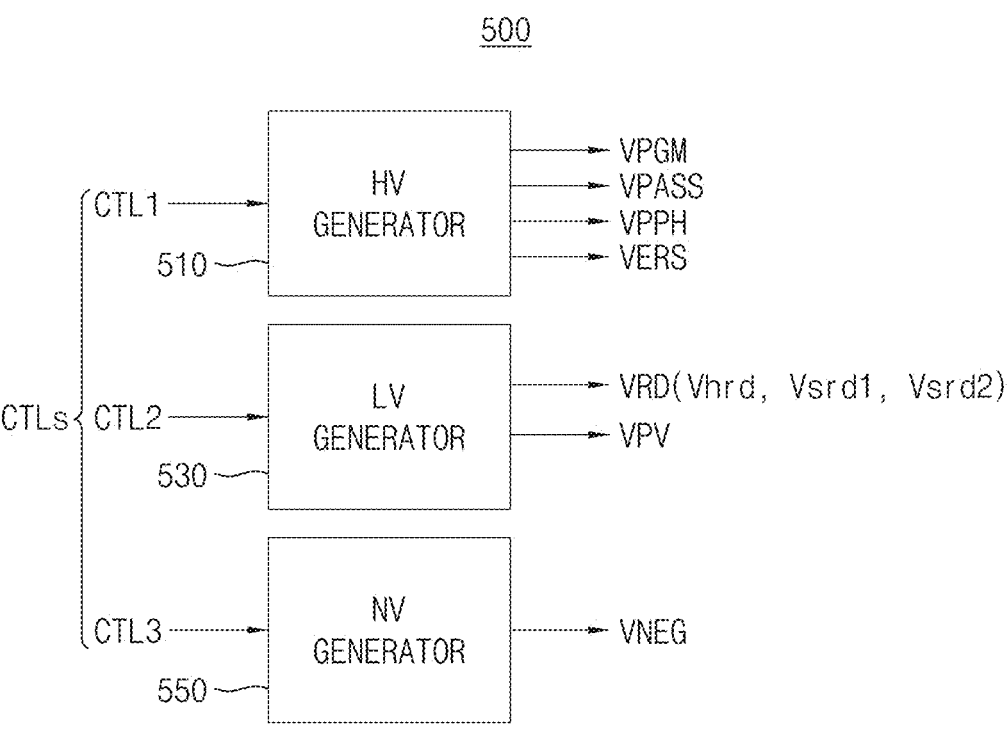
FIG. 24 is a block diagram illustrating an example of the voltage generator in the nonvolatile memory device of FIG. 3.

FIG. 24 is a block diagram illustrating an example of the voltage generator in the nonvolatile memory device of FIG. 3.

Referring to FIG. 24, the voltage generator 500 may include a high voltage HV generator 510 and a low voltage LV generator 530. The voltage generator 500 may further include a negative voltage NV generator 550.

The high voltage generator 510 may be referred to as a first voltage generator, the low voltage generator 530 may be referred to as a second voltage generator and the negative voltage generator 550 may be referred to as a third voltage generator.

The high voltage generator 510 may generate a program voltage PGM, a pass voltage VPASS, a high voltage VPPH, and an erase voltage VERS according to operations directed by the command CMD, in response to a first control signal CTL1.

The program voltage PGM is applied to the selected word-line, the pass voltage VPASS may be applied to the unselected word-lines, the erase voltage VERS may be applied to a channel of cell strings included in a selected memory block. The high voltage VPPH may be applied to each gate of pass transistors coupled to word-lines, a string selection line and a ground selection line. The first control signal CTL1 may include a plurality of bits which indicate the operations directed by the decoded command D_CMD.

The low voltage generator 530 may generate a program verification voltage VPV and a read voltage VRD according to operations directed by the command CMD, in response to a second control signal CTL2. The read voltage VRD may include the hard decision read voltage Vhrd and the soft decision read voltages Vsrd1 and Vsrd2. The program verification voltage VPV and the read voltage VRD may be applied to the selected word-line according to operation of the nonvolatile memory device 100. The second control signal CTL2 may include a plurality of bits which indicate the operations directed by the decode command D_CMD.

The negative voltage generator 550 may generate a negative voltage VNEG which has a negative level according to operations directed by the command CMD, in response to a third control signal CTL3. The third control signal CTL3 may include a plurality of bits which indicate the operations directed by the decoded command D_CMD. The negative voltage VNEG may be applied to a selected word-line and unselected word-lines during a program recovery period and may be applied to the unselected word-lines during a bit-line set-up period.

Figure 25:
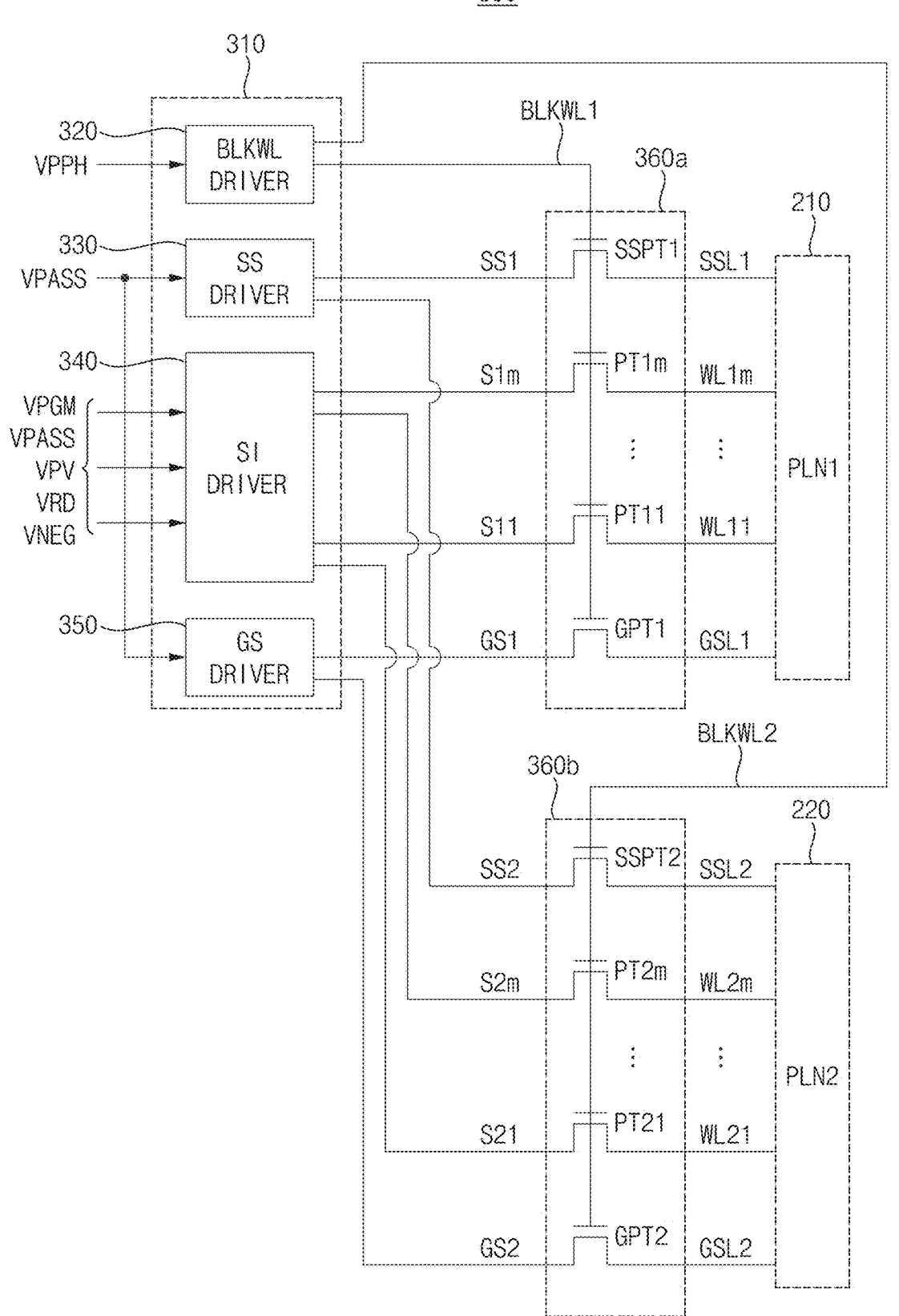
FIG. 25 is a block diagram illustrating an example of the address decoder in the nonvolatile memory device of FIG. 3.

FIG. 25 is a block diagram illustrating an example of the address decoder in the nonvolatile memory device of FIG. 3.

Referring to FIG. 25, the address decoder 300 may include a driver circuit 310 and pass transistor circuits 360*a* and 360*b*.

The driver circuit 310 may transfer voltages provided from the voltage generator 500 to the memory cell array 200 in response to a block address. The driver circuit 310 may include a block selection driver BWLWL DRIVER 320, a string selectin driver SS DRIVER 330, a driving line driver SI DRIVER 340 and a ground selection driver GS DRIVER 350.

The block selection driver 320 may supply a high voltage VPPH from the voltage generator 500 to the pass transistor circuits 360*a* and 360*b* in response to the block address. The block selection driver 320 may supply the high voltage VPPH to a block word-line BLKWL1 coupled to gates of a plurality of pass transistors GPT1, PT11~PT1*m* and SSPT1 in the pass transistor circuit 360*a* and may supply the high voltage VPPH to a block word-line BLKWL2 coupled to gates of a plurality of pass transistors GPT2, PT21~PT2*m* and SSPT2 in the pass transistor circuit 360*b*. The block selection driver 320 may control the application of various voltages such as a pass voltage, a program voltage, a read voltage to the memory cell array 200.

The pass transistors GPT1, PT11~PT1*m* and SSPT1 may be coupled to the memory plane 210 through a ground selection line GSL1, a plurality of word-lines WL11~WL1*m* and a string selection line SSL1 and the pass transistors GPT2, PT21~PT2*m* and SSPT2 may be coupled to the memory plane 220 through a ground selection line GSL2, a plurality of word-lines WL21~WL2*m* and a string selection line SSL2.

The string selection driver 330 may supply voltage (for example, pass voltage VPASS) from the voltage generator 500 to the string selection lines SSL1 and SSL2 through the pass transistors SSPT1 and SSPT2 as string selection signals SS1 and SS2. During a program operation, the string selection driver 330 may supply the selection signals SS1 and SS2 so as to turn on all string selection transistors in a selected memory block.

The driving line driver 340 may supply the program voltage VPGM, the pass voltage VPASS, the verification voltage VPV, the read voltage VRD and the negative voltage VNEG from the voltage generator 500 to the word-lines WL11~WL1*m* through driving lines S11~S1*m* and the pass transistors PT11~PT1*m* and may supply the program voltage VPGM, the pass voltage VPASS, the verification voltage VPV, the read voltage VRD and the negative voltage VNEG to the word-lines WL21~WL2*m* through driving lines S21~S2*m* and the pass transistors PT21~PT2*m*.

The ground selection driver 350 may supply voltage (for example, pass voltage VPASS) from the voltage generator 500 to the ground selection lines GSL1 and GSL2 through the pass transistors GPT1 and GPT2 as ground selection signal GS1 and GS2.

The pass transistors GPT1, PT11~PT1*m* and SSPT1 are configured such that the ground selection line GSL1, the word-lines WL11~WL1*m* and the string selection line SSL1 are electrically connected to corresponding driving lines, in response to activation of the high voltage VPPH on the block word-line BLKWL2. In some implementations, each of the pass transistors GPT1, PT11~PT1*m*, SSPT1 may include a high voltage transistor capable of enduring high-voltage. The pass transistors GPT2, PT21~PT2*m* and SSPT2 are configured such that the ground selection line GSL2, the word-lines WL21~WL2*m* and the string selection line SSL2 are electrically connected to corresponding driving lines, in response to activation of the high voltage VPPH on the block word-line BLKWL2. In some implementations, each of the pass transistors GPT2, PT21~PT2*m*, SSPT2 may include a high voltage transistor capable of enduring high-voltage.

Figure 26:
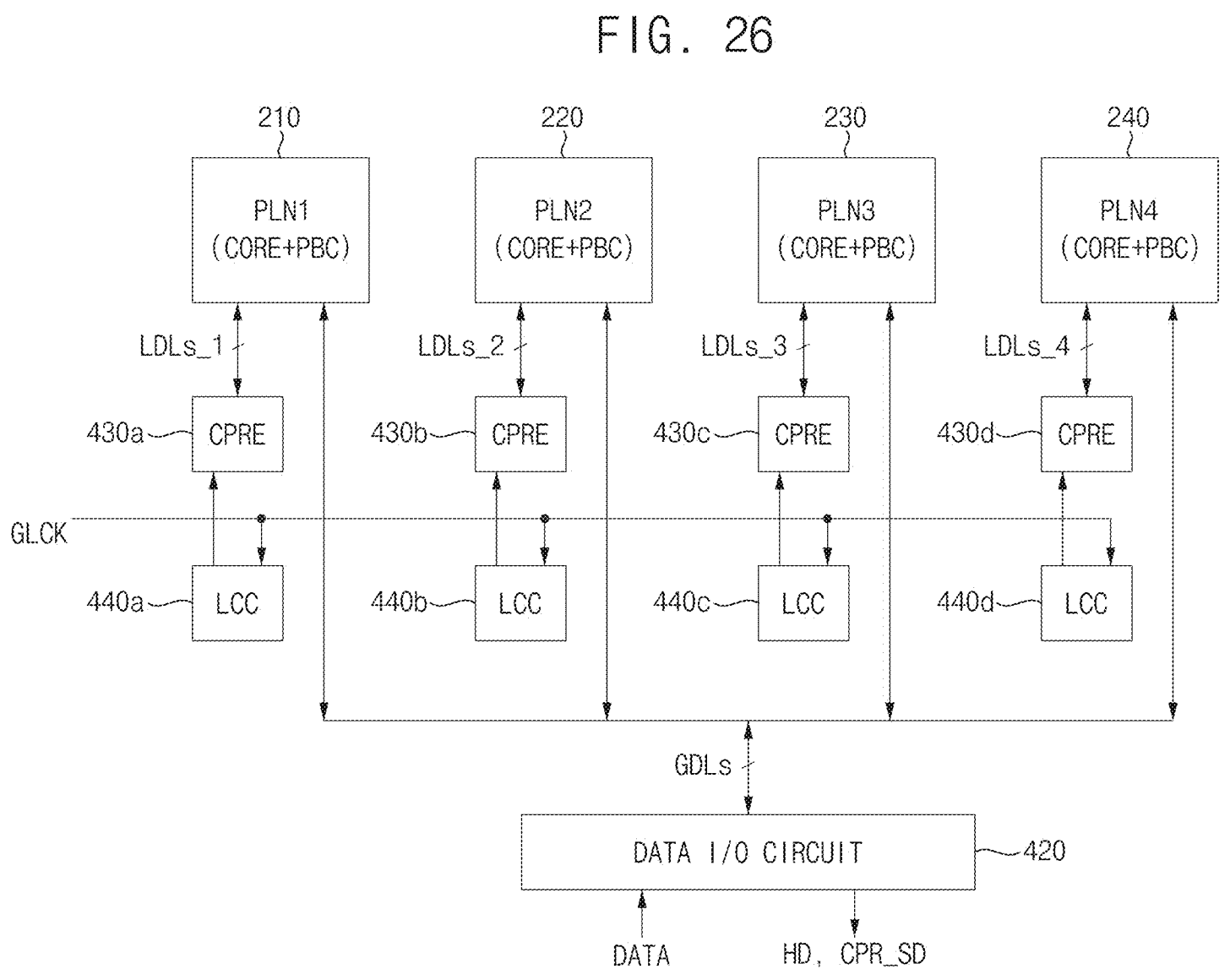

FIG. 26 is a diagram illustrating an example of a connection relationship between the compression engine and the memory planes.

Referring to FIG. 26, each of the compression engines 430a, 430b, 430c and 430d may be disposed on respective one of the memory planes 210, 220, 230 and 240, each including core and page buffer circuit PBC.

Each of the local clock controllers 440a, 440b, 440c and 440d may be disposed on respective one of the compression engines 430a, 430b, 430c and 430d.

Each of the compression engines 430a, 430b, 430c and 430d may be connected to respective one of the page buffer circuits through respective one of the local data lines LDLs_1, LDLs_2, LDLs_3 and LDLs_4, and the plurality of page buffer circuits may be connected to the data I/O circuit 420 through the global data lines GDLs separated from the local data lines LDLs_1, LDLs_2, LDLs_3 and LDLs_4.

Each of the local clock controllers 440a, 440b, 440c and 440d may control respective one of the compression engines 430a, 430b, 430c and 430d based on the global clock signal GCLK.

Therefore, each of the compression engines 430a, 430b, 430c and 430d may perform the encoding operation on a soft decision data sensed from respective one of the memory planes 210, 220, 230 and 240 in parallel or independently. In addition, the nonvolatile memory device 100 may perform output operation to output compressed soft decision data of a P-th page of a memory plane as a background operation of a sensing operation to sense soft decision data of (P+1)-th page of the memory plane.

FIG. 27 is a table illustrating an example of compression operation which the nonvolatile memory device of FIG. 3 performs in parallel with output operation to output a compressed soft decision data to an outside.

In FIG. 27, Dout represents an output operation to output a compressed soft decision data and comp represents a compression operation performed in at least one of the compression engines 430a, 430b, 430c and 430d.

In FIG. 27, when the nonvolatile memory device 100 includes first through fourth memory planes 210, 220, 230 and 240, one (×1), two (×2), or three (×3) of the compression engines 430a, 430b, 430c and 430d may perform the compression operation in parallel (e.g., concurrently) while the data I/O circuit 420 outputs the compressed soft decision data.

That is, the control circuit 450 may control the local clock controllers 440a, 440b, 440c and 440d such that one of the page buffer circuits 410a, 410b, 410c and 410d performs the output operation and one of the compression engines 430a, 430b, 430c and 430d performs the encoding operation. In addition, the control circuit 450 may control the local clock controllers 440a, 440b, 440c and 440d such that one of the page buffer circuits 410a, 410b, 410c and 410d performs the output operation and two of the compression engines 430a, 430b, 430c and 430d performs the encoding operation in parallel. In addition, the control circuit 450 may control the local clock controllers 440a, 440b, 440c and 440d such that one of the page buffer circuits 410a, 410b, 410c and 410d performs the output operation and three of the compression engines 430a, 430b, 430c and 430d performs the encoding operation in parallel.

Therefore, the nonvolatile memory device separates a plurality of local data lines which connect page buffer circuits to compression engines, from global data lines which connect the page buffer circuits to a data I/O circuit. Therefore, the nonvolatile memory device may enhance performance by compressing soft decision data sensed from each of the plurality of memory planes in parallel and by performing output operation to output compressed soft decision data of the P-th page of a memory plane as a background operation of a sensing operation to sense soft decision data of (P+1)-th page of the memory plane to decrease timing interval for occupying channel.

Figure 28:
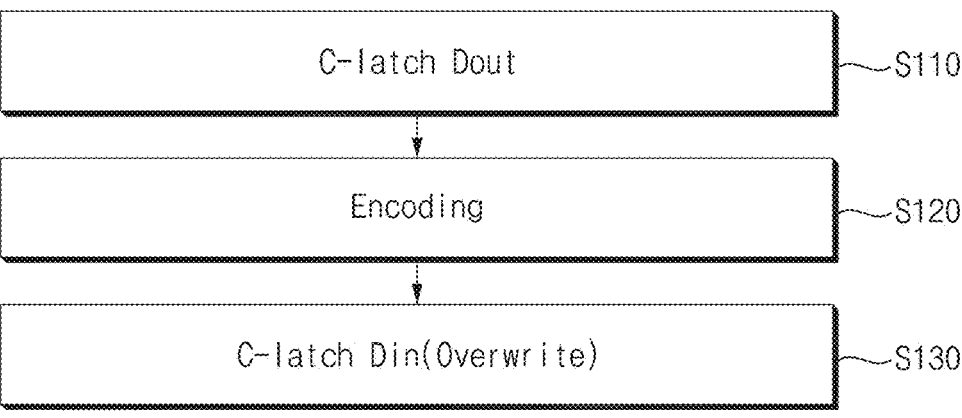
FIG. 28 is a flowchart illustrating example operation of the nonvolatile memory device.

FIG. 28 is a flowchart illustrating an example operation of the nonvolatile memory device.

Referring to FIGS. 1 to 28, the nonvolatile memory device 100 may perform cache write and read operations as below. Soft decision data may be output from a cache latch under first address control (operation S110). Soft decision data may be compressed according to a compression ratio by an encoder (operation S120). Compressed soft decision data may be overwritten in the cache latch under second address control (operation S130).

Figure 29:
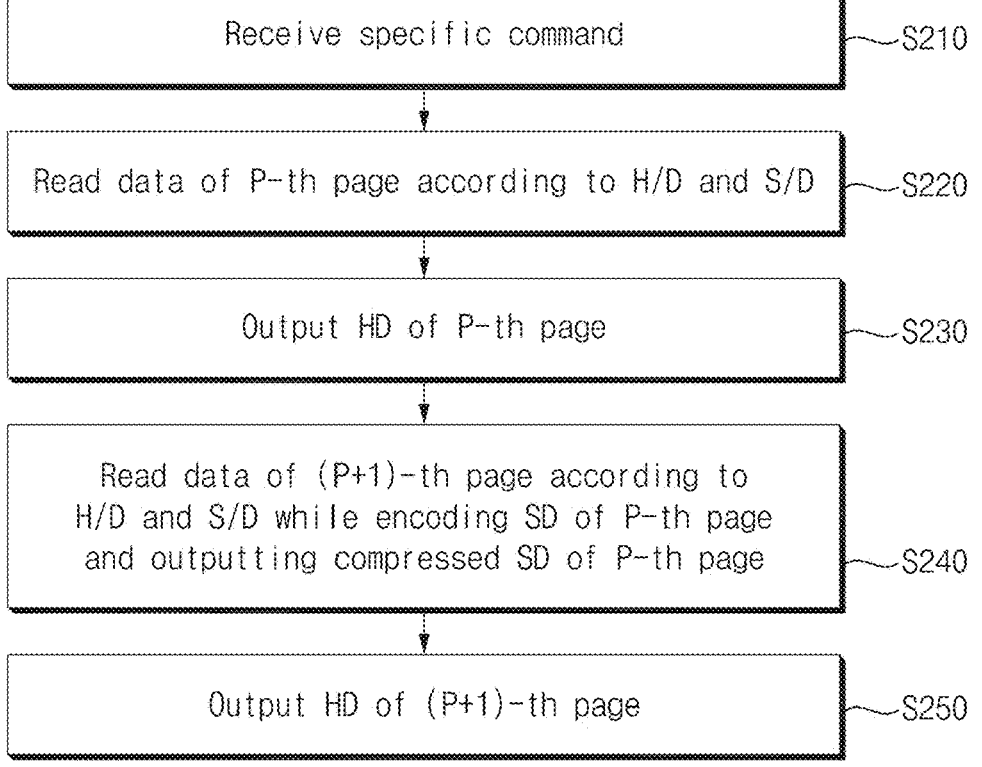
FIG. 29 is a flowchart illustrating an example operation of the nonvolatile memory device.

FIG. 29 is a flowchart illustrating an example operation of the nonvolatile memory device.

Referring to FIGS. 1 to 27 and 29, a data output operation of the nonvolatile memory device 100 may be performed as below. The nonvolatile memory device 100 may receive a special command from an external device (e.g., the memory controller 50) (operation S210). Here, the special command may be configured to indicate a reliability read operation. The nonvolatile memory device 100 may read data using a hard decision method and may read data using a soft decision method in response to a special command (operation S220). The nonvolatile memory device 100 may output hard decision data of P-th page to the external device (operation S230).

While the nonvolatile memory device 100 reads data from a (P+1)-th page of a memory plane by the hard decision method and by soft decision method, the nonvolatile memory device 100 may encoding the soft decision data SD of P-th page and output the compressed soft decision data of P-th page to the external device (operation S240). The nonvolatile memory device 100 may output hard decision data HD of the (P+1)th to the external device (operation S250).

Figure 30:
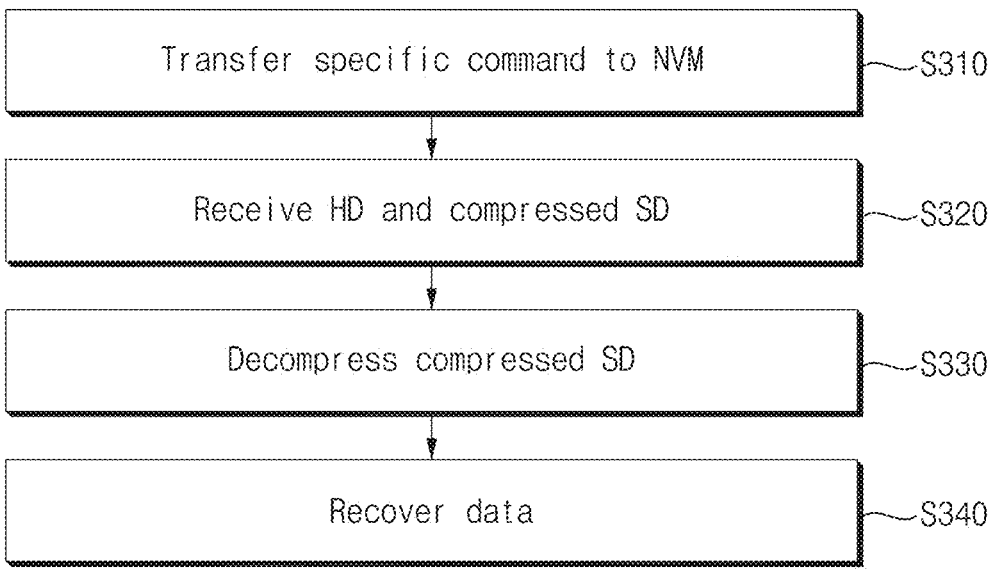
FIG. 30 is a flowchart illustrating an example operation of the memory controller.

FIG. 30 is a flowchart illustrating an example operation of the memory controller.

Referring to FIGS. 1 to 27 and 30, operations of the memory controller 50 may be performed as below. The memory controller 50 may transmit a special command to a nonvolatile memory device NVM 100 (operation S310). For example, when errors in reading data by a first read method is not able to be corrected, the memory controller 50 may issue a special command corresponding to a second read method to read data precisely. The memory controller 50 may receive hard decision data HD and compressed soft decision data (compressed SD) from the nonvolatile memory device 100 (operation S320). The memory controller 50 may decompress the compressed soft decision data (compressed SD) (operation S330). The memory controller 50 may recover data using the decompressed soft decision data (decompressed SD) and the hard decision data HD (operation S340).

Figure 31:
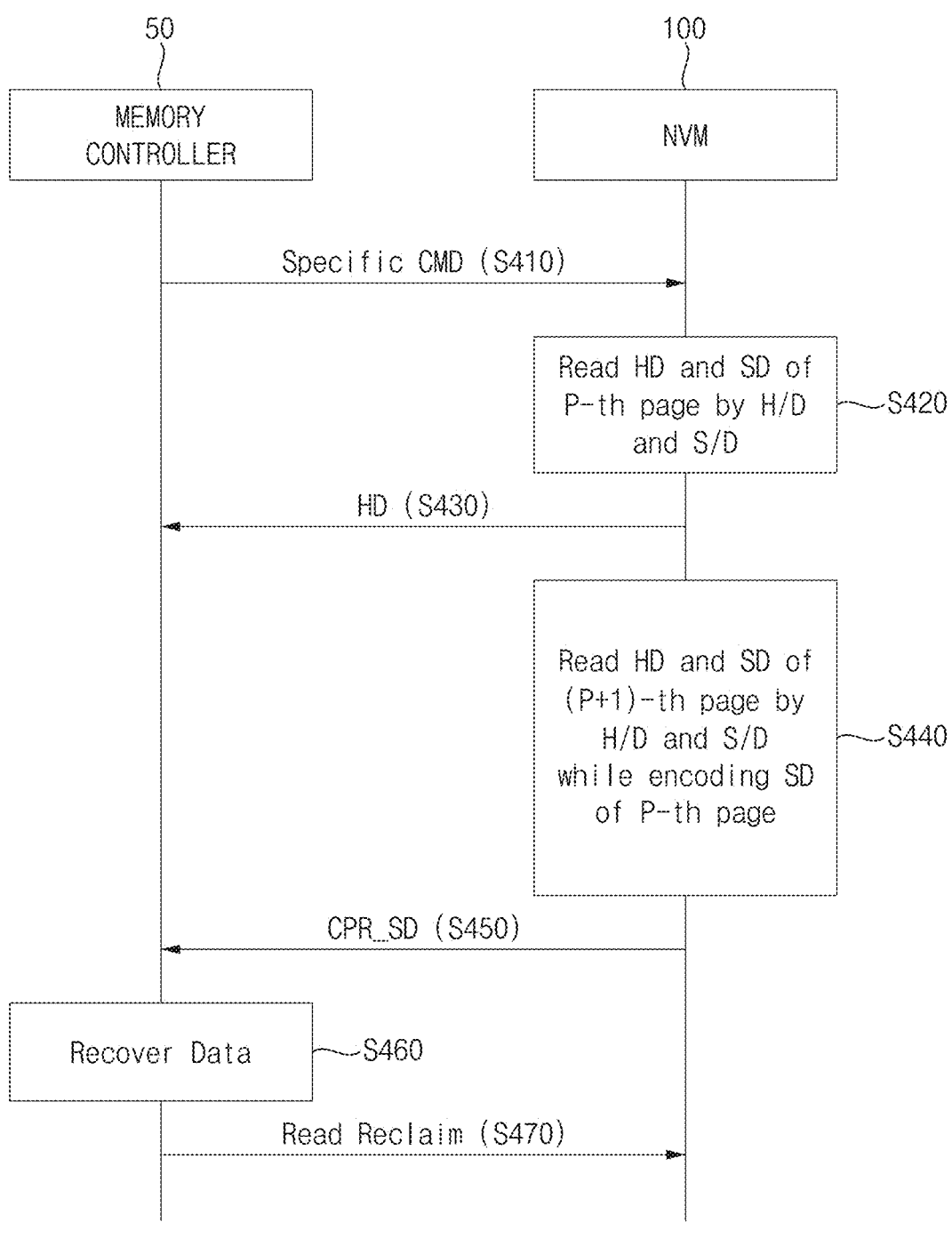
FIG. 31 is a ladder diagram illustrating an example of a read operation of a memory system.

FIG. 31 is a ladder diagram illustrating an example of a read operation of a memory system.

Referring to FIGS. 1 to 27 and 31, a read operation of the memory system 10 may be performed as below. The memory controller 50 may output a special command to the nonvolatile memory device 100 (S410). The nonvolatile memory device 100 may receive a special command and may read a hard decision data of a P-th page using a hard decision method (H/D) and may read a soft decision data of the P-th page using a soft decision method (S/D) in response to the special command (operation S420).

The nonvolatile memory device 100 may transmit the hard decision data HD of the P-th page to the memory controller (operation S430).

While the nonvolatile memory device 100 reads hard decision data and a soft decision data from a (P+1)-th page the hard decision method (H/D) and by soft decision method (S/D), the nonvolatile memory device 100 may compress the soft decision data of the P-th page (operation S440).

The nonvolatile memory device 100 may transmit a compressed soft decision data CPR_SD of the P-th page to the memory controller (operation S450).

The memory controller 50 may recover the data based on the hard decision data HD and the compressed soft decision data CPR_SD (operation S460). The memory controller 50 may output a read reclaim request to the nonvolatile memory device 100 using the recovered data (operation S470). The nonvolatile memory device 100 may perform a read reclaim operation using the recovered data.

Figure 32:
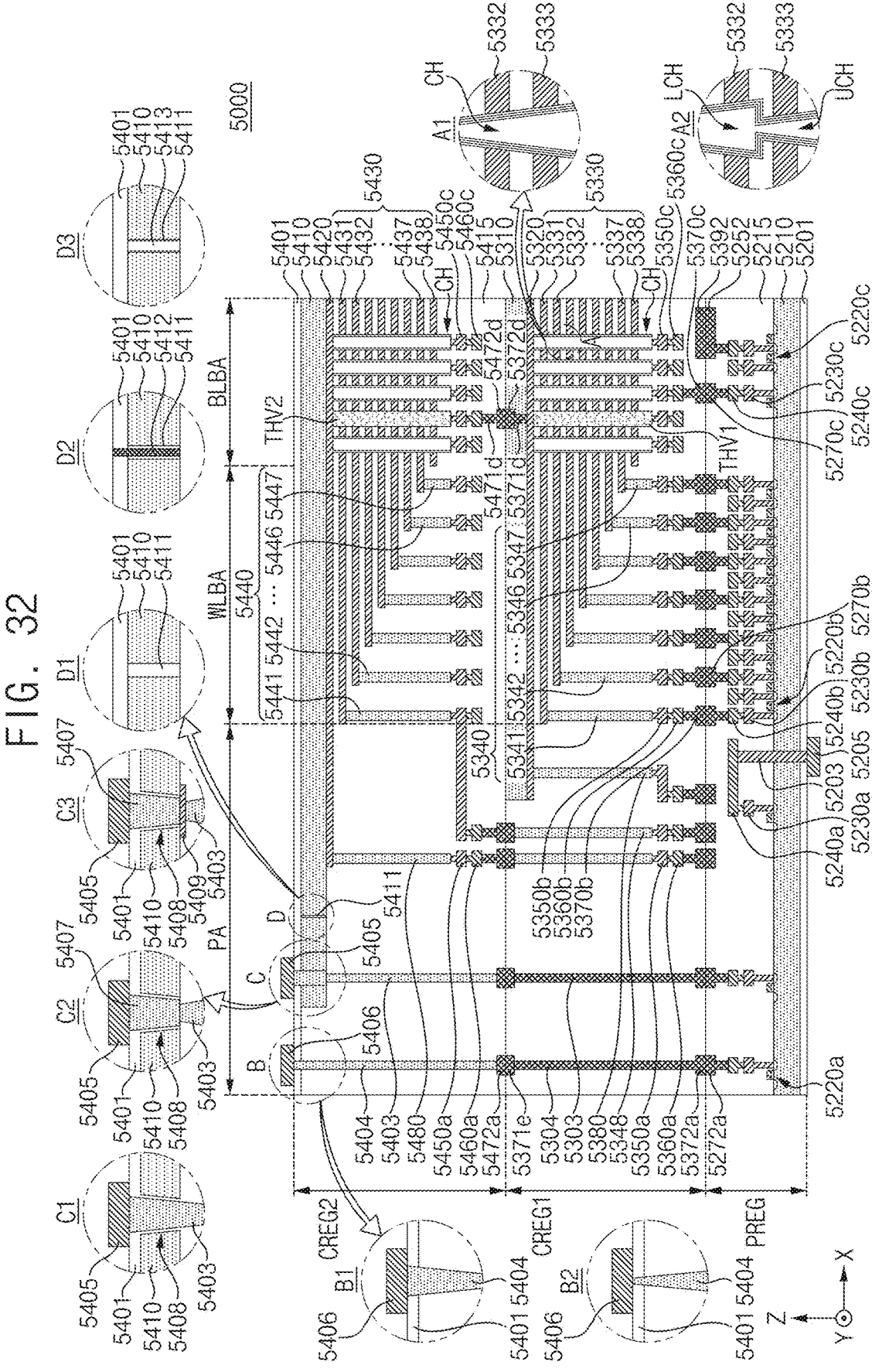
FIG. 32 is a cross-sectional view of an example of a nonvolatile memory device.

FIG. 32 is a cross-sectional view of an example of a nonvolatile memory device.

Referring to FIG. 32, a nonvolatile memory device (or a memory device) 5000 may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 5000 may include the at least one upper chip including the cell region. For example, as illustrated in FIG. 32, the memory device 5000 may include two upper chips. However, the number of the upper chips is not limited thereto. In the case in which the memory device 5000 includes the two upper chips, a first upper chip including a first cell region CREG1, a second upper chip including a second cell region CREG2 and the lower chip including the peripheral circuit region PREG may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 32. However, example implementations are not limited thereto. In some implementations, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a word-line bonding region WLBA, and a bit-line bonding region BLBA.

The peripheral circuit region PREG may include a first substrate 5210 and a plurality of circuit elements 5220a, 5220b and 5220c formed on the first substrate 5210. An interlayer insulating layer 5215 including one or more insulating layers may be provided on the plurality of circuit elements 5220a, 5220b and 5220c, and a plurality of metal lines electrically connected to the plurality of circuit elements 5220a, 5220b and 5220c may be provided in the interlayer insulating layer 5215. For example, the plurality of metal lines may include first metal lines 5230a, 5230b and 5230c connected to the plurality of circuit elements 5220a, 5220b and 5220c, and second metal lines 5240a, 5240b and 5240c formed on the first metal lines 5230a, 5230b and 5230c. The plurality of metal lines may be formed of at least one of various conductive materials. For example, the first metal lines 5230a, 5230b and 5230c may be formed of tungsten having a relatively high electrical resistivity, and the second metal lines 5240a, 5240b and 5240c may be formed of copper having a relatively low electrical resistivity.

The first metal lines 5230a, 5230b and 5230c and the second metal lines 5240a, 5240b and 5240c are illustrated and described in the present implementations. However, example implementations are not limited thereto. In some implementations, at least one or more additional metal lines may further be formed on the second metal lines 5240a, 5240b and 5240c. In this case, the second metal lines 5240a, 5240b and 5240c may be formed of aluminum, and at least some of the additional metal lines formed on the second metal lines 5240a, 5240b and 5240c may be formed of copper having an electrical resistivity lower than that of aluminum of the second metal lines 5240a, 5240b and 5240c.

The interlayer insulating layer 5215 may be disposed on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of word-lines 5330 (5331 to 5338) may be stacked on the second substrate 5310 in a direction (i.e., the Z-axis direction) perpendicular to a top surface of the second substrate 5310. String selection lines and a ground selection line may be disposed on and under the word-lines 5330, and the plurality of word-lines 5330 may be disposed between the string selection lines and the ground selection line.

Likewise, the second cell region CREG2 may include a third substrate 5410 and a common source line 5420, and a plurality of word-lines 5430 (5431 to 5438) may be stacked on the third substrate 5410 in a direction (i.e., the Z-axis direction) perpendicular to a top surface of the third substrate 5410.

Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some implementations, as illustrated in a region 'A1', the channel structure CH may be provided in the bit-line bonding region BLBA and may extend in the direction perpendicular to the top surface of the second substrate 5310 to penetrate the word-lines 5330, the string selection lines, and the ground selection line. The channel structure CH may include a data storage layer, a channel layer, and a filling insulation layer. The channel layer may be electrically connected to a first metal line 5350c and a second metal line 5360c in the bit-line bonding region BLBA. For example, the second metal line 5360c may be a bit-line and may be connected to the channel structure CH through the first metal line 5350c. The bit-line 5360c may extend in a first direction (e.g., a Y-axis direction) parallel to the top surface of the second substrate 5310.

In some implementations, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to penetrate the common source line 5320 and lower word-lines 5331 and 5332. The lower channel LCH may include a data storage layer, a channel layer, and a filling insulation layer and may be connected to the upper channel UCH. The upper channel UCH may penetrate upper word-lines 5333 to 5338. The upper channel UCH may include a data storage layer, a channel layer, and a filling insulation layer, and the channel layer of the upper channel UCH may be electrically connected to the first metal line 5350c and the second metal line 5360c. As a length of a channel increases, due to characteristics of manufacturing processes, it may be difficult to form a channel having a substantially uniform width. The memory device 5000 according to the present implementations may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word-line located near to a boundary between the lower channel LCH and the upper channel UCH may be a dummy word-line. For example, the word-lines 5332 and 5333 adjacent to the boundary between the lower channel LCH and the upper channel UCH may be the dummy word-lines. In this case, data may not be stored in memory cells connected to the dummy word-line. Alternatively, the number of pages corresponding to the memory cells connected to the dummy word-line may be less than the number of pages corresponding to the memory cells connected to a general word-line. A level of a voltage applied to the dummy word-line may be different from a level of a voltage applied to the general word-line, and thus it is possible to reduce an influence of a non-uniform channel width between the lower and upper channels LCH and UCH on an operation of the memory device.

Meanwhile, the number of the lower word-lines 5331 and 5332 penetrated by the lower channel LCH is less than the number of the upper word-lines 5333 to 5338 penetrated by the upper channel UCH in the region 'A2'. However, example implementations are not limited thereto. In some implementations, the number of the lower word-lines penetrated by the lower channel LCH may be equal to or more than the number of the upper word-lines penetrated by the upper channel UCH. In addition, structural features and connection relation of the channel structure CH disposed in the second cell region CREG2 may be substantially the same as those of the channel structure CH disposed in the first cell region CREG1.

In the bit-line bonding region BLBA, a first through-electrode THV1 may be provided in the first cell region CREG1, and a second through-electrode THV2 may be provided in the second cell region CREG2. As illustrated in FIG. 32, the first through-electrode THV1 may penetrate the common source line 5320 and the plurality of word-lines 5330. In some implementations, the first through-electrode THV1 may further penetrate the second substrate 5310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some implementations, the first through-electrode THV1 and the second through-electrode THV2 may be electrically connected to each other through a first through-metal pattern 5372d and a second through-metal pattern 5472d. The first through-metal pattern 5372d may be formed at a bottom end of the first upper chip including the first cell region CREG1, and the second through-metal pattern 5472d may be formed at a top end of the second upper chip including the second cell region CREG2. The first through-electrode THV1 may be electrically connected to the first metal line 5350c and the second metal line 5360c. The second through-electrode THV2 may be electrically connected to a third metal line 5450c and a fourth metal line 5460c. A lower via 5371d may be formed between the first through-electrode THV1 and the first through-metal pattern 5372d, and an upper via 5471d may be formed between the second through-electrode THV2 and the second through-metal pattern 5472d. The first through-metal pattern 5372d and the second through-metal pattern 5472d may be connected to each other by the bonding method.

In addition, in the bit-line bonding region BLBA, an upper metal pattern 5252 may be formed in an uppermost metal layer of the peripheral circuit region PERI, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bit-line bonding region BLBA, the bit-line 5360c may be electrically connected to a page buffer included in the peripheral circuit region PERI. For example, some of the circuit elements 5220c of the peripheral circuit region PREG may constitute the page buffer, and the bit-line 5360c may be electrically connected to the circuit elements 5220c constituting the page buffer through an upper bonding metal pattern 5370c of the first cell region CREG1 and an upper bonding metal pattern 5270c of the peripheral circuit region PERI.

Referring continuously to FIG. 32, in the word-line bonding region WLBA, the word-lines 5330 of the first cell region CREG1 may extend in a second direction (e.g., an X-axis direction) parallel to the top surface of the second substrate 5310 and may be connected to a plurality of cell contact plugs 5340 (5341 to 5347). First metal lines 5350b and second metal lines 5360b may be sequentially connected onto the cell contact plugs 5340 connected to the word-lines 5330. In the word-line bonding region WLBA, the cell contact plugs 5340 may be connected to the peripheral circuit region PREG through upper bonding metal patterns 5370*b* of the first cell region CREG1 and upper bonding metal patterns 5270*b* of the peripheral circuit region PERI.

The cell contact plugs 5340 may be electrically connected to a row decoder included in the peripheral circuit region PERI. For example, some of the circuit elements 5220*b* of the peripheral circuit region PREG may constitute the row decoder, and the cell contact plugs 5340 may be electrically connected to the circuit elements 5220*b* constituting the row decoder through the upper bonding metal patterns 5370*b* of the first cell region CREG1 and the upper bonding metal patterns 5270*b* of the peripheral circuit region PERI. In some implementations, an operating voltage of the circuit elements 5220*b* constituting the row decoder may be different from an operating voltage of the circuit elements 5220*c* constituting the page buffer. For example, the operating voltage of the circuit elements 5220*c* constituting the page buffer may be greater than the operating voltage of the circuit elements 5220*b* constituting the row decoder.

Likewise, in the word-line bonding region WLBA, the word-lines 5430 of the second cell region CREG2 may extend in the second direction (e.g., the X-axis direction) parallel to the top surface of the third substrate 5410 and may be connected to a plurality of cell contact plugs 5440 (5441 to 5447). The cell contact plugs 5440 may be connected to the peripheral circuit region PREG through an upper metal pattern of the second cell region CREG2 and lower and upper metal patterns and a cell contact plug 5348 of the first cell region CREG1.

In the word-line bonding region WLBA, the upper bonding metal patterns 5370*b* may be formed in the first cell region CREG1, and the upper bonding metal patterns 5270*b* may be formed in the peripheral circuit region PERI. The upper bonding metal patterns 5370*b* of the first cell region CREG1 and the upper bonding metal patterns 5270*b* of the peripheral circuit region PREG may be electrically connected to each other by the bonding method. The upper bonding metal patterns 5370*b* and the upper bonding metal patterns 5270*b* may be formed of aluminum, copper, or tungsten.

In the external pad bonding region PA, a lower metal pattern 537*l* may be formed in a lower portion of the first cell region CREG1, and an upper metal pattern 5472*a* may be formed in an upper portion of the second cell region CREG2. The lower metal pattern 537*l* of the first cell region CREG1 and the upper metal pattern 5472*a* of the second cell region CREG2 may be connected to each other by the bonding method in the external pad bonding region PA. Likewise, an upper metal pattern 5372*a* may be formed in an upper portion of the first cell region CREG1, and an upper metal pattern 5272*a* may be formed in an upper portion of the peripheral circuit region PERI. The upper metal pattern 5372*a* of the first cell region CREG1 and the upper metal pattern 5272*a* of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350*a* and a second metal line 5360*a* may be sequentially stacked on the common source line contact plug 5380 of the first cell region CREG1, and a first metal line 5450*a* and a second metal line 5460*a* may be sequentially stacked on the common source line contact plug 5480 of the second cell region CREG2.

Input/output pads 5205, 5405 and 5406 may be disposed in the external pad bonding region PA. Referring to FIG. 32, a lower insulating layer 5201 may cover a bottom surface of the first substrate 5210, and a first input/output pad 5205 may be formed on the lower insulating layer 5201. The first input/output pad 5205 may be connected to at least one of a plurality of the circuit elements 5220*a* disposed in the peripheral circuit region PREG through a first input/output contact plug 5203 and may be separated from the first substrate 5210 by the lower insulating layer 5201. In addition, a side insulating layer may be disposed between the first input/output contact plug 5203 and the first substrate 5210 to electrically isolate the first input/output contact plug 5203 from the first substrate 5210.

An upper insulating layer 5401 covering a top surface of the third substrate 5410 may be formed on the third substrate 5410. A second input/output pad 5405 and/or a third input/output pad 5406 may be disposed on the upper insulating layer 5401. The second input/output pad 5405 may be connected to at least one of the plurality of circuit elements 5220*a* disposed in the peripheral circuit region PREG through second input/output contact plugs 5403 and 5303, and the third input/output pad 5406 may be connected to at least one of the plurality of circuit elements 5220*a* disposed in the peripheral circuit region PREG through third input/output contact plugs 5404 and 5304.

In some implementations, the third substrate 5410 may not be disposed in a region in which the input/output contact plug is disposed. For example, as illustrated in a region 'B', the third input/output contact plug 5404 may be separated from the third substrate 5410 in a direction parallel to the top surface of the third substrate 5410 and may penetrate an interlayer insulating layer 5415 of the second cell region CREG2 so as to be connected to the third input/output pad 5406. In this case, the third input/output contact plug 5404 may be formed by at least one of various processes.

In some implementations, as illustrated in a region 'B1', the third input/output contact plug 5404 may extend in a third direction (e.g., the Z-axis direction), and a diameter of the third input/output contact plug 5404 may become progressively greater toward the upper insulating layer 5401. In other words, a diameter of the channel structure CH described in the region 'A1' may become progressively less toward the upper insulating layer 5401, but the diameter of the third input/output contact plug 5404 may become progressively greater toward the upper insulating layer 5401. For example, the third input/output contact plug 5404 may be formed after the second cell region CREG2 and the first cell region CREG1 are bonded to each other by the bonding method.

In some implementations, as illustrated in a region 'B2', the third input/output contact plug 5404 may extend in the third direction (e.g., the Z-axis direction), and a diameter of the third input/output contact plug 5404 may become progressively less toward the upper insulating layer 5401. In other words, like the channel structure CH, the diameter of the third input/output contact plug 5404 may become progressively less toward the upper insulating layer 5401. For example, the third input/output contact plug 5404 may be formed together with the cell contact plugs 5440 before the second cell region CREG2 and the first cell region CREG1 are bonded to each other.

In some implementations, the input/output contact plug may overlap with the third substrate 5410. For example, as illustrated in a region 'C', the second input/output contact plug 5403 may penetrate the interlayer insulating layer 5415 of the second cell region CREG2 in the third direction (e.g., the Z-axis direction) and may be electrically connected to the second input/output pad 5405 through the third substrate 5410. In this case, a connection structure of the second input/output contact plug 5403 and the second input/output pad 5405 may be realized by various methods.

In some implementations, as illustrated in a region 'C1', an opening 5408 may be formed to penetrate the third substrate 5410, and the second input/output contact plug 5403 may be connected directly to the second input/output pad 5405 through the opening 5408 formed in the third substrate 5410. In this case, as illustrated in the region 'C1', a diameter of the second input/output contact plug 5403 may become progressively greater toward the second input/output pad 5405. However, example implementations are not limited thereto, and in some implementations, the diameter of the second input/output contact plug 5403 may become progressively less toward the second input/output pad 5405.

In some implementations, as illustrated in a region 'C2', the opening 5408 penetrating the third substrate 5410 may be formed, and a contact 5407 may be formed in the opening 5408. An end of the contact 5407 may be connected to the second input/output pad 5405, and another end of the contact 5407 may be connected to the second input/output contact plug 5403. Thus, the second input/output contact plug 5403 may be electrically connected to the second input/output pad 5405 through the contact 5407 in the opening 5408. In this case, as illustrated in the region 'C2', a diameter of the contact 5407 may become progressively greater toward the second input/output pad 5405, and a diameter of the second input/output contact plug 5403 may become progressively less toward the second input/output pad 5405. For example, the second input/output contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In some implementations illustrated in a region 'C3', a stopper 5409 may further be formed on a bottom end of the opening 5408 of the third substrate 5410, as compared with the implementations of the region 'C2'. The stopper 5409 may be a metal line formed in the same layer as the common source line 5420. Alternatively, the stopper 5409 may be a metal line formed in the same layer as at least one of the word-lines 5430. The second input/output contact plug 5403 may be electrically connected to the second input/output pad 5405 through the contact 5407 and the stopper 5409.

Like the second and third input/output contact plugs 5403 and 5404 of the second cell region CREG2, a diameter of each of the second and third input/output contact plugs 5303 and 5304 of the first cell region CREG1 may become progressively less toward the lower metal pattern 537*l* or may become progressively greater toward the lower metal pattern 5371*e*.

Meanwhile, in some implementations, a slit 5411 may be formed in the third substrate 5410. For example, the slit 5411 may be formed at a certain position of the external pad bonding region PA. For example, as illustrated in a region 'D', the slit 5411 may be located between the second input/output pad 5405 and the cell contact plugs 5440 when viewed in a plan view. Alternatively, the second input/output pad 5405 may be located between the slit 5411 and the cell contact plugs 5440 when viewed in a plan view.

In some implementations, as illustrated in a region 'D1', the slit 5411 may be formed to penetrate the third substrate 5410. For example, the slit 5411 may be used to prevent or reduce the third substrate 5410 from being finely cracked when the opening 5408 is formed. However, example implementations are not limited thereto, and in some implementations, the slit 5411 may be formed to have a depth ranging from about 60% to about 70% of a thickness of the third substrate 5410.

In some implementations, as illustrated in a region 'D2', a conductive material 5412 may be formed in the slit 5411. For example, the conductive material 5412 may be used to discharge a leakage current occurring in driving of the circuit elements in the external pad bonding region PA to the outside. In this case, the conductive material 5412 may be connected to an external ground line.

In some implementations, as illustrated in a region 'D3', an insulating material 5413 may be formed in the slit 5411. For example, the insulating material 5413 may be used to electrically isolate the second input/output pad 5405 and the second input/output contact plug 5403 disposed in the external pad bonding region PA from the word-line bonding region WLBA. Since the insulating material 5413 is formed in the slit 5411, it is possible to prevent or reduce a voltage provided through the second input/output pad 5405 from affecting a metal layer disposed on the third substrate 5410 in the word-line bonding region WLBA.

Meanwhile, in some implementations, the first to third input/output pads 5205, 5405 and 5406 may be selectively formed. For example, the memory device 5000 may be realized to include only the first input/output pad 5205 disposed on the first substrate 5210, to include only the second input/output pad 5405 disposed on the third substrate 5410, or to include only the third input/output pad 5406 disposed on the upper insulating layer 5401.

In some implementations, at least one of the second substrate 5310 of the first cell region CREG1 and the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 covering a top surface of the common source line 5420 or a conductive layer for connection may be formed.

Figure 33:
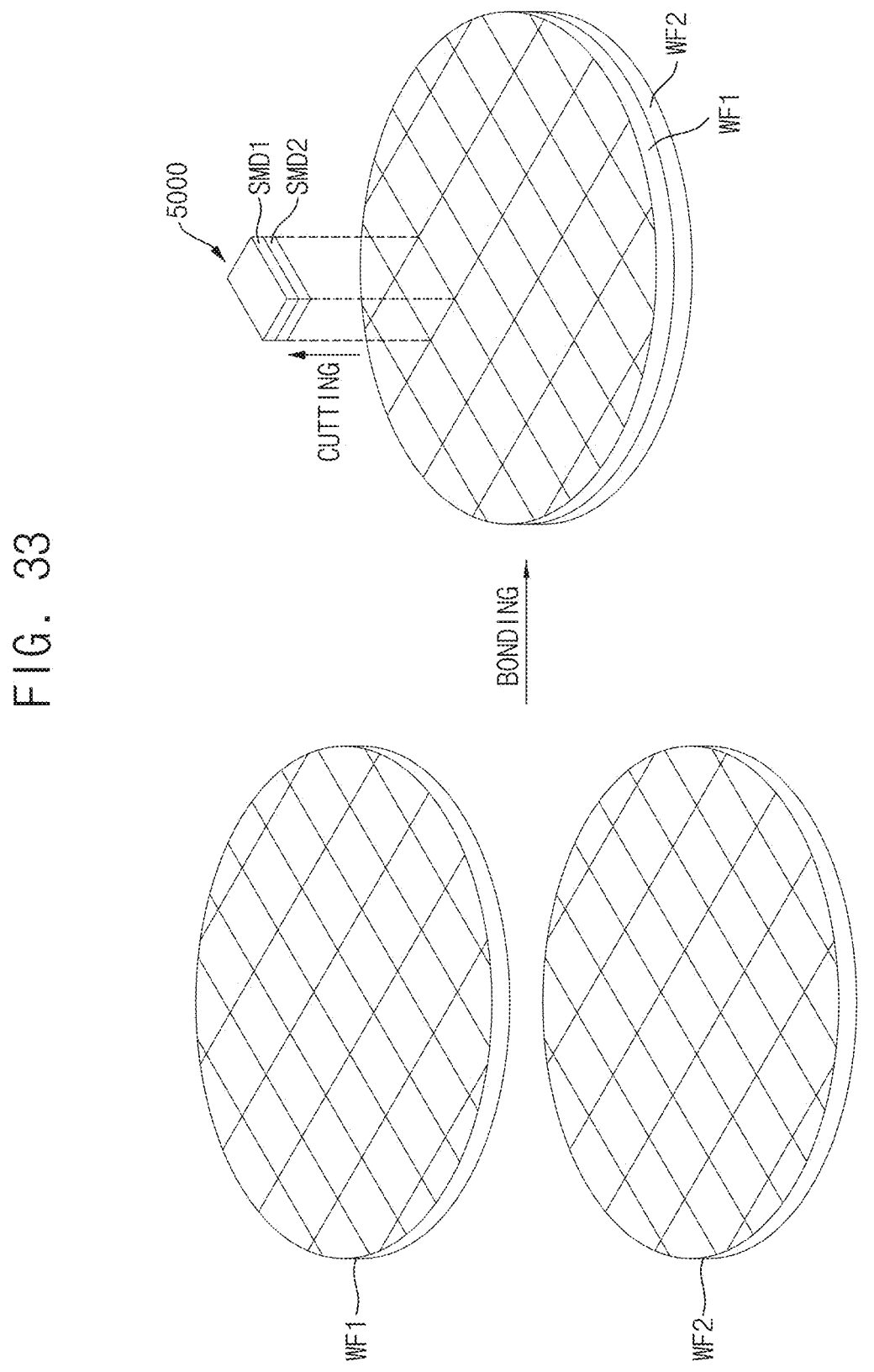

FIG. 33 is a diagram illustrating an example of a manufacturing process of a stacked semiconductor device.

Referring to FIG. 33, respective integrated circuits may be formed on a first wafer WF1 and a second wafer WF2. The memory cell array may be formed in the first wafer WF1, and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the memory device 5000, including a first semiconductor die SMD1 and a second semiconductor die SD2 that are stacked vertically (e.g., the first semiconductor die SMD1 is stacked on the second semiconductor die SMD2, etc.). Each cut portion of the first wafer WF1 corresponds to the first semiconductor die SMD1, and each cut portion of the second wafer WF2 corresponds to the second semiconductor die SMD2. For example, the memory device 5000 of FIG. 32 may be manufactured based on the manufacturing process of FIG. 33.

Figure 34:
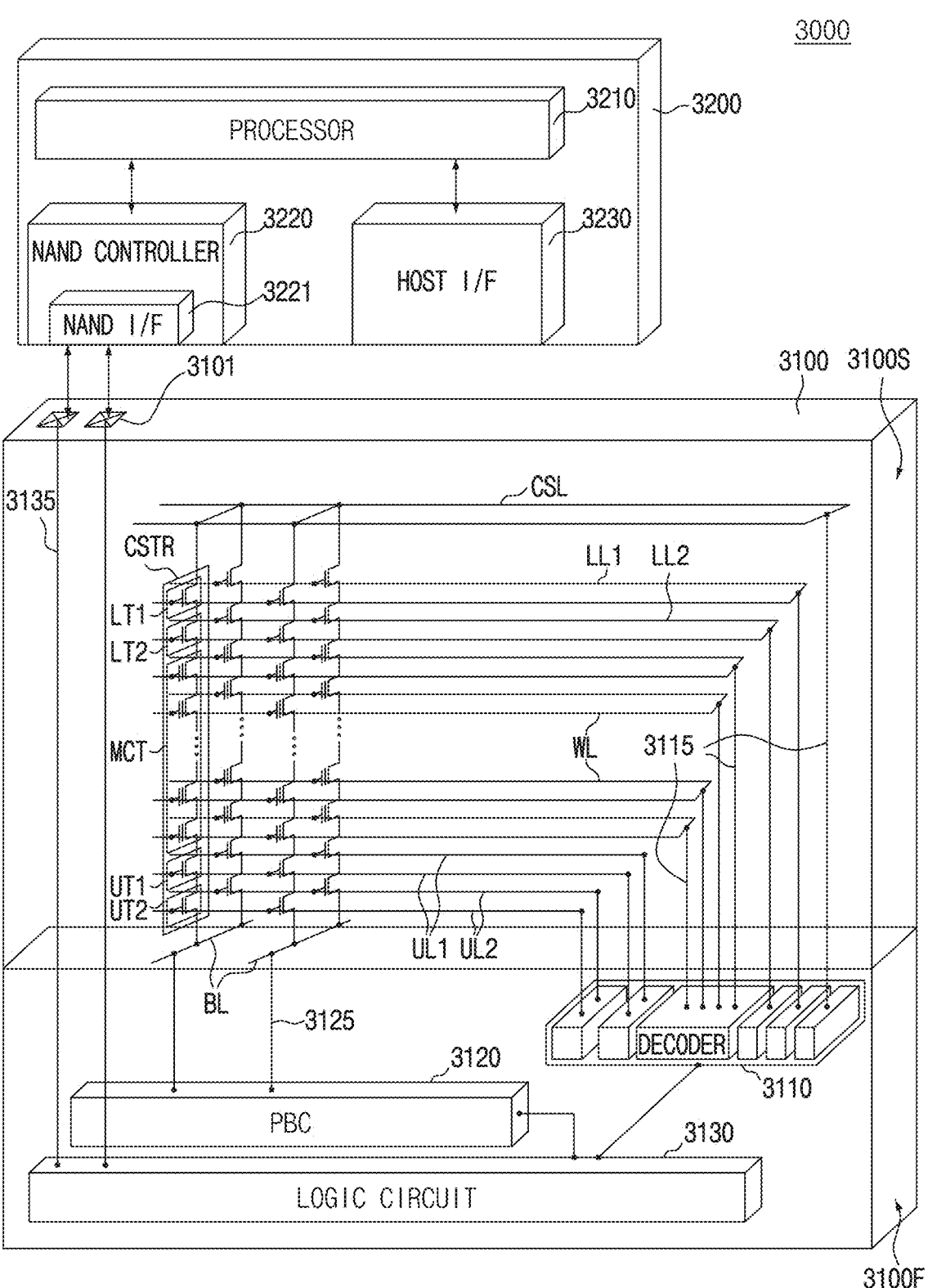
FIG. 34 is a block diagram illustrating an example of an electronic system including a semiconductor device.

FIG. 34 is a block diagram illustrating an example of an electronic system including a semiconductor device.

Referring to FIG. 34, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be or may include a non-volatile memory device, for example, a nonvolatile memory device that is illustrated with reference to FIGS. 3 to 26. The semiconductor device 3100 may include a first structure 3100F and a second structure 3100S on the first structure 3100F. The first structure 3100F may be a peripheral circuit structure including a decoder circuit 3110, a page buffer circuit (PBC) 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example implementations.

In some implementations, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In some implementations, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 3115 extending to the second structure 3110S from the first structure 3100F. The bit-lines BL may be electrically connected to the page buffer circuit 3120 through second connection wirings 3125 extending to the second structure 3100S from the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S from the first structure 3100F.

The controller 3200 may include a processor 3210, a NAND controller 3220, and a host interface (I/F) 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

A nonvolatile memory device or a storage device according to example implementations may be packaged using various package types or package configurations.

The present disclosure may be applied to various devices and systems that include the nonvolatile memory devices.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

The foregoing is illustrative of example implementations and is not to be construed as limiting thereof. Although a few example implementations have been described, those skilled in the art will readily appreciate that many modifications are possible in the example implementations without materially departing from the novel teachings and advantages of the present disclosure. Accordingly, all such modifications are intended to be included within the scope of the present disclosure as defined in the claims.

What is claimed is:

1. A nonvolatile memory device comprising:

a plurality of page buffer circuits, each page buffer circuit of the plurality of page buffer circuits connected with a respective memory plane of a plurality of memory planes through a respective plurality of bit-lines, each page buffer circuit including a plurality of latch groups, each latch group of the plurality of latch groups including a plurality of cache latches;

a plurality of compression engines, each compression engine of the plurality of compression engines connected with a respective page buffer circuit of the plurality of page buffer circuits through a respective plurality of local data lines;

a plurality of local clock controllers, each local clock controller of the plurality of local clock controllers configured to control, based on a global clock signal and a mode signal, a respective compression engine of the plurality of compression engines individually;

a data input/output (I/O) circuit connected with the plurality of page buffer circuits through a plurality of global data lines separated from the plurality of local data lines; and a control circuit configured to:

control each compression engine of one or more compression engines among the plurality of compression engines to perform an encoding operation based on (i) receiving soft decision data from a plurality of target cache latches of the plurality of cache latches, (ii) compressing the received soft decision data, and (iii) overwriting the compressed soft decision data in the plurality of target cache latches based on an input address, the plurality of target cache latches corresponding to an output address; and control one or more page buffer circuits among the plurality of page buffer circuits to perform an output operation based on outputting the compressed soft decision data through the data I/O circuit, the output operation performed in parallel with the encoding operation or independently from the encoding operation, the one or more page buffer circuits corresponding to the one or more compression engines.

2. The nonvolatile memory device of claim 1, wherein the soft decision data is sensed by each page buffer circuit of the one or more page buffer circuits from a P-th page of each memory plane of one or more memory planes from the plurality of memory planes, P being a natural number, and wherein the encoding operation is performed as a background operation with respect to a sensing operation, wherein, in the sensing operation, each page buffer circuit of the one or more page buffer circuits performs based on (i) sensing the soft decision data from a (P+1)-th page of each memory plane of the one or more memory planes and (ii) storing the soft decision data in the plurality of data latches in each latch group of the plurality of latch groups.

3. The nonvolatile memory device of claim 1, wherein each local clock controller of the plurality of local clock controllers includes:

a counter configured to generate a counted value based on counting the global clock signal;

a state machine configured to generate, based on the mode signal, a first state control signal and a second state control signal;

a flag generator configured to generate a flag signal based on the counted value and the first state control signal, the flag signal designating an operation of the plurality of cache latches and an operation of each compression engine of the plurality of compression engines; and a local clock generator configured to generate, based on the counted value and the second state control signal, a first local clock signal and a second local clock signal, the first local clock signal being associated with an operation interval of the plurality of cache latches, the second local clock signal being associated with an operation interval of each compression engine of the plurality of compression engines.

4. The nonvolatile memory device of claim 3, wherein the plurality of target cache latches are configured to provide, based on the first local clock signal, the soft decision data to the one or more compression engines based on the flag signal having a logic high level, and wherein the one or more compression engines are configured to overwrite, based on the second local clock signal, the compressed soft decision data in the plurality of target cache latches based on the flag signal having a logic low level.

5. The nonvolatile memory device of claim 1, comprising an oscillator configured to generate the global clock signal, wherein the plurality of memory planes include a first memory plane, a second memory plane, a third memory plane, and a fourth memory plane, wherein the plurality of page buffer circuits include a first page buffer circuit, a second page buffer circuit, a third page buffer circuit, and a fourth page buffer circuit corresponding to the first memory plane, the second memory plane, the third memory plane, and the fourth memory plane, wherein the plurality of compression engines include a first compression engine, a second compression engine, a third compression engine, and a fourth compression engines, each compression engine of the first, second, third, and fourth compression engines being connected with a respective page buffer circuit of the first, second, third, and fourth page buffer circuits through a respective local data line of first, second, third, and fourth local data lines, and wherein the plurality of local clock controllers include a first local clock controller, a second local clock controller, a third local clock controller, and a fourth local clock controller, each local clock controller of the first, second, third, and fourth local clock controllers being connected with a respective compression engine of the first, second, third, and fourth compression engines.

6. The nonvolatile memory device of claim 5, wherein the control circuit is configured to control the first, second, third, and fourth local clock controllers such that each compression engine of the first, second, third, and fourth compression engines performs the encoding operation in parallel.

7. The nonvolatile memory device of claim 5, wherein the control circuit is configured to control the first, second, third, and fourth local clock controllers such that each compression engine of the first, second, third, and fourth compression engines performs the encoding operation sequentially.

8. The nonvolatile memory device of claim 5, wherein the control circuit is configured to control the first, second, third, and fourth local clock controllers such that each compression engine of the first, second, third, and fourth compression engines performs the encoding operation partially in parallel.

9. The nonvolatile memory device of claim 5, wherein the control circuit is configured to control the first, second, third, and fourth local clock controllers such that the first page buffer circuit performs the output operation and a compression engine of the second, third, and fourth compression engines performs the encoding operation.

10. The nonvolatile memory device of claim 5, wherein the control circuit is configured to control the first, second, third, and fourth local clock controllers such that the first page buffer circuit performs the output operation and two compression engines of the second, third, and fourth compression engines perform the encoding operation in parallel.

11. The nonvolatile memory device of claim 5, wherein the control circuit is configured to control the first, second, third, and fourth local clock controllers such that the first page buffer circuit performs the output operation and each compression engine of the second, third, and fourth compression engines perform the encoding operation in parallel.

12. The nonvolatile memory device of claim 5,
wherein the first page buffer circuit is configured to store first soft decision data in a respective first latch group based on sensing data from P-th page of the first memory plane during a first sensing period, P being a natural number, and
wherein the data I/O circuit is configured to output first hard decision data sensed from the P-th page after the first sensing period.

13. The nonvolatile memory device of claim 12, wherein,
during the first page buffer circuit storing second soft decision data in the first latch group by sensing data from (P+1)-th page of the first memory plane during a second sensing period,
the first compression engine is configured to
receive the first soft decision data from a respective plurality of first latches,
compress the first soft decision data, and
overwrite the compressed first soft decision data, and
the data I/O circuit is configured to output the compressed first soft decision data.

14. The nonvolatile memory device of claim 13, wherein the data I/O circuit is configured to output second hard decision data sensed from the (P+1)-th page after the second sensing period.

15. The nonvolatile memory device of claim 13,
wherein the second page buffer circuit is configured to store third soft decision data in a respective second latch group based on sensing data from Q-th page of the second memory plane during a third sensing period, Q being a natural number, and
wherein the data I/O circuit is configured to output third hard decision data sensed from the Q-th page after the third sensing period.

16. The nonvolatile memory device of claim 15, wherein,
during the second page buffer circuit storing fourth soft decision data in the second latch group by sensing (Q+1)-th page data of the second memory plane during a fourth sensing period, the second compression engine is configured to
receive the third soft decision data from a respective plurality of second latches,
compress the third soft decision data, and
overwrite the compressed third soft decision data,
the data I/O circuit is configured to output the compressed third soft decision data,
wherein the third sensing period partially overlaps with the first sensing period, and
wherein the fourth sensing period partially overlaps with the second sensing period.

17. The nonvolatile memory device of claim 1, wherein each compression engine of the plurality of compression engines includes:
an address controller configured to control the input address and the output address;
an encoder configured to
receive the soft decision data, and
compress the received soft decision data; and
a buffer configured to store the compressed soft decision data,
wherein the compressed soft decision data stored in the buffer is overwritten in the plurality of cache latches.

18. A memory system comprising:
a nonvolatile memory device configured to output hard decision data and compressed soft decision data; and
a memory controller configured to control the nonvolatile memory device, the memory controller including a decompression engine configured to decompress the compressed soft decision data,
wherein the nonvolatile memory device comprises:
a plurality of page buffer circuits, each page buffer circuit of the plurality of page buffer circuits connected with a respective memory plane of a plurality of memory planes through a respective plurality of bit-lines, each page buffer circuit including a plurality of latch groups, each latch group of the plurality of latch groups including a plurality of cache latches;
a plurality of compression engines, each compression engine of the plurality of compression engines connected with a respective of page buffer circuit of the plurality of page buffer circuits through a respective plurality of local data lines;
a plurality of local clock controllers, each local clock controller of the plurality of local clock controllers configured to control, based on a global clock signal and a mode signal, a respective compression engine of the plurality of compression engines individually;
a data input/output (I/O) circuit connected with the plurality of page buffer circuits through a plurality of global data lines separated from the plurality of local data lines; and
a control circuit configured to:
control each compression engine of one or more compression engines among the plurality of compression engines to perform an encoding operation based on (i) receiving soft decision data from a plurality of target cache latches of the plurality of cache latches, (ii) compressing the receive the soft decision data, and (iii) overwriting the compressed soft decision data in the plurality of target cache latches based on an input address, the plurality of target cache latches corresponding to an output address; and
control one or more page buffer circuits among the plurality of page buffer circuits to perform an output operation based on outputting the compressed soft decision data through the data I/O circuit, the output operation performed in parallel with the encoding operation or independently from the encoding operation, the one or more page buffer circuits corresponding to the one or more compression engines.

19. The memory system of claim 18, wherein the memory controller includes:

an error correction code (ECC) engine configured to correct a plurality of errors in the hard decision data based on the hard decision data and the decompressed soft decision data.

20. A nonvolatile memory device comprising:

a memory cell array including a plurality of memory planes, each memory plane of the plurality of memory planes including a plurality of memory blocks;

a plurality of page buffer circuits, each page buffer circuit of the plurality of page buffer circuits connected with a respective memory plane of a plurality of memory planes through a respective plurality of bit-lines, each page buffer circuit including a plurality of latch groups, each latch group of the plurality of latch groups including a plurality of cache latches;

a plurality of compression engines, each compression engine of the plurality of compression engines connected with a respective page buffer circuit of the plurality of page buffer circuits through a respective plurality of local data lines;

a plurality of local clock controllers, each local clock controller of the plurality of local clock controllers configured to control, based on a global clock signal and a mode signal, a respective compression engine of the plurality of compression engines individually;

a data input/output (I/O) circuit connected with the plurality of page buffer circuits through a plurality of global data lines separated from the plurality of local data lines; and a control circuit configured to:

control each compression engine of one or more compression engines among the plurality of compression engines to perform an encoding operation based on (i) receiving a first soft decision data from a plurality of target cache latches of the plurality of cache latches, (ii) compressing the received first soft decision data, and (iii) overwriting the compressed first soft decision data in the plurality of target cache latches based on an input address, the plurality of target cache latches corresponding to an output address, the first soft decision data being sensed from a P-th page of each memory plane of one or more memory planes of the plurality of memory planes, P being a natural number; and control one or more page buffer circuits among the plurality of page buffer circuits to perform an output operation based on outputting the compressed first soft decision data through the data I/O circuit, the output operation performed in parallel with the encoding operation or independently from the encoding operation, the one or more page buffer circuits corresponding to the one or more compression engines, wherein the control circuit is configured to control the one or more compression engines to perform the encoding operation during the one or more page buffer circuits sensing second soft decision data from a (P+1)-th page of each memory plane of the one or more memory planes.

* * * * *